United States Patent
Akin et al.

(10) Patent No.: US 10,285,477 B2
(45) Date of Patent: May 14, 2019

(54) SOLAR POWER CONVERSION KIT FOR UMBRELLA

(71) Applicant: ZON, Manhattan Beach, CA (US)

(72) Inventors: Sarah Akin, Manhattan Beach, CA (US); David Johnson, San Francisco, CA (US)

(73) Assignee: ZON, El Segundo, CA (US)

( * ) Notice: Subject to any disclaimer, the term of this patent is extended or adjusted under 35 U.S.C. 154(b) by 0 days.

(21) Appl. No.: 15/729,609

(22) Filed: Oct. 10, 2017

(65) Prior Publication Data

US 2018/0027934 A1 Feb. 1, 2018

Related U.S. Application Data

(60) Division of application No. 15/077,849, filed on Mar. 22, 2016, now Pat. No. 9,781,985, which is a
(Continued)

(51) Int. Cl.
*A45B 25/02* (2006.01)
*B23P 15/26* (2006.01)
(Continued)

(52) U.S. Cl.
CPC ............... *A45B 25/02* (2013.01); *A45B 3/00* (2013.01); *A45B 23/00* (2013.01); *B23P 15/26* (2013.01); *H01L 31/042* (2013.01); *H02J 7/0027* (2013.01); *H02J 7/0045* (2013.01); *H02J 7/0052* (2013.01); *H02J 7/025* (2013.01); *H02J 7/35* (2013.01); *H02J 7/355* (2013.01); *H02J 50/12* (2016.02); *H02J 50/40* (2016.02); *H02J 50/80* (2016.02); *H02S 30/20* (2014.12); *A45B 2023/0012* (2013.01); *A45B 2023/0037* (2013.01); *A45B 2025/003* (2013.01); *A45B 2200/109* (2013.01); *A45B 2200/1018* (2013.01); *A45B 2200/1027* (2013.01); *A45B 2200/1054* (2013.01); *A45B 2200/1063* (2013.01); *H02J 7/0047* (2013.01); *H02J 2007/0001* (2013.01); *H02J 2007/0062* (2013.01); *Y02E 10/50* (2013.01);
(Continued)

(58) Field of Classification Search
CPC ............... A45B 2200/1027; A45B 2200/1018
USPC ............... 135/16; 320/101; 136/243
See application file for complete search history.

(56) References Cited

U.S. PATENT DOCUMENTS 5,273,062 A 12/1993 Mozdzanowski
6,837,255 B2 1/2005 Bunch et al.
(Continued)

FOREIGN PATENT DOCUMENTS

EP 0957536 11/1999
FR 2942351 6/2011

*Primary Examiner* — Noah Chandler Hawk
(74) *Attorney, Agent, or Firm* — Aka Chan LLP

(57) ABSTRACT

A solar power conversion kit allows converting of a standard umbrella into a solar charging umbrella, which can then use solar power to charge electronic devices. The solar charging umbrella is self-sustained, capable of charging electronic devices in locations away from electrical outlets. The umbrella has a rechargeable battery that is recharged by sunlight. When charged, the umbrella's battery can charge devices when sunlight is not available. The umbrella supports simultaneous charging of higher power devices such as tablet computers.

29 Claims, 48 Drawing Sheets

Related U.S. Application Data continuation of application No. 14/843,900, filed on Sep. 2, 2015, now Pat. No. 9,510,653, which is a continuation of application No. 14/590,941, filed on Jan. 6, 2015, now Pat. No. 9,289,039, which is a continuation-in-part of application No. 29/487,288, filed on Apr. 7, 2014, now Pat. No. Des. 770,756, and a continuation-in-part of application No. 29/499,274, filed on Aug. 13, 2014, now Pat. No. Des. 770,757, and a continuation-in-part of application No. 29/502,277, filed on Sep. 12, 2014, now Pat. No. Des. 799,199.

(60) Provisional application No. 61/924,186, filed on Jan. 6, 2014, provisional application No. 62/041,573, filed on Aug. 25, 2014.

(51) Int. Cl.

| | |
|---|---|
| *H02J 50/40* | (2016.01) |
| *H02J 50/12* | (2016.01) |
| *H02J 50/80* | (2016.01) |
| *H02J 7/35* | (2006.01) |
| *H02J 7/00* | (2006.01) |
| *H02J 7/02* | (2016.01) |
| *A45B 3/00* | (2006.01) |
| *H01L 31/042* | (2014.01) |
| *H02S 30/20* | (2014.01) |
| *A45B 23/00* | (2006.01) |
| *A45B 25/00* | (2006.01) |

(52) U.S. Cl.
CPC ...... *Y10T 29/49004* (2015.01); *Y10T 29/4984* (2015.01); *Y10T 29/49117* (2015.01); *Y10T 29/49169* (2015.01); *Y10T 29/49355* (2015.01)

(56) References Cited

U.S. PATENT DOCUMENTS

| | | | |
|---|---|---|---|
| 6,889,699 B2 | 5/2005 | Clarke | |
| 8,432,129 B2 | 4/2013 | Lee et al. | |
| 8,497,656 B2 | 7/2013 | Portis et al. | |
| D693,560 S | 11/2013 | Akin et al. | |
| D693,561 S | 11/2013 | Akin et al. | |
| 2004/0228118 A1* | 11/2004 | Peterson | A45B 3/04 362/102 |
| 2005/0088834 A1* | 4/2005 | Milan | G06F 1/26 361/810 |
| 2005/0161067 A1 | 7/2005 | Hollins | |
| 2006/0254636 A1* | 11/2006 | Tung | A45B 3/00 135/96 |
| 2007/0283987 A1 | 12/2007 | Reyes et al. | |
| 2008/0092936 A1 | 4/2008 | Carabillo | |
| 2009/0058354 A1 | 3/2009 | Harrison | |
| 2010/0154786 A1 | 6/2010 | Li | |
| 2010/0180922 A1 | 7/2010 | McKenna | |
| 2010/0326849 A1 | 12/2010 | Trimarche et al. | |
| 2011/0290288 A1 | 12/2011 | Ma | |
| 2012/0235477 A1 | 9/2012 | Korman | |
| 2013/0214612 A1 | 8/2013 | Bae | |
| 2013/0240006 A1 | 9/2013 | Chaimovski et al. | |
| 2013/0249479 A1 | 9/2013 | Partovi | |
| 2014/0028242 A1 | 1/2014 | Akin et al. | |

* cited by examiner

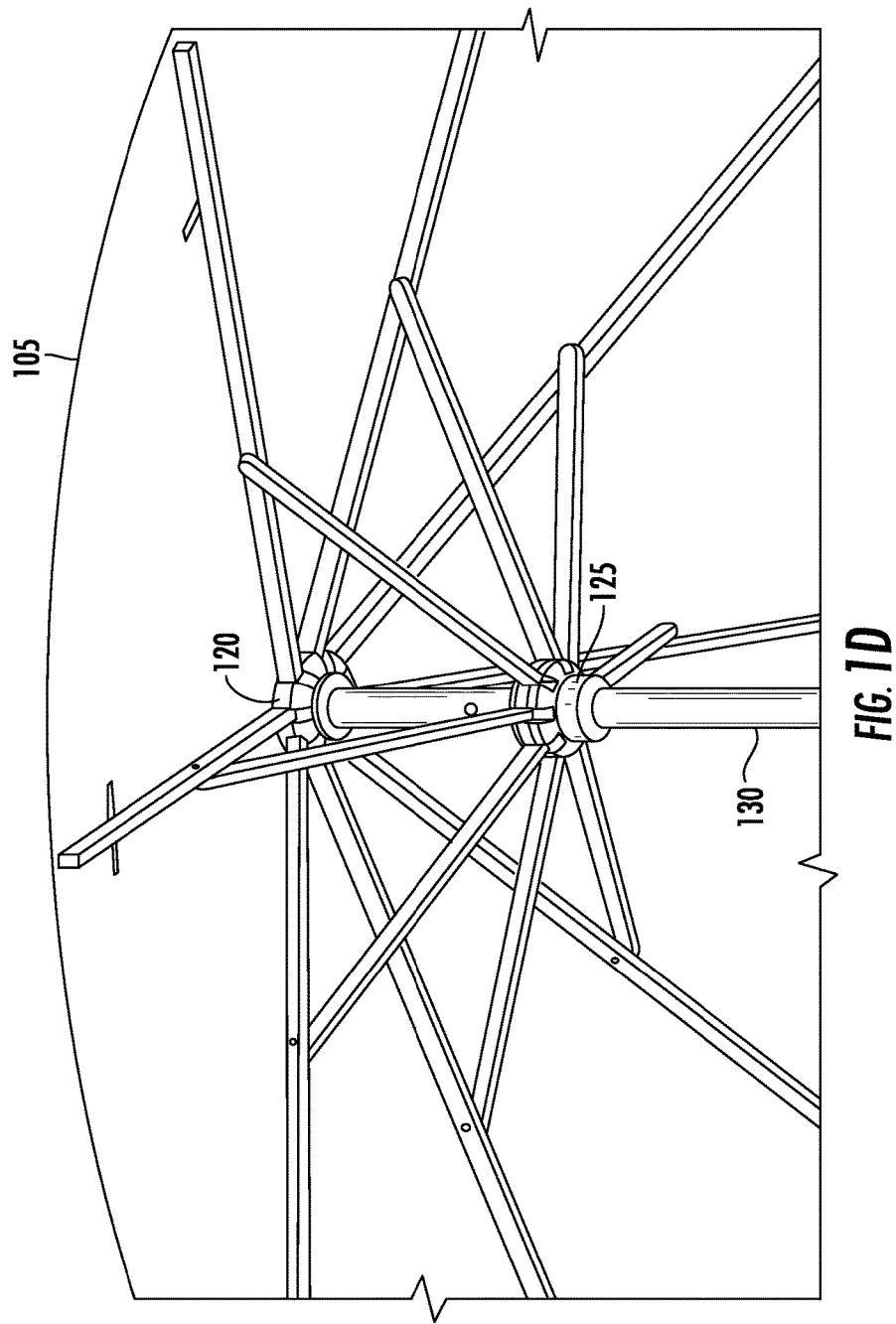

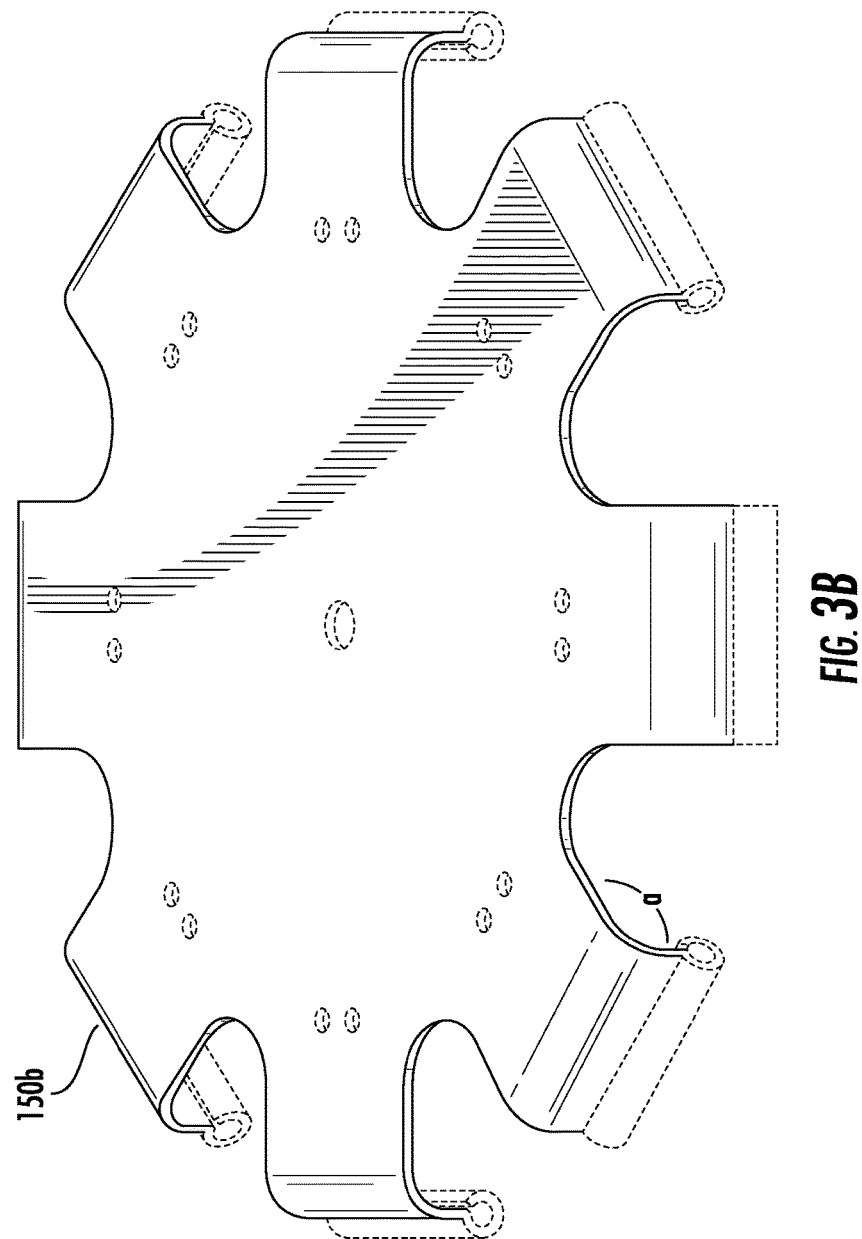

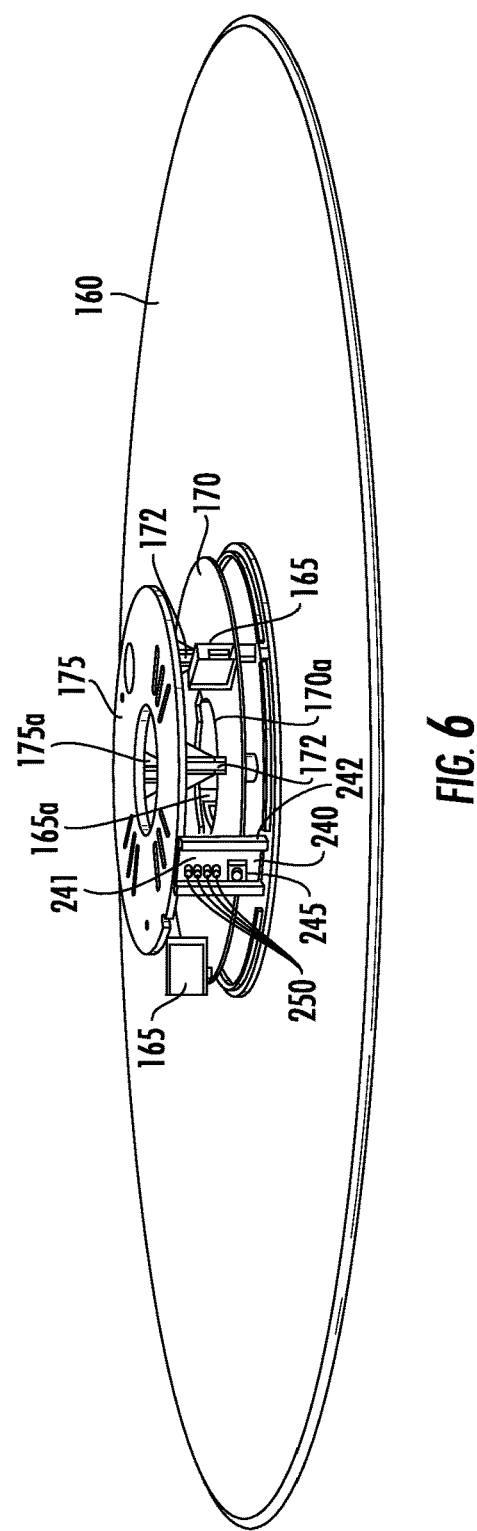

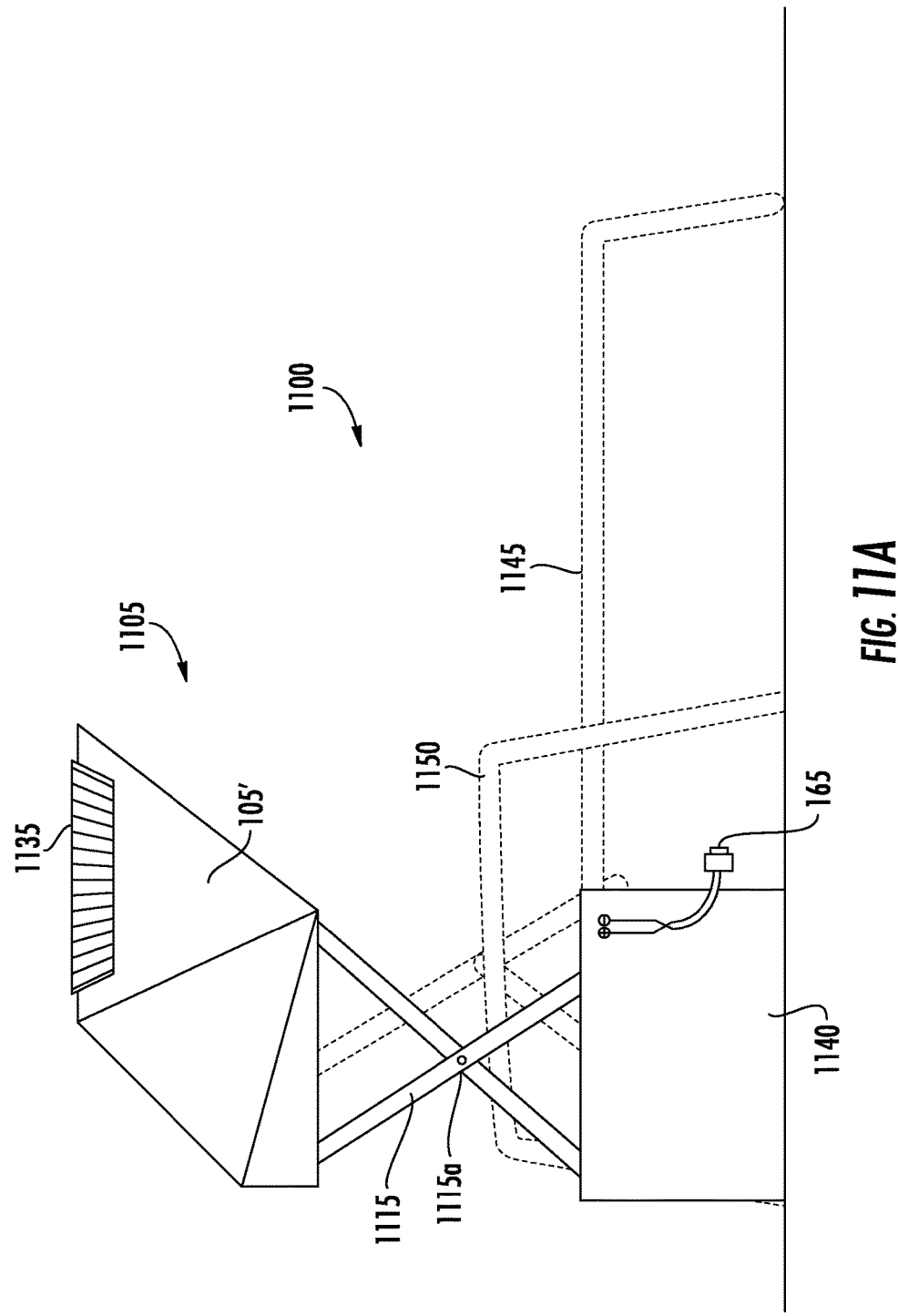

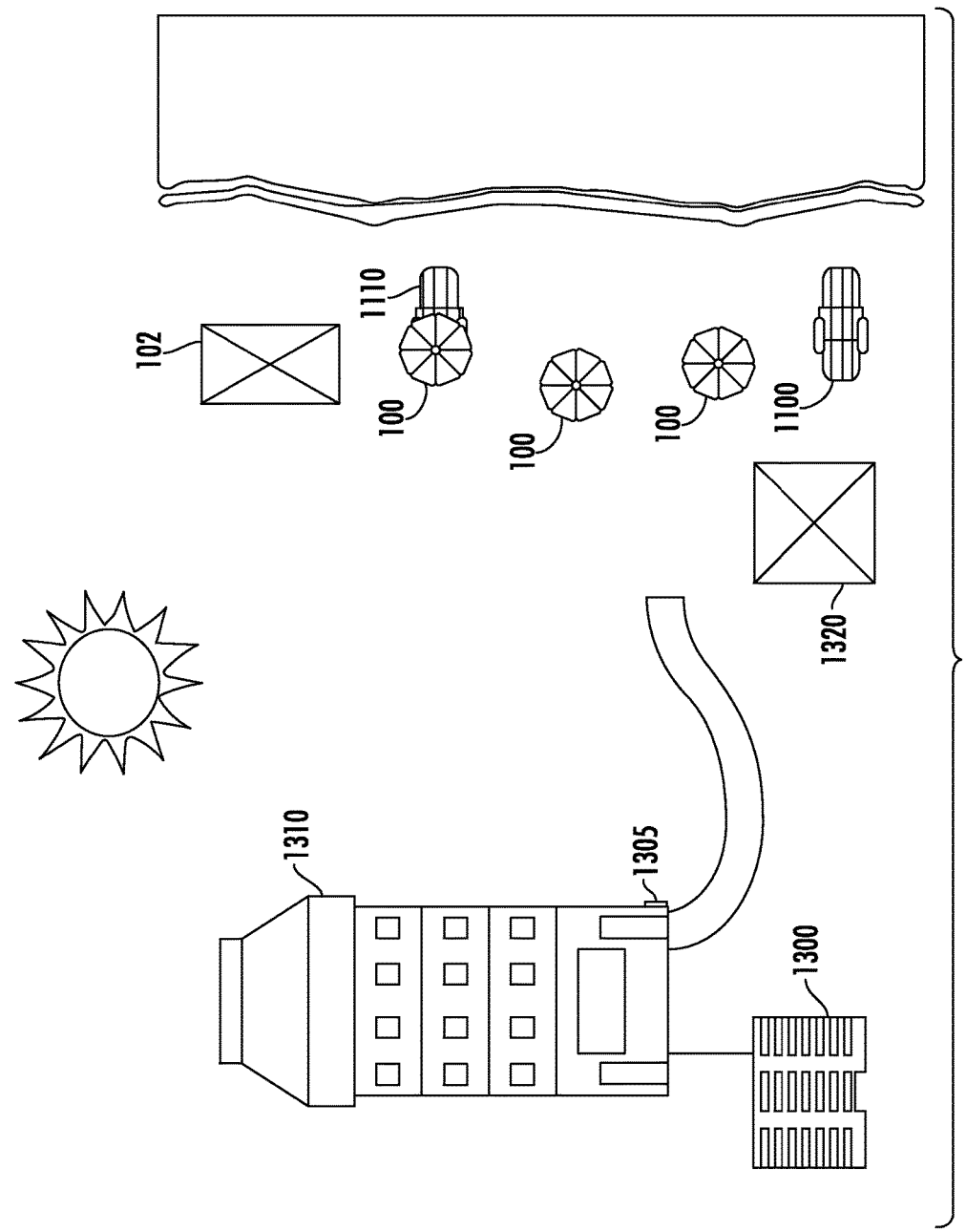

SOLAR POWER CONVERSION KIT FOR UMBRELLA

CROSS-REFERENCE TO RELATED APPLICATIONS

This patent application is a continuation of U.S. patent application Ser. No. 15/077,849, filed Mar. 22, 2016, issued as U.S. Pat. No. 9,781,985 on Oct. 10, 2017, which is a continuation of U.S. patent application Ser. No. 14/843,900, filed Sep. 2, 2015, and U.S. patent application Ser. No. 14/590,941, filed Jan. 6, 2015, issued as U.S. Pat. No. 9,289,039 on Mar. 22, 2016, which claims the benefit of U.S. patent applications 61/924,186, filed Jan. 6, 2014, and 62/041,573, filed Aug. 25, 2014, and is a continuation-in-part of U.S. patent application Ser. No. 29/487,288, filed Apr. 7, 2014, Ser. No. 29/499,274, filed Aug. 13, 2014, and Ser. No. 29/502,277, filed Sep. 12, 2014. These applications are incorporated by reference along with all other references cited in this application.

BACKGROUND OF THE INVENTION

The present invention generally relates to furniture, and more particularly, to outdoor furniture having integrated solar panels, especially with ports for powering and charging portable electronic devices.

Outdoor furniture is a type of furniture that is often used during daylight hours to provide comfortable outdoor seating, to shade users from the sun, or both. Outdoor furniture is commonly set up, for example, by swimming pools, on beaches, on patios, at picnic areas, at outdoor dining areas, on the decks of boats and ships, and at other outdoor recreational areas. Outdoor furniture is often used a relatively long distance away from electrical power sources. Since users often spend up to several hours using outdoor furniture while partaking in outdoor activities, the portable electronic device (e.g., mobile phones, tablet computers, personal digital assistants, portable music players, or portable televisions) that users use outdoors may run out of power and need to be charged.

As a result, users may have to use portable battery packs to recharge portable electronic devices, or manually run electrical lines from a main power source out to areas where outdoor furniture is located. Battery packs are often not designed to charge larger devices, such as tablet computers, and often are not capable of charging more than one device at a time. Furthermore, battery packs have a limited amount of stored power. Once a battery pack discharges, no power remains for charging portable electronic devices. Running a power line from a main power source to where users are at outdoors is often not possible where no power supply exists or is not practical where no power supply is reasonably close.

Therefore, there is a need for a convenient charging device for outdoor use for charging portable electronic devices using solar power.

BRIEF SUMMARY OF THE INVENTION

A solar charging umbrella uses solar power to charge electronic devices wirelessly, such as by a wireless or inductive charging port. The umbrella is self-sustained, capable of charging electronic devices in locations away from electrical outlets. The umbrella has a rechargeable battery that is recharged by sunlight. When charged, the umbrella's battery can charge devices when sunlight is not available. The umbrella supports simultaneous charging of high power devices such as tablet computers.

In an implementation, an umbrella includes: a shaft; an umbrella shade, connected between a fastener and the shaft; and a frame. The umbrella has an open position during which the umbrella shade is extended into a position away from the shaft and a closed position during which the umbrella shade is folded into a position closer to the shaft.

The frame includes: A cap is connected between the fastener and the umbrella shade. The cap has a cap opening and at least a first hinge portion and a second hinge portion. The fastener connects to a bolt of the shaft that passes through the cap opening. A first strut has first and second ends, a third hinge portion at the first end, and between the first and second ends is a first sleeve that holds a first solar panel. The third hinge portion is adapted to mate with the first hinge portion of the cap to form a first strut hinge. A second strut has third and fourth ends, a fourth hinge portion at third end, and between the third and fourth ends is a second sleeve that holds a second solar panel. The fourth hinge portion is adapted to mate with the second hinge portion of the cap to form a second strut hinge.

When changing the umbrella from the closed to the open position, the umbrella shade pushes against a bottom of the struts while the umbrella shade is extended. This causes the struts to rotate via the first and second strut hinges in a first turn direction, so that an angle between a top of the first strut and a top of the cap increases from a first angle in the closed position to a second angle in the open position. The second angle is greater than the first angle.

When changing the umbrella from the open to the closed position, the bottom of the struts rest against the umbrella shade while the umbrella is folded. This causes the struts to rotate via the first and second strut hinges in a second turn direction, so that the angle between the top of the first strut and the top of the cap decreases from the second angle to the first angle. The second turn direction is opposite of the first turn direction. When the umbrella is in the closed position, at least a portion of weights the first and second struts are supported by the cap.

In various implementations, each sleeve includes a transparent top surface that allows solar radiation to pass through to the solar panel housed by the sleeve. The umbrella includes: a rechargeable battery; a battery charging circuit, connected to the rechargeable battery; and electrical wires, connecting the first and second solar panels in parallel to the electrical charger circuit. The battery charging circuit can charge the rechargeable battery using solar power received from the first and second solar panels.

A voltage converter circuit is connected to the rechargeable battery. A first universal serial bus (USB) charging port is connected to the voltage converter circuit. A second USB charging port is connected to the voltage converter circuit. A third USB charging port is connected to the voltage converter circuit. The first, second, and third USB charging ports are capable of supplying at least 10 watts of output power each simultaneously.

A first printed circuit board (PCB) includes a PCB hole through which the shaft of the umbrella passes through. The battery charging circuit and the voltage converter circuit are formed on the printed circuit board. A battery housing includes a battery housing hole through which the shaft of the umbrella passes through. The battery housing houses the rechargeable battery, battery charging circuit, voltage converter circuit, and first, second, and third USB charging ports. A first spring-loaded retractable cover is connected to the battery housing to cover the first USB charging port. A second spring-loaded retractable cover is connected to the battery housing to cover the second USB charging port. A third spring-loaded retractable cover is connected to the battery housing to covers the third USB charging port.

A battery housing includes a battery housing hole through which the shaft of the umbrella passes through. The battery housing houses the rechargeable battery and battery charging circuit. An electrical socket is connected to the battery housing and the battery charging circuit. A connector connected to the electrical wires connected to the first and second solar panels is removably connected to the electrical socket.

A battery housing includes a battery housing hole through which the shaft of the umbrella passes through. The battery housing houses the rechargeable battery, battery charging circuit, voltage converter circuit, and first printed circuit board. A DC charging input can be connected to the battery charging circuit.

A battery level indicator circuit is connected to the rechargeable battery. A number of light emitting diodes are connected to the battery level indicator circuit. The battery level indicator circuit causes a number of the light emitting diodes to illuminate, which will correspond to a charge level of the rechargeable battery.

In an implementation, a method includes providing an umbrella having a shaft and umbrella shade. The umbrella has an open position during which the umbrella shade is extended into a position away from the shaft and a closed position during which the umbrella shade is folded into a position closer to the shaft. A cap is connected above the umbrella shade to the shaft. A first strut includes a first solar panel and is connected to the cap via first hinge at the cap. A second strut includes a second solar panel and is connected to the cap via second hinge at the cap.

The umbrella can be changed from the closed to the open position. The umbrella shade pushes against a bottom of the struts while the umbrella shade is extended. This causes the struts to rotate via the first and second strut hinges in a first turn direction, so that an angle between a top of the first strut and a top of the cap increases from a first angle in the closed position to a second angle in the open position. The second angle is greater than the first angle; and The umbrella can be changed from the open to the closed position. The bottom of the struts rest against the umbrella shade while the umbrella is folded. This causes the struts to rotate via the first and second strut hinges in a second turn direction, so that the angle between the top of the first strut and the top of the cap decreases from the second angle to the first angle. The second turn direction is opposite of the first turn direction.

In various implementations, each strut includes a sleeve having transparent top surface that allows solar radiation to pass through to a respective solar panel housed by the sleeve. A rechargeable battery is connected to a battery charging circuit. The rechargeable battery is charged using the battery charging circuit with solar power received from the first and second solar panels.

The rechargeable battery and battery charging circuit are housed in a battery housing having a hole extending through the housing. The battery housing is attached to the umbrella by passing the shaft through the hole of the housing.

The solar panels are connected to universal serial bus (USB) ports. The USB ports are housed in an enclosure having a USB opening for each USB port. For each USB opening, there is a spring-loaded retractable cover to cover the opening.

When the umbrella is in the closed position, at least a portion of a weight of the first strut is supported by the cap. When the umbrella is in the closed position, at least a portion of a weight of the second strut is supported by the cap.

A battery level indicator circuit is connected to the rechargeable battery. The battery level indicator circuit detects a charge level of the rechargeable battery. One or more light emitting diodes are lighted to correspond to the charge level of the rechargeable battery.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 1C-1D show underside views of the umbrella.

FIG. 1I shows an electronic circuit of the inductive charging pad in an implementation.

FIG. 3B shows another specific implementation of a cap of the umbrella.

FIGS. 4I-4J show simplified perspective views of the battery housing and the battery level indicator.

FIG. 6 shows a further enlarged view of the shelf, the printed circuit board, and the battery shelf.

FIG. 13 shows an environment where implementations of the present invention may be used by a user for charging one or more portable electronic devices.

DETAILED DESCRIPTION OF THE INVENTION

Figure 1A:
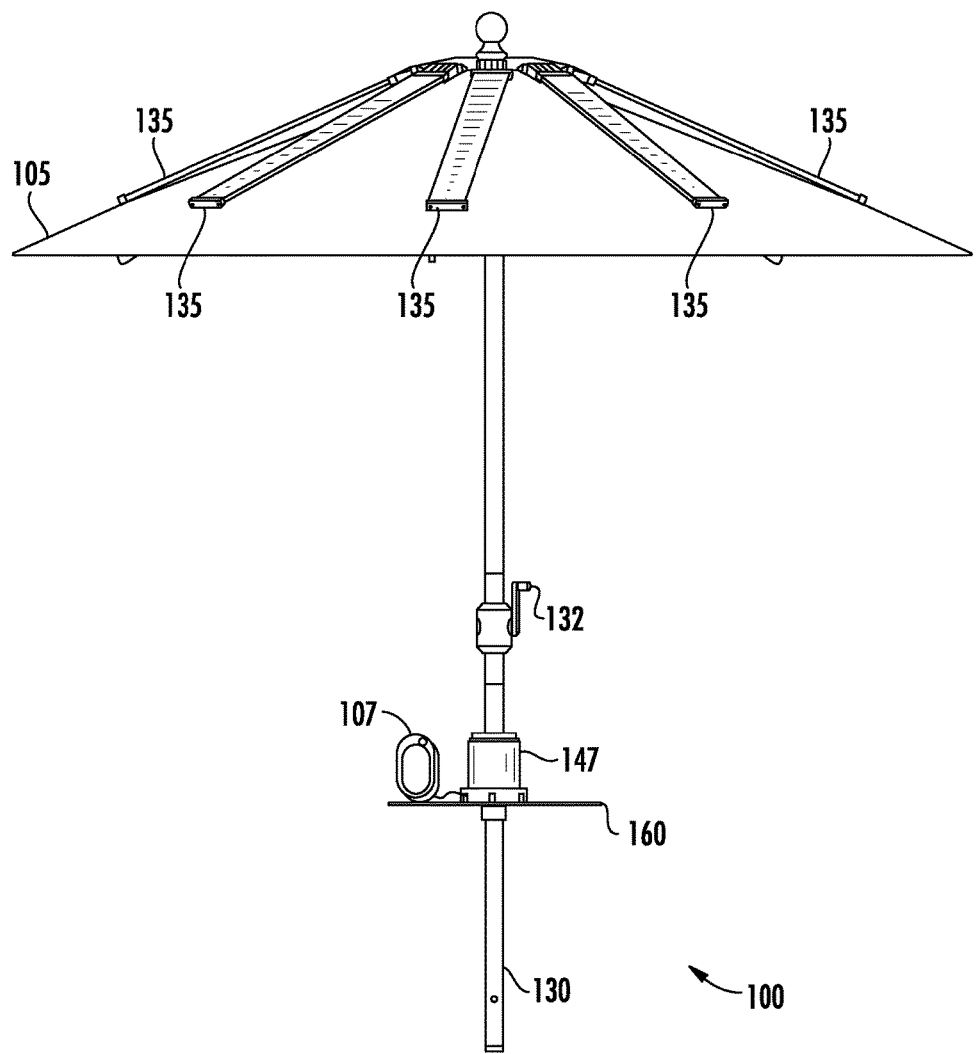
FIG. 1A shows a front view of an umbrella in an implementation.
Figure 1B:
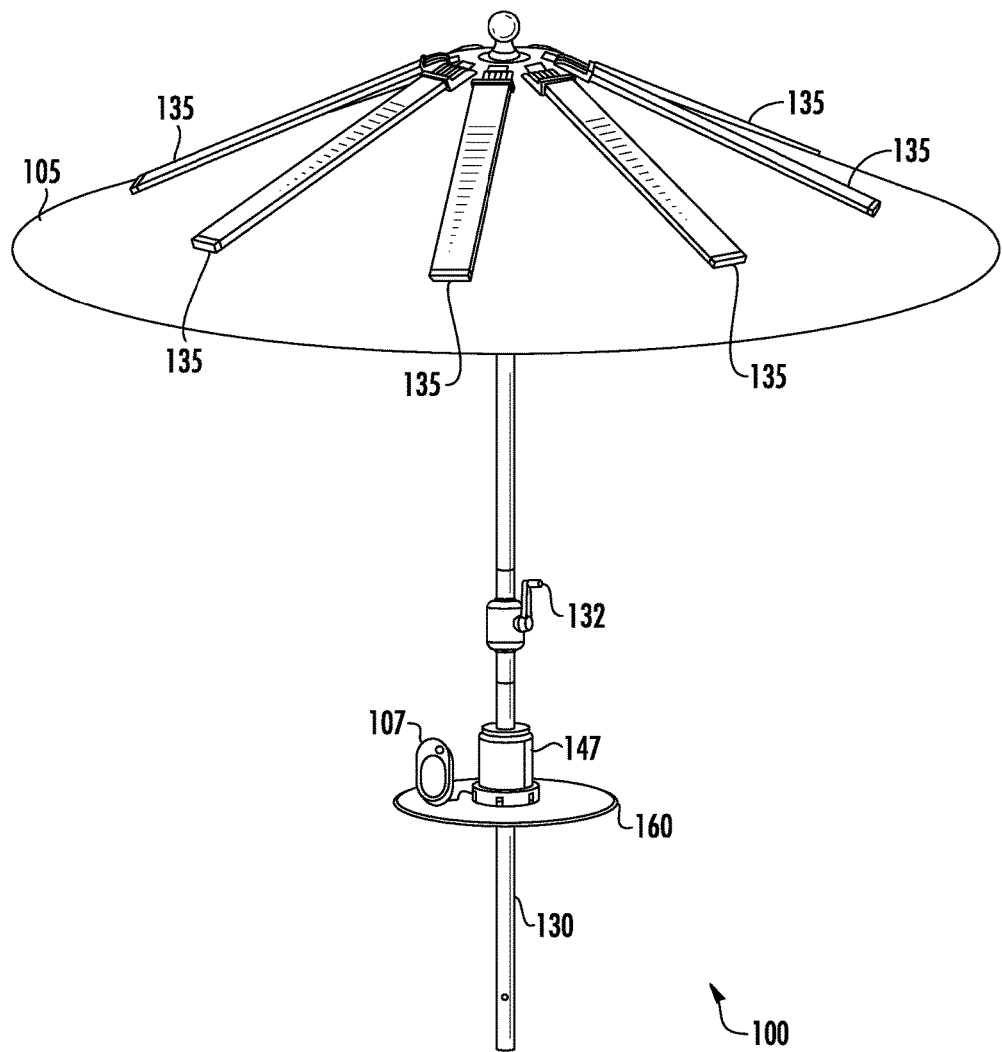
FIG. 1B shows a perspective view of the umbrella.
Figure 1C:
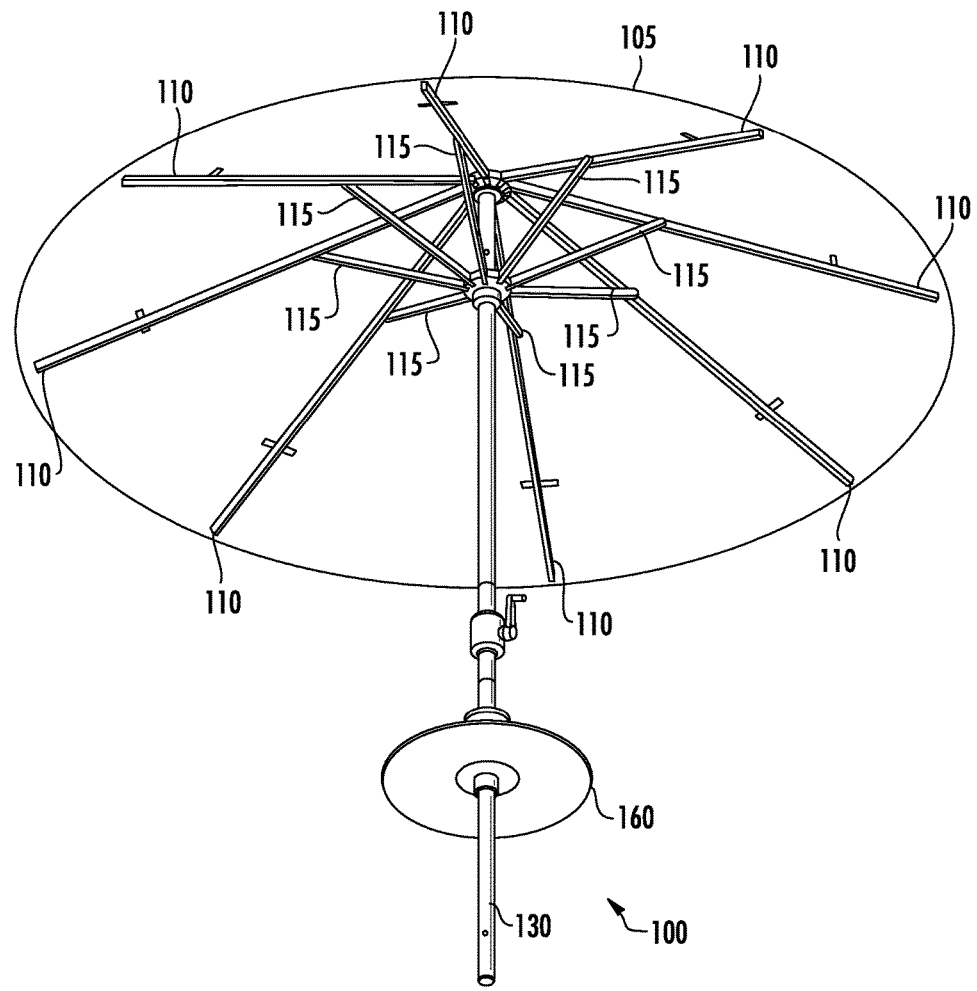

FIGS. 1A, 1B, and 1C respectively show a front view, a perspective view, and an underside view of an umbrella 100 in an implementation. FIG. 1D shows a further enlarged underside view of umbrella 100. Umbrella 100 is configured to protect a user from light (e.g., sunlight), collect the light, then convert the light into electricity, and use the electricity to power or charge one or more connected portable electronic devices 107. Light collection, conversion, and charging are described further below after various mechanical elements of umbrella 100 are described.

In an implementation, umbrella 100 includes a shade 105, a number of struts 110 (e.g., 8 struts), a number of ribs 115 (e.g., 8 ribs or spines), a first hub 120, and a second hub 125. Umbrella 100 also includes an umbrella pole 130 (sometimes referred to as an umbrella spine or spine) that holds the umbrella upright when in use. The umbrella pole can be aluminum, steel, wood, carbon fiber, or other material. Umbrella 100 also includes a number of solar panels 135 (also sometimes referred to as struts or rigid struts) that charge a rechargeable battery housed in a battery housing 147. In alternative implementations, umbrella 100 includes one or more of these elements in any combination.

Shade 105 may be attached to struts 110, which in-turn may be hinge connected to first hub 120 at an end of each strut. Ribs 115 are respectively connected to struts 110 along a length of the struts and are hinge connected to second hub 125.

First hub 120 and second hub 125 each have central shafts in which umbrella pole 130 may be positioned. Second hub 125 is configured to slide up and down along umbrella pole 130 to rotate struts 110 and ribs 115 upward and downward for opening and closing (also sometimes referred to as unfolding and folding) shade 105 in a conventional manner. Umbrella 100 may include a crank 132 on umbrella pole 130 that connects to second hub 125 via a cord or the like (not shown) for sliding second hub 125 up or down along umbrella pole 130 to open or close shade 105. The cord can pass through the center of the umbrella pole or pass along the outside of the umbrella pole.

With the shade and the frame in the upward position (i.e., open position), the top of each solar panel and the top of the cap are at a first angle with respect to each other. See FIGS. 1A-1B. With the shade and the frame in the downward position (i.e., closed position), the top of each solar panel and the top of the cap are at a second angle with respect to each other. See FIG. 1E. The second angle is greater than the first angle.

In another implementation, wires electrically connect the solar panels the battery housing. The wires can be routed through the umbrella pole from the solar panels to the battery housing. In the umbrella pole the wires can include a separable wire where the umbrella pole is separable and the separable wire is separable at a location of the umbrella pole where the umbrella pole is separable.

The wires can be routed out of the umbrella pole under the cap and through the housings of the solar panels to the photovoltaic cells that are positioned in the housings. The wires can also be routed under the hinges that hinge connect the solar panels to the cap. In some implementations, the wires can be routed through the hinges, which can include electrical contacts therein for routing current.

Figure 1E:
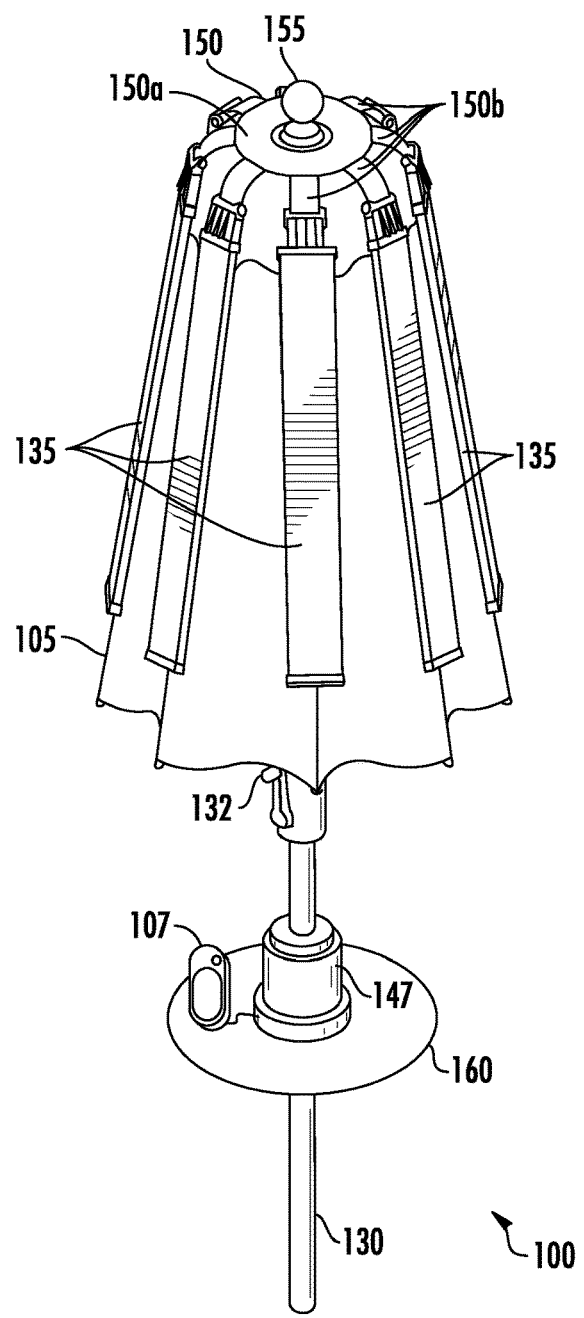
FIG. 1E shows a simplified image of the umbrella in a folded configuration.

FIG. 1E is a simplified image of umbrella 100 in a closed configuration with shade 105, struts 110, ribs 115, and solar panels 135 are folded downward. Second hub 125 is moved to a downward position along umbrella pole 130 to effect the closed configuration. Struts 110, ribs 115, first hub 120, and second hub 125 are sometimes referred to as the foldable frame structure of umbrella 100.

Umbrella 100 may include a strap or other closing device that is configured to wrap around shade 105 to hold the shade, the foldable frame structure, and the solar panels in the closed configuration. The closing device may be a attached to shade 105 and might include a piece of fabric (e.g., fabric strap) with a hook and loop fastening mechanism (e.g., Velcro® of Velcro Industries B.V) or other type of closing mechanism including clasps, buckles, and ties.

Shade 105 is shown in FIGS. 1A-1D as being substantially round or circular as viewed from the top of the shade. Shade 105 may have a variety of other shapes with straight or relatively straight sides such as square, rectangular, pentagonal, hexagonal, heptagonal, octagonal, or the like. The number of struts and the number of ribs that umbrella 100 includes may match the number of sides of shade 105. For example, for a square shaded implementation, umbrella 100 might have 4 struts and 4 ribs; for a pentagonal shaded implementation, the umbrella might have 5 struts and 5 ribs; for a hexagonal shaded implementation, the umbrella can have 6 struts and 6 ribs, and so forth.

Figure 14:
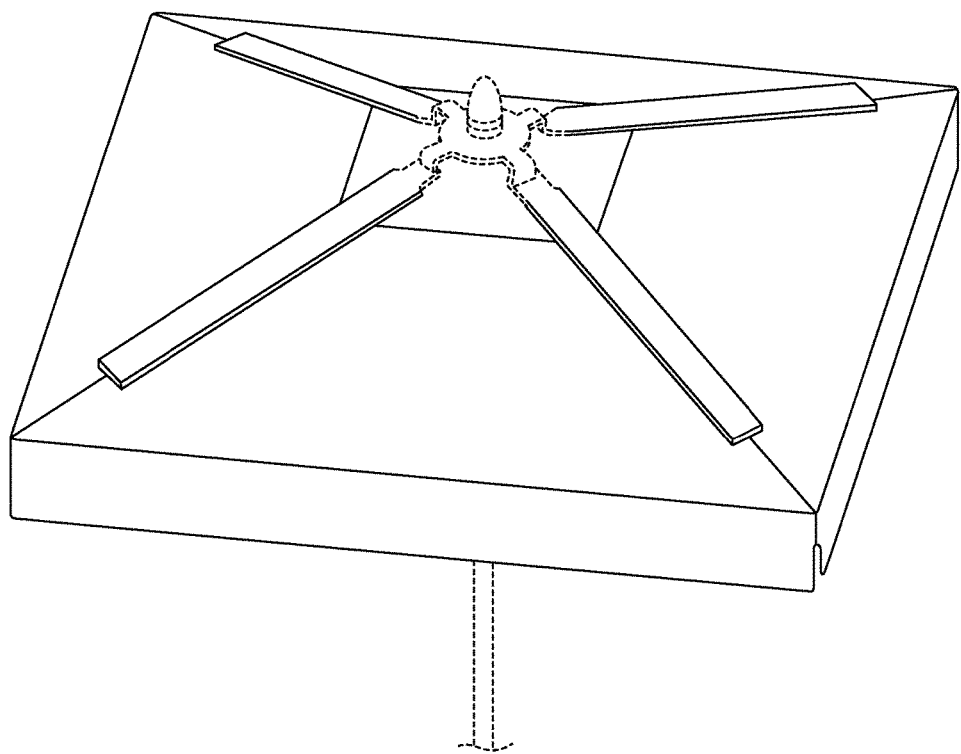
FIG. 14 shows an umbrella implementation having a four-sided shade.

FIG. 14 shows an example of an umbrella having a four-sided shade (e.g., square shade or a rectangular shade). The figure shows a four-sided shade from a perspective view. The four-side umbrella includes four solar panels. The solar panels are shown as extending along the struts of the frame, but may extend along portions of the shade away from the struts. Some embodiments can include more or fewer solar panels, such as 1, 2, 3, 4, 5, 6, 7, 8, or more solar panels. The four-sided shades (as well as other shades described in this application) can include an overhang portion that extends downward from edges of the shade. For example, FIG. 14 shows a four-sided shade embodiment that includes an overhang portion that extends downward from an edge of the shade. The four-sided shade umbrellas may include one or more of the umbrella elements and features described in this application in any combination including for example, battery housings, rechargeable batteries, charging terminals, and other elements and features.

Struts 110 and ribs 115 may be made of a variety of materials, such as wood, plastic, fiberglass, steel, aluminum, or the like, or a combination of one or more of these materials. The dimensions of the shade can vary depending on the shape. For example, a round, hexagonal or octagonal shade can have a diameter of about 4, 5, 6, 7, 8, 9, 10, 11 feet or greater when the shade is fully extended. A square or rectangular umbrella can have a width of about 3, 4, 5, 6, 7, 8, 9, 10, 11 feet or greater when the shade is fully extended.

In various specific implementations, an umbrella with 8 struts and 8 ribs can have a 9-foot diameter shade (or 11-foot diameter shade). An umbrella with 6 struts and 6 ribs can have a 7-foot diameter shade (or 8-foot diameter shade). For example, the umbrella with 8 struts and 8 ribs can have about a 9-foot diameter shade (e.g., from 7- to 11-foot shade) with 8 solar panels 135, each associated with a strut, each panel being about 30 inches long by about 3.5 inches wide by about 0.5 inches thick and extending greater than 50 percent down shade 105 (i.e., 50 percent of the radius of shade 105 or greater). While the solar panels are descried as being about 30 inches long, each solar panel may have a other lengths, such as 10 inches, 15 inches, 20 inches, 25 inches, 35 inches, 40 inches, or other lengths. Further, while the solar panels are described as being about 3.5 inches wide, each solar panel may have other widths, such as 2 inches, 2.5 inches, 3 inches, 4 inches, 4.5 inches, 5 inches, or other widths. Further, while the solar panels are described as being about 0.5 inches thick, each solar panel may be other thicknesses, such as about 0.2 inches, 0.25 inches, 0.3 inches, 0.35 inches, 0.4 inches, 0.45 inches, 0.55 inches, 0.6 inches, 0.65 inches, 0.7 inches, 0.75 inches, 0.8 inches, 0.85 inches, 0.9 inches, 0.95 inches, 1 inch, or other thicknesses.

Figure 1F:
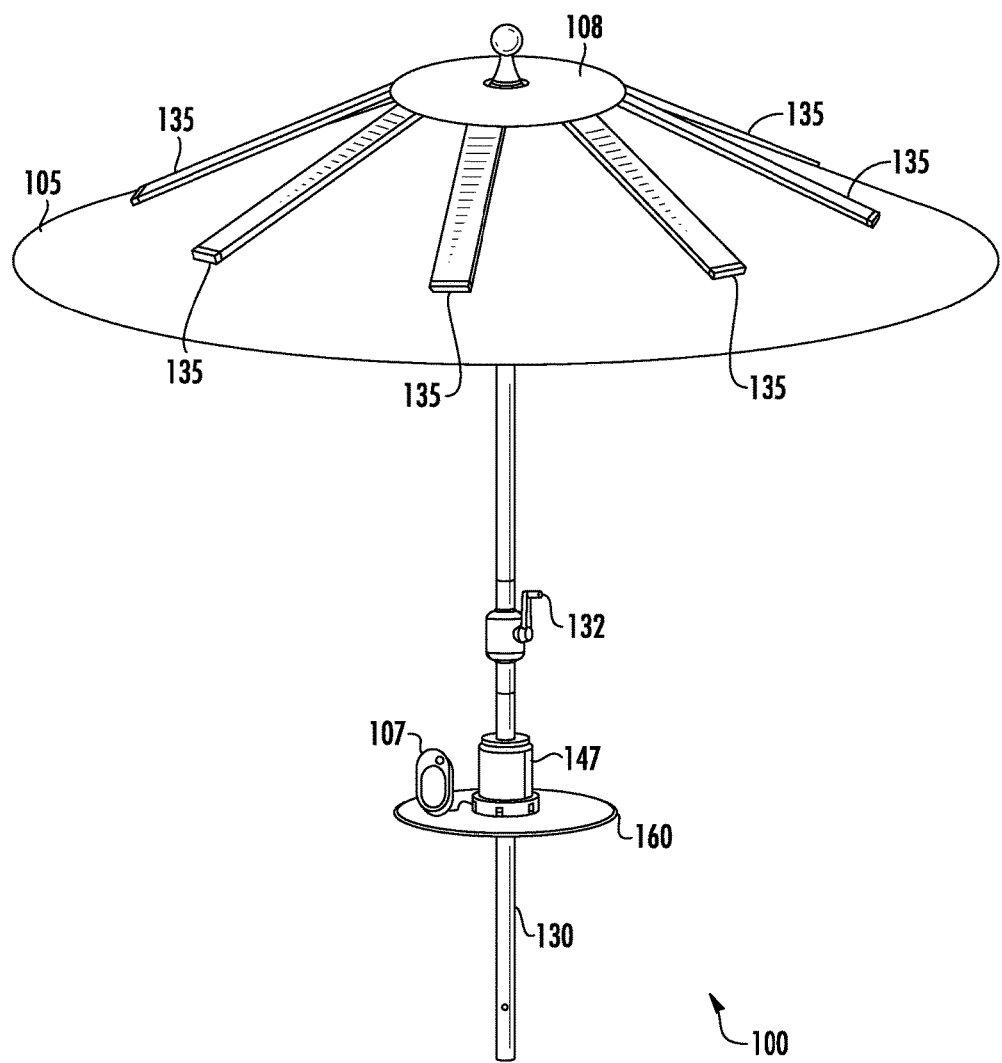
FIG. 1F shows a simplified image of the umbrella with a vent layer positioned at a top-central portion of the shade.

Shade 105 may also include a skirt (sometimes referred to as an overhang) that hangs down from a side of the shade. A skirt of shade 105 may hang down from the shade from about 2 inches to about 9 inches, although skirts of other widths might be used with relatively large umbrellas. Umbrella 10 may also include a vent layer 108 (e.g., formed from the same material that forms shade 105) that is positioned above a central portion of the shade (see FIG. 1F). Shade 105 may have a cutout (or vent) in the material forming the shade (e.g., canvas (e.g., cotton), plastic, nylon, mylar, vinyl, polyester, olefin, acrylic, or the like) under vent layer 108 so that air moving across the shade can move under the vent layer and through the vent. Vent layer 108 is shown in FIG. 1F as being positioned above solar panels 135, but may be positioned under the solar panels and above shade 105. The vent in shade 105 may be smaller than the vent layer so that the vent is substantially not visible when viewing the umbrella from the side.

Figure 1G:
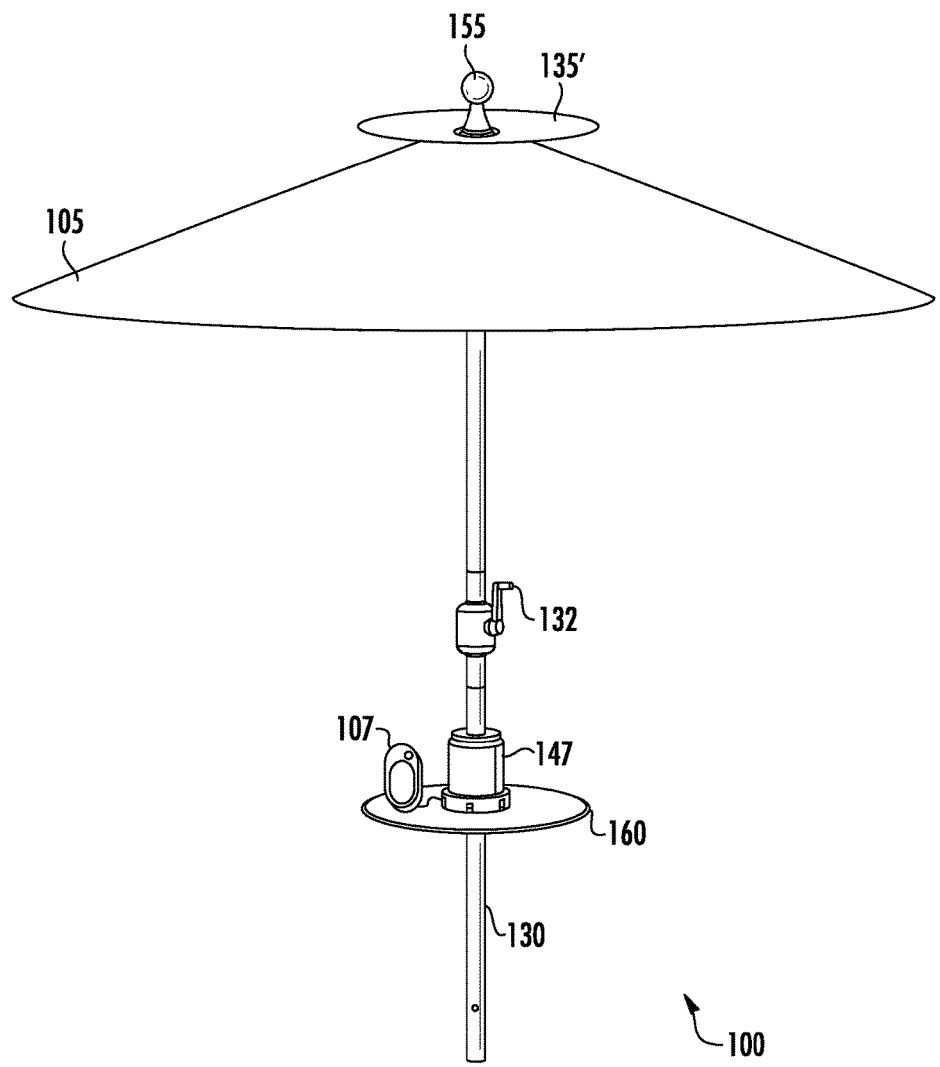
FIG. 1G shows a simplified image of the umbrella with photovoltaic cell attached to a top portion of the umbrella.

FIG. 1G is a simplified image of umbrella 100 with a solar panel 135' that is positioned substantially at the top of the umbrella. Solar panel 135' may include one or more photovoltaic cells positioned inside of a housing (e.g., a plastic housing). The housing includes a clear top (e.g., formed of clear rigid plastic) that allows light to pass to the photovoltaic cells that are positioned in the housing. The housing inhibits dust, moisture, and other small particles from reaching the photovoltaic cells in the housing. Solar panel 135' may be attached to umbrella pole 130 via a cap 150 (described further below) or by other devices. Solar panel 135' is configured to charge battery 185 (described below) substantially similarly to solar panel 135 as described in this application. Solar panel 135' may be round as shown in FIG. 1G or may have other shapes. Further, while solar panel 135' is shown as generally flat, the solar panel may have a variety of other shapes such as cone (e.g., a cut off cone) where the angle of the cone substantially matches the sloping angle of shade 105.

Inductive Charging Pad. In an implementation, a solar-charging station includes, in addition or as alternative to the USB ports, inductive charging ports. As an example, referring to FIG. 1H, the shelf 160 includes four positions that are marked (e.g., square or rectangular boxes) to indicate the location of wirelessly charging ports. The user can place their battery-operated device within or near the wireless charging port, and the device will be charged wirelessly. In a design for four devices, there can be various implementations that total four ports, wired or wireless. For example, an implementation has four wireless charging ports. Another implementation as three wireless ports and one USB charging port. Another implementation as two wireless ports and two USB charging ports. The wireless charging ports are connected to battery housing 147 by wires.

Figure 1H:
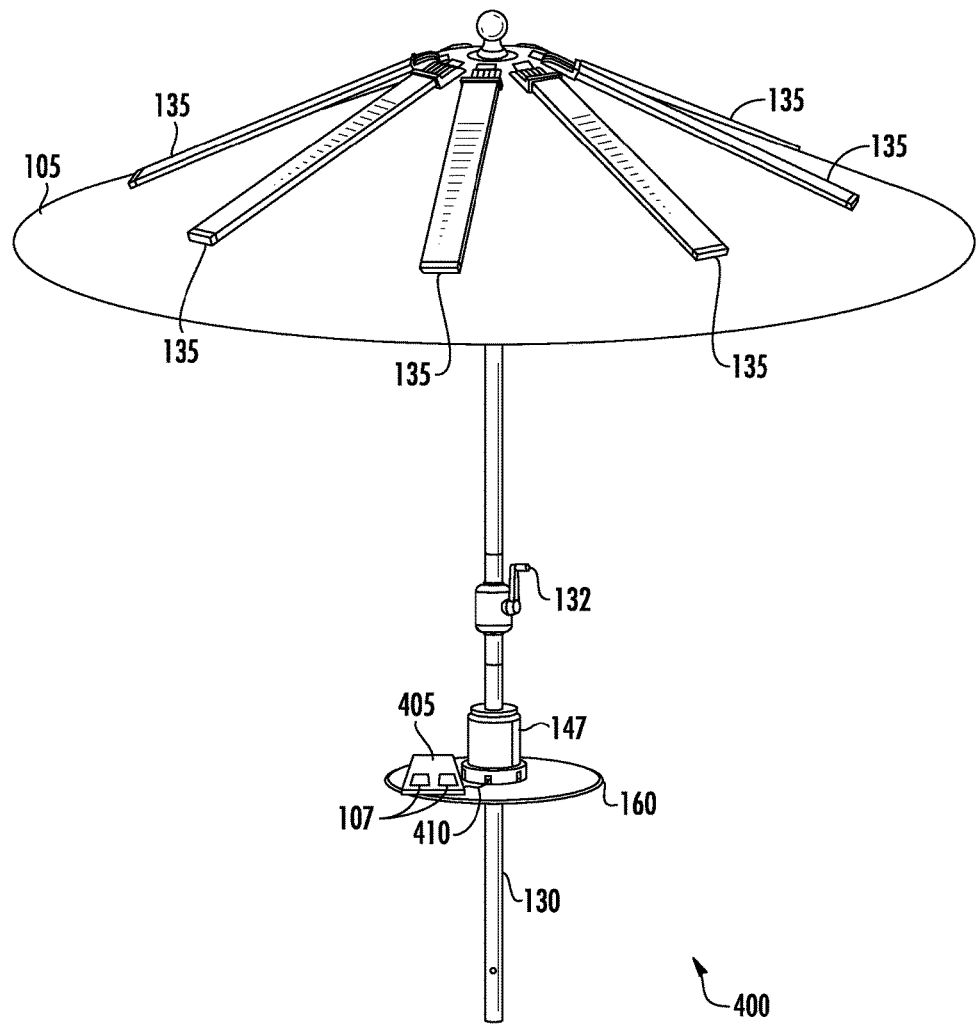
FIG. 1H shows an image of an umbrella in an alternative implementation.

In a specific implementation, FIG. 1H shows an umbrella 400. Umbrella 400 is similar to umbrella 100, but differs from umbrella 100 in that umbrella 400 includes an inductive charging pad 405, connected via USB. The inductive charging pad can be provided to users who want to charge wirelessly.

A wireless charging port, such as inductive charging pad 405, is electrically connected to the umbrella and is configured to use electrical energy received from the umbrella' solar panels to inductively charge at least one portable electronic device 107 placed on the wireless charging port. More specifically, the wireless charging port is configured to generate an alternating magnetic field that can be collected and used by the portable electronic device to charge the portable electronic device's rechargeable battery.

A wireless charging port, such as inductive charging pad 405, may be electrically connected to battery housing 147 to receive electrical energy from the battery housing's rechargeable battery. The wireless charging port may be hardwired to the battery housing via a charging wire 410, or charging wire 410 may be configured to removably connect to one of the battery housing's charging terminals. In an integrated design, charging wire 410 secured and hidden from view.

The inductive charging pad includes an exterior housing that houses an electronic circuit and at least one inductor that may be controlled by the electronic circuit. The inductor is positioned under a top of the exterior housing and has winding that are substantially planar with respect to the top, substantially transverse with respect to the top, or positioned at a different angular orientation.

In some implementations the exterior housing houses more than one inductor, such as two, three, four, five, six, seven, eight, or more inductors where each inductors is controlled by the electronic circuitry. For example, two or more inductors may be positioned laterally adjacent to each other within the exterior housing to provide two or more charging zones on a top of the exterior housing. Each charging zone is configured to charge one or more portable electronic devices at a given time.

In some implementations, each charging zone includes a number of inductors (e.g., 10, 20, 30, 40, 50, 60, or more inductors). Multiple inductors in a charging zone may be positioned to overlap each other or may be positioned laterally adjacent. Positioning a number of inductors in a charging zone provides that a portable electronic device can be positioned in a variety of positions in the charging zone and be inductively connected to at least one of the charging zone's inductors. That is, a portable electronic device does not have to be placed in one specific location or one specific orientation in the charging zone to be inductive connected to the inductive charging pad.

In an implementation, the top of the exterior housing includes one or more indicators that indicate the locations of the one or more charging zones. The one or more indicators include one or more visible indicators, one or more physical indicators (e.g., raised portions, lowered portions, or both), or both. For example, a visible indicator can include a visible loop (e.g., a loop of white paint or other material) that indicates a charging zone. A physical indicator may include a raised ridge (e.g., a closed raised ridge), a trench (e.g., closed trench), a textured surface, or combination of these indicators to indicate a charging zone.

The inductive charging pad is configured to operate according to one or more wireless charging specifications. For example, the inductive charging pad can operate according to one or more of the Wireless Power Consortium (WPC) wireless charging specifications, such as one or more versions of the WPC Qi specification. The WPC Qi wireless charging specification is a highly active specification that is actively being expanded to address multiple charging applications and charging configurations. As another example, the inductive charging pad can operate according to one or more versions of the Power Matters Alliance (PMA) specifications. As another example, the inductive charging pad can operate according to one or more of the versions of the Alliance for Wireless Power (A4WP) specifications, such as the Rezence™ (trademark of A4WP) specification for inductive charging. Each of the wireless charging specifications and all of the revisions of these wireless charging specifications are incorporated by reference.

In an implementation, the visible indicators that indicate the one or more charging zones on the top of the external housing include one or more logos for the charging specifications, such as the trademarked logos for the WPC Qi specification, the PMA specification, the A4WP, or other specifications.

In some implementations, the inductive charging pad is configured to communicate with a portable electronic device positioned on the top of the inductive charging pad. The inductive charging pad and the portable electronic device may communicate (e.g., digitally) via the induced magnetic fields generated by the inductors in the inductive charging pad and the portable electronic device. The inductors in the inductive charging pad and the portable electronic device that are configured for communication may also be configured for providing charging power to a portable electronic device.

In an implementation, prior to the inductive charging pad providing charging power to the portable electronic device, the inductive charging pad and the portable electronic device engage in a handshake procedure where device information is provided by one or both devices to the other of the devices. For example, the inductive charging pad may collect information from the portable electronic device regarding the charging specification that the portable electronic device is configured to operate under for inductive charging. The portable electronic device may also collect information from the inductive charging pad regarding the charging specification that the portable electronic device is configured to operate under for inductive charging. The inductive charging pad or the portable electronic device may also provide other information, such as revision information (e.g., revision number) for the particular revision of the inductive charging specification, operating system information, device type information, or other information. The inductive charging pad, the portable electronic device, or both devices can provide the other device with one or more of these pieces of information in any combination.

FIG. 1I is a diagram of an electronic circuit 420 of the inductive charging pad in an implementation. Electronic circuit 420 includes a processor 430, a communications and control unit 435, a driving circuit 440 (also sometimes referred to as a power conversion unit), at least one inductor 445, a communication bus 447, a memory 450, a power bus 455, a power bus 455, and a power port 457. The electronic circuit can include one or more of these circuit elements in any combination. The described circuit elements can be positioned on one or more printed circuit boards that are enclosed in the exterior housing of the inductive charging pad where the exterior housing may be configured to be positioned on shelf 160 of umbrella 400 for use.

In some implementations, the inductive charging pad includes two or more electronic circuits 420 so that the inductive charging pad can inductively charge two or more portable electronic devices at the same time. In some implementations that include two or more electronic circuits 420, some of the circuit elements included in the electronic circuits can be shared between the electronic circuits, such as the processor, the memory, or other circuit elements.

Processor 430 can include a microcontroller or a microprocessor. In some embodiments, processor 430 is replaced with programmable logic device, a field programmable gate array, or other control circuit. Memory 450 can be FLASH, EEPROM, EPROM, PROM, or other nontransitory memory type. The memory may store information for the various charging specifications that the inductive charging pad operates under, communication information that may be transmitted to a portable electronic device via the inductive charging pad, as well as other information used by the inductive charging pad.

Communication bus 447 connects the processor, the memory, the driving circuit, and the communications and control unit. The communication bus provides for communication between the circuit elements. In some implementations, the communication bus does not connect to each of the circuit elements as shown in FIG. 1I. For example, in some implementations, the communications and control unit may be electronically positioned between the processor and the driving circuit where communications from the processor to the communications and control unit pass through the communication bus to the driving circuit, and then through the driving circuit to the communications and control unit.

In implementations that include the power bus, the power bus can distribute power from battery housing 147 of umbrella 400 to one or more of the processor, the memory, the driving circuit, the communications and control unit, and other circuit elements. Inductor 445 may receive power from one or both of the driving circuit and the communications and control unit. The inductive charging pad can be hard wired to the battery housing, or can be removably connectable to one of charging terminals 165 of the battery housing. In an implementation where the inductive charging pad is configured to removably connect to one of the charging terminals 165 of the battery housing, the charging terminals of the battery housing and the inductive charging pad may operate according to a USB standard. The inductive charging pad can include a USB stack (e.g., a software element stored in the memory) and various circuits to execute and support the USB stack.

The inductive charging pad can receive electrical power from the rechargeable battery of the battery housing through the control circuit 180 (described further with respect to FIG. 9A below) of the rechargeable battery. That is, the control circuit 180 of umbrella 400 may be electronically positioned between the rechargeable battery and the inductive charging pad to control electrical power delivery from the rechargeable battery to the inductive charging pad.

In an implementation, the inductive charging pad receives electric power directly from the solar panels. Electrical power received directly from the solar panels may bypass the battery housing or may be routed through the battery housing to the inductive charging pad.

In an implementation, shelf 160 includes the inductive charging pad. Specifically, shelf 160 includes inductor 445 where the inductor can inductively charge a portable electronic device that is positioned on the shelf. The inductor may be positioned on a bottom surface of the shelf or within the shelf, such as integrally formed with the shelf.

For example, for a plastic shelf or a shelf formed of a similar material, the inductor may be positioned inside the plastic material that forms the shelf with a connector to the inductor formed at a side or bottom of the shelf. The inductor may be integrally formed in the shelf within the top half of the shelf, within the top quarter of the shelf, within the eighth of the shelf, within the top sixteenth of the shelf, within the top thirty second of the shelf, or other fractional location with respect to the top of the shelf. The inductor may positioned in the shelf within a 1 millimeter from the top, within a 2 millimeters from the top, within a 3 millimeters from the top, within a 4 millimeters from the top, within a 5 millimeters from the top, within a 6 millimeters from the top, within a 7 millimeters from the top, within a 8 millimeters from the top, within a 9 millimeters from the top, within a 10 millimeters from the top, or other distance from the top of the shelf In an implementation, the shelf includes a compartment formed in the shelf where the inductor is positioned in the compartment. The compartment may be formed in the top of the shelf with an upward facing opening (e.g., upward with respect to the bottom of the umbrella pole and with respect to the shade of the umbrella) or formed in the bottom of the shelf with a downward facing opening (e.g., downward with respect to the bottom of the umbrella pole and with respect to the shade of the umbrella). The compartment may be configured to be covered by a cover, such as a user detachable cover. More specifically, the compartment may include an area where the shelf is thinned from the bottom or top of the shelf.

In a configuration where the compartment is formed in the bottom of the shelf (opening downward), the inductor can be located along (e.g., attached) a top surface of the thinned area, which positions the inductor relatively close to the top of the shelf for efficient transfer of inductive energy to a mobile charging device positioned on top of the shelf. In a configuration where the compartment is formed in the top of the shelf (opening upward), the inductor can be poisoned on the inside (e.g., attached to) of the detachable cover that covers the compartment.

The shelf can include various markings to indicate where a portable electronic device can be positioned on the shelf for inductive charging.

Shelf 160 may include one or more of processor 430, communications and control unit 435, driving circuit 440, communication bus 447, memory 450, a power bus 455, and a power terminal 457. For example, these circuit elements may be positioned in a housing connected to a bottom or a top of the shelf or may be positioned in a compartment formed in the shelf with a cover configured to cover the circuit elements. The circuit elements can be located in the same compartment that houses the inductor. The shelf can include power terminal 457 (e.g., a USB connector) that is configured to receive electrical power from the battery housing and route the electrical power from the battery housing to the circuit elements located on or in the shelf.

In an alternative implementation, battery housing 147 houses one or more of the circuit elements. The battery housing can include an electrical connector that connects the circuit elements to the shelf, which includes the inductor. The electrical connector of the battery housing can be one of the battery housing's charging ports (e.g., a USB connector) or can be a dedicated connector.

In another implementation, battery housing 147 includes the inductive charging pad. Specifically, the described electronic elements of electronic circuit 420 are contained in the battery housing and receive power from the rechargeable battery. Inductor 445 can be contained within the top of the battery housing (e.g., integrally formed in the top), may be positioned on a bottom side of the top of the battery housing, or may be contained in a compartment (thinned portion) in the top. Thereby, the inductor can provide inductive charging power to a mobile device that is located on the top of the battery housing. In some embodiments, the battery housing includes a shelf that includes the inductor. The shelf may extend from a side of the battery housing, and may be configured to be unfolded and folded from the battery housing for use and storage.

Figure 1J:
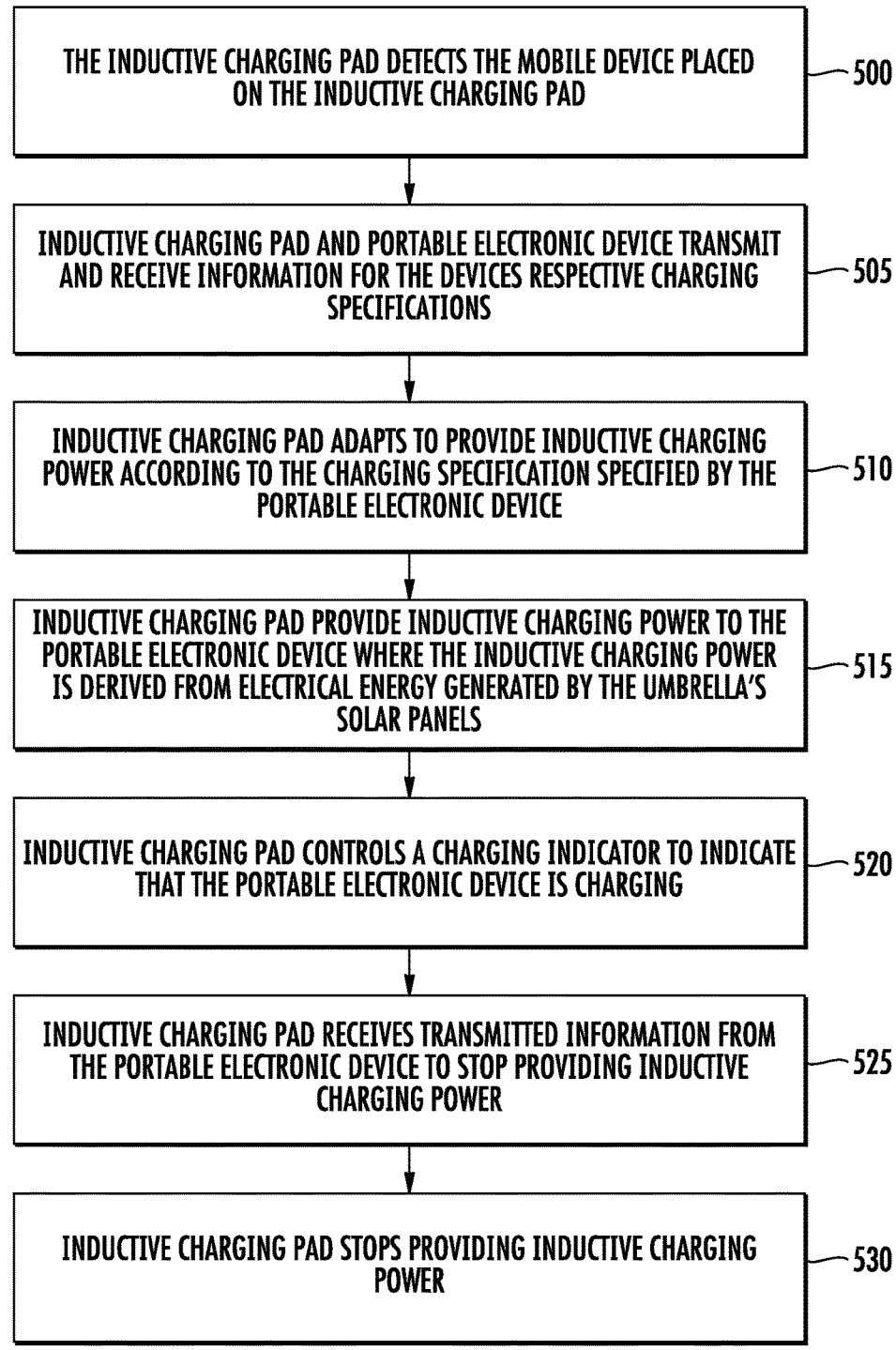
FIG. 1J shows a flow for an inductive charging method for inductively charging a portable electronic device in an implementation.

FIG. 1J is a flow diagram for an inductive charging method for inductively charging a portable electronic device in an implementation. The flow diagram represents one example implementation and steps may be added to the flow diagram, removed from the flow diagram, or combined without deviating from the scope of the implementation.

In an initial step 500, a portable electronic device is placed on the inductive charging pad, and the portable electronic device and the inductive charging pad detect each other. Thereafter, the inductive charging pad, the portable electronic device, or both transmit information to each other (see step 505) via their respective inductors. For example, the inductive charging pad and the portable electronic device may execute a handshake procedure where the devices recognize each other and share information regarding their charging requirements. For example, the portable electronic device may transmit information for the portable electronic device's charging requirements (such as the charging specification) to the inductive charging pad, and the inductive charging pad may transmit information to the portable electronic device regarding the inductive charging pad's charging capabilities, such as weather the inductive charging pad can provide inductive charging power according to the charging requirements requested by the portable electronic device.

For example, driving circuit 440 can place a substantially steady alternating current on the inductor and communications and control unit 435 may modulate this current with a digital communication signal for communicating with to the portable electronic device. The communications and control unit 435 may also be configured to demodulate digital communication signals received on inductor 447 from the portable electronic device. The processor can control both the driving circuit and the communications and control unit to drive the modulated alternating current onto the inductor. The portable electronic device may undergo a similar step of placing a modulated digital signal onto the device's own inductor 470. The processor may retrieve various information from the memory for interpreting received communications and for transmitting information.

In some implementations, the inductive charging pad is a listening device, and does not transmit communication signals to the portable electronic device, but responds to requests for providing inductive charging power according to charging specification information received from the portable electronic device. For example, in response to a transmission from the portable electronic device requesting that the inductive charging pad provide inductive charging power according to the given charging specification, the communications and control unit may receive the transmitted request and configure the drive circuit to provide the requested inductive charging power according to the given charging specification.

Further, while specific embodiments of the inductive charging pad have been described as including one inductor that is configured for inductive charging and inductive information communication, the inductive charging pad may include one or more inductors that are dedicated for information communication and one or more inductors that are dedicated for inductive charging.

In an implementation, the inductive charging pad and the portable electronic device communicate through a communication channel other than the induction field. For example, the inductive charging pad and the portable electronic device may be configured to communicate through an RF link, such as a Bluetooth link. The inductive charging pad can include a Bluetooth stack that is electronically connected to the processor through the communication bus for controlling Bluetooth communications. The portable electronic device can be similarly configured to Bluetooth communications.

In some implementations, one or both of the inductive charging pad and the portable electronic device operate under two or more charging specifications. If the inductive charging pad and the portable electronic device operate under two or more charging specifications, the handshake procedure can include communications where the inductive charging pad and the portable electronic device agree to operate under one of the common charging specifications that both devices can operate under.

Alternatively, the portable electronic device may be configured to operate under one charging specification and the inductive charging pad may be configured to operate under a number of charging specifications. The inductive charging pad may adapt to operate under the charging specification requested by the portable electronic device (see step 510). For example, the communications and control unit 435 may configure driving circuit 440 to operate under the charging specification requested by the portable electronic device.

For example, the communications and control unit 435 may connect or disconnect various circuits in the driving circuit 440 so that the driving circuit operates according to the charging specification requested by the portable electronic device. For example, the communications and control unit 435 can connect and disconnect various circuitry in driving circuit 440 so that the inductive charging pad can operate according to the WPC's Qi specification, the PMA specification, the A4WP's Rezence specification, or other specifications.

Subsequent to conforming to the charging specification of the portable electronic device, the inductive charging pad powers inductor 445 to provide inductive charging power to the portable electronic device (see step 515) where the charging power if derived from the electrical energy generated by the solar panels and provided to the inductive charging pad from the solar panels. The processor may then control a charging indicator 460 to indicate that the inductive charging pad is charging the rechargeable battery of the mobile device (see step 520). The charging indicator may be an LED indicator (such as an orange LED indicator), may be a display (such as an LED display) that displays a message (text, graphics, or both) that indicates charging. The charging indicator may include a speaker system that generates a sound that indicates charging. The portable electronic device may similarly include a charging indicator to indicate that the portable electronic device is being charged by the inductive charging pad.

Alternatively, if the inductive charging pad and portable electronic device are not configured to operate under the same charging specification, the processor may then control an incompatibility indicator 465 to indicate that the inductive charging pad is not charging the rechargeable battery of the mobile device. The incompatibility indicator may be an LED indicator, such as a red LED indicator, may be a display, such as an LED display, that displays a message (text, graphics, or both) that indicate that the portable electronic device is no being charging. The incompatibility indicator may include a speaker that generates a sound that indicates the lack of charging. The portable electronic device may similarly include an incompatibility indicator to indicate that the portable electronic device is not being charged by the inductive charging pad.

In another implementation, if the inductive charging pad and portable electronic device are not configured to operate under the same charging specification, the processor can control the driving circuit and the communication and control unit to operate the inductor according to a charging specification that most closely matches the charging specification of the portable electronic device. The mismatch in charging specifications may result in the rechargeable battery of the portable electronic device charging, but charging at a lower than optical charging efficiency. That is, inductor 470 of the portable electronic device may reflect back a portion of the received inductive power provided by inductor 445 where the reflected power will be wasted and not used for charging the portable electronic device's rechargeable battery. The processor may control the charging indicator to indicate this less than optimal charging by lighting an LED of third color, such as a yellow LED.

When the rechargeable battery of the portable electronic device is fully charged, the portable electronic device may transmit a communication to the inductive charging pad that indicates that charging is complete (see step 525). After receiving and processing the communication, the processor can control the driving circuit and the communications and control unit to stop providing charging current to the inductor (see step 530). The processor may control the charging indicator to indicate that the portable electronic device is fully charged. For example, the processor may control the charging indicator to light a green LED to indicate that charging is complete. The portable electronic device may be similarly configured to indicate that charging is complete.

The method described above with respect to FIG. 1J can be operated for a number of portable electronic devices positioned in the inductive charging pad. Portions or the entire method can be executed substantially in parallel for two or more portable electronic devices positioned on the inductive charging pad. As described, the two or more portable electronic devices positioned on the inductive charging pad can operate according to two or more different inductive charging specification, which the inductive charging pad can adapt to for providing inductive charging power to the two or more portable electronic devices substantially simultaneously. The two or more portable electronic device can respectively communicate specification information for their two or more inductive charging specification to the inductive charging pad.

Figure 1K:
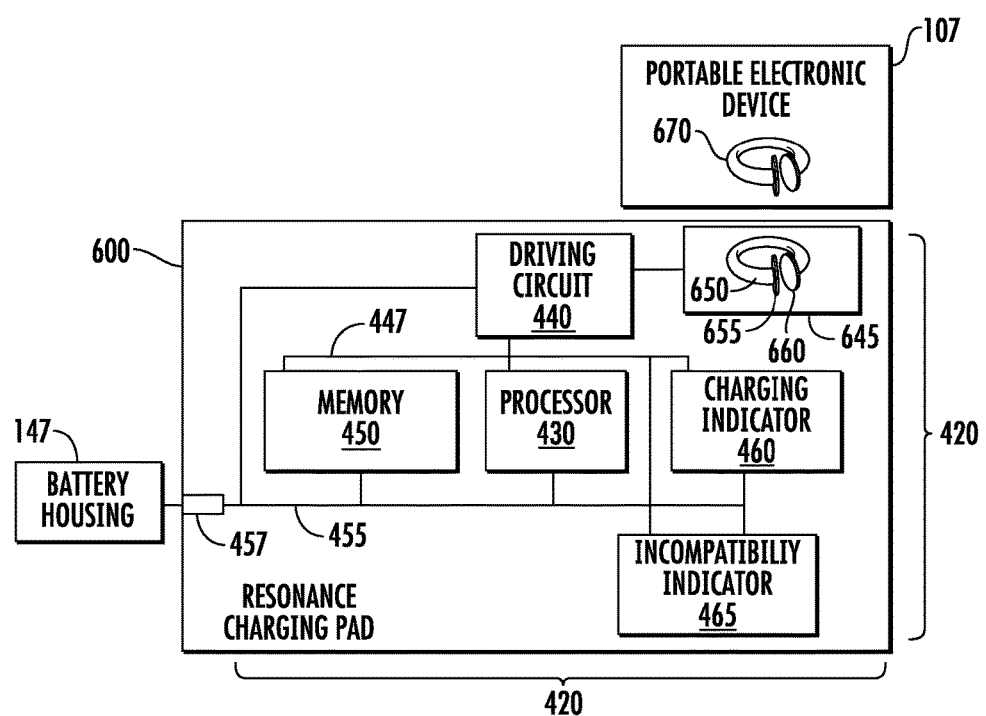
FIG. 1K shows a schematic of a charging pad and portable electronic device for use with the umbrella in an alternative implementation.
Figure 1L:
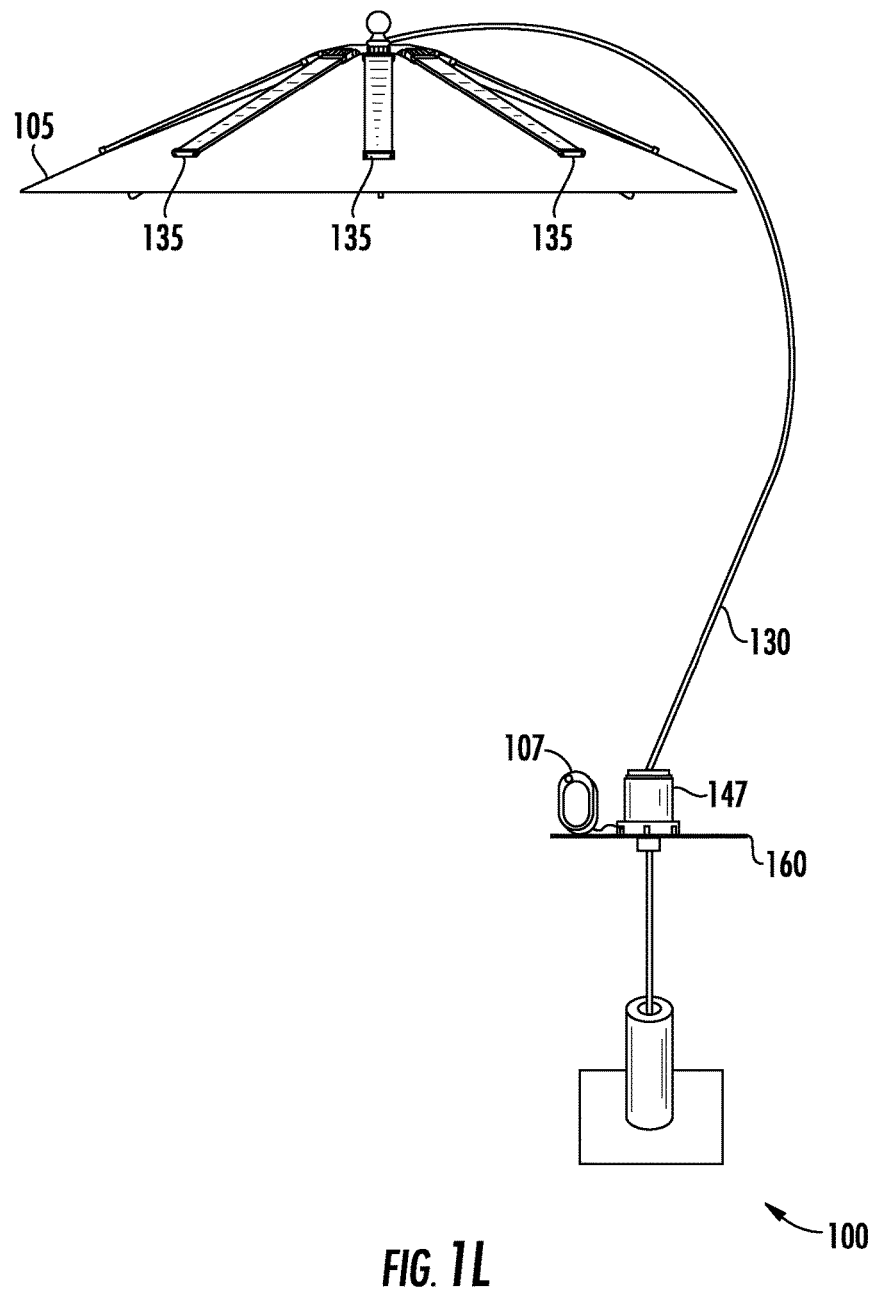
FIG. 1L shows an implementation where the umbrella pole has a capricious-cantilever shape.
Figure 1M:
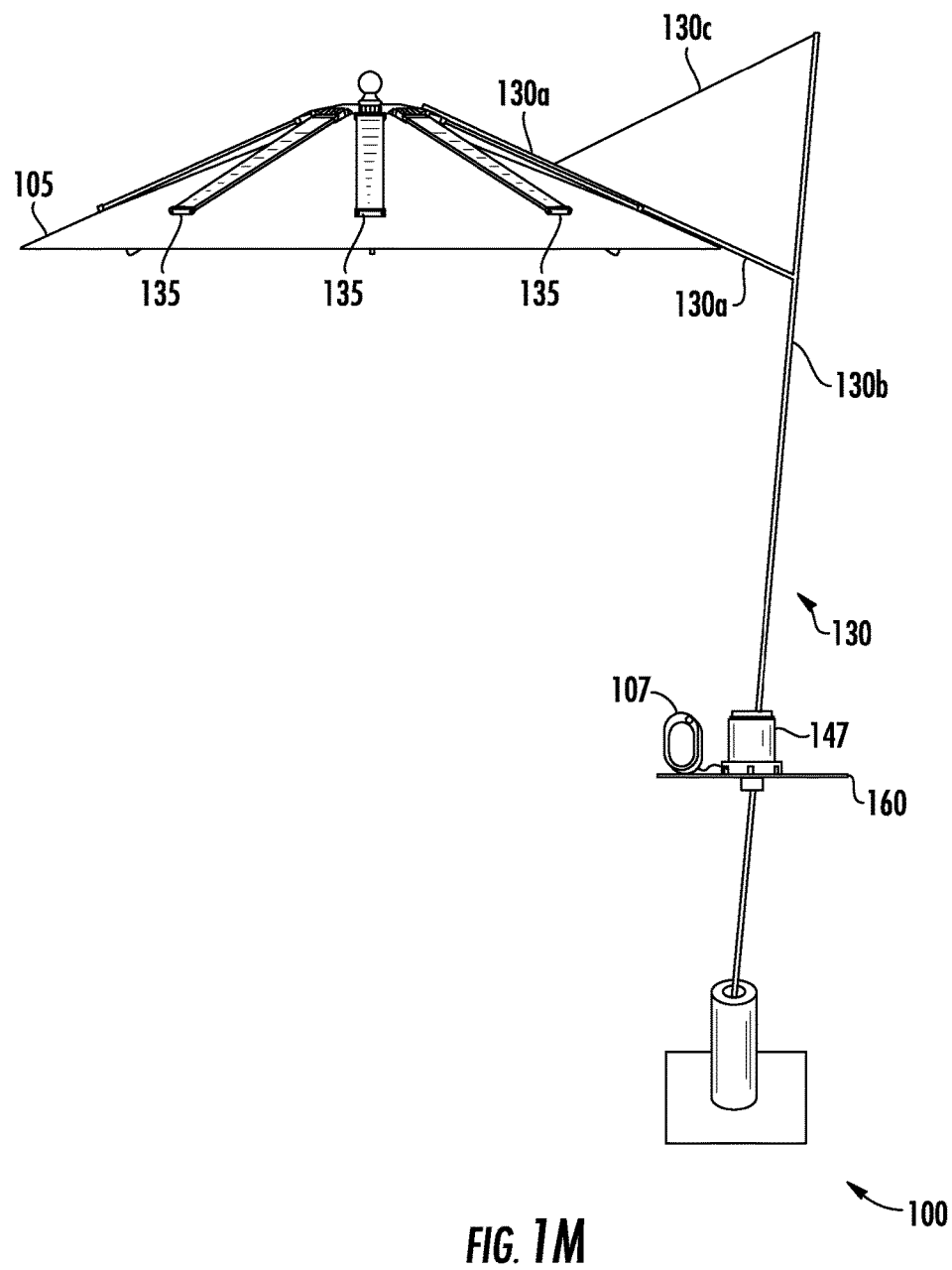
FIGS. 1M-1N show implementations where the umbrella pole has a multiple-pole cantilever shape.

FIG. 1K is a schematic of an inductive charging pad 600 and portable electronic device 607 for use with umbrella 400 according to an alternative implementation. Inductive charging pad 600 is substantially similar to inductive charging pad 400, but differs in that charging pad 600 includes a relatively high resonance device 645. Portable electronic device 607 similarly includes a relatively high resonance device 670. Resonance device 645 is configured to inductively generate an alternating magnetic field that resonance device 670 is configured to detect and based on the detection generate an alternating current in resonance device 670 based on the detection. In some embodiments, the inductive charging pad includes a number of electronic circuits shown in FIG. 1K where the electronic circuits are associated with a corresponding number of charging zones.

The resonance devices are configured to resonate at substantially the same frequency of alternating magnetic field and the portable electronic device is configured to use the magnetic field detected by resonance device 670 for charging the portable electronic device's rechargeable battery or for other useful purpose, such as powering the portable electronic device. The portable electronic device can include various circuits (not shown) for rectifying the alternating current for charging the portable electronic device's rechargeable battery.

The resonance devices can operate in the nonradiative near field where evanescent magnetic field patterns provide for relatively high efficiency energy transfer between the resonance devices. Operating in the nonradiative near field provides that the resonance devices can be separated by approximately a wavelength or less of the electromagnetic wavelength of the operating frequency and maintain a relatively high Q factor.

Resonance device 645 may generate an alternating magnetic field that alternates at a variety frequencies. In some implementations, resonance device 645 generates a magnetic field that alternates at a frequency from about 1 megahertz to about 10 megahertz, such as about 6.78 megahertz. The Q factor for the resonance devices can be 50 or greater, 100 or greater, 200 or greater, 300 or greater, 400 or greater, 500 or greater, 600 or greater, 700 or greater, 800 or greater, 900 or greater, or 1000 or greater.

In some implementations, resonance device 645 includes a metal ring 650 or a coil, such as a copper ring or copper coil, and includes a pair of terminal devices 655 and 660. The terminal devices can be capacitive plates that at least in part control a resonant frequency of the resonance device. The resonance devices are sometimes referred to as capacitively-loaded conducting loops, capacitively-loaded conducting loops coils, or capacitively-loaded inductors.

The terminal devices can include dielectric or metal and can have various dielectric and conductive properties to control the resonant frequency. The terminal devices can also have a variety of shapes, such as disk shape, spherical shape, or other shape. For example, the terminal devices can be a dielectric disk, a dielectric sphere, a metallic disk, a metallic sphere, a metallodielectric disk, a metallodielectric sphere, a plasmonic disk, a plasmonic sphere, a polaritonic disk, a polaritonic sphere, a capacitively-loaded conducting-wire loop. The radius of the disk or sphere can be proportional to a radius of the metal ring or coil. Resonance device 670 may be similarly configured to resonance device 645.

The radius of each of the resonance devices can be approximately 0.5 centimeters or greater, such 1 centimeter or greater, 2 centimeters or greater, 5 centimeters or greater, 10 centimeters or greater, 15 centimeters or greater, 20 centimeters or greater, 30 centimeters or greater, 40 centimeters or greater, 50 centimeters or greater, or 100 centimeters or greater. While the resonance devices are shown in FIG. 1K as being generally circular in shape, the resonance devices can have other shapes, such as square, rectangular, ovoid, elliptical, triangular, capricious, or other shapes.

Figure 1N:
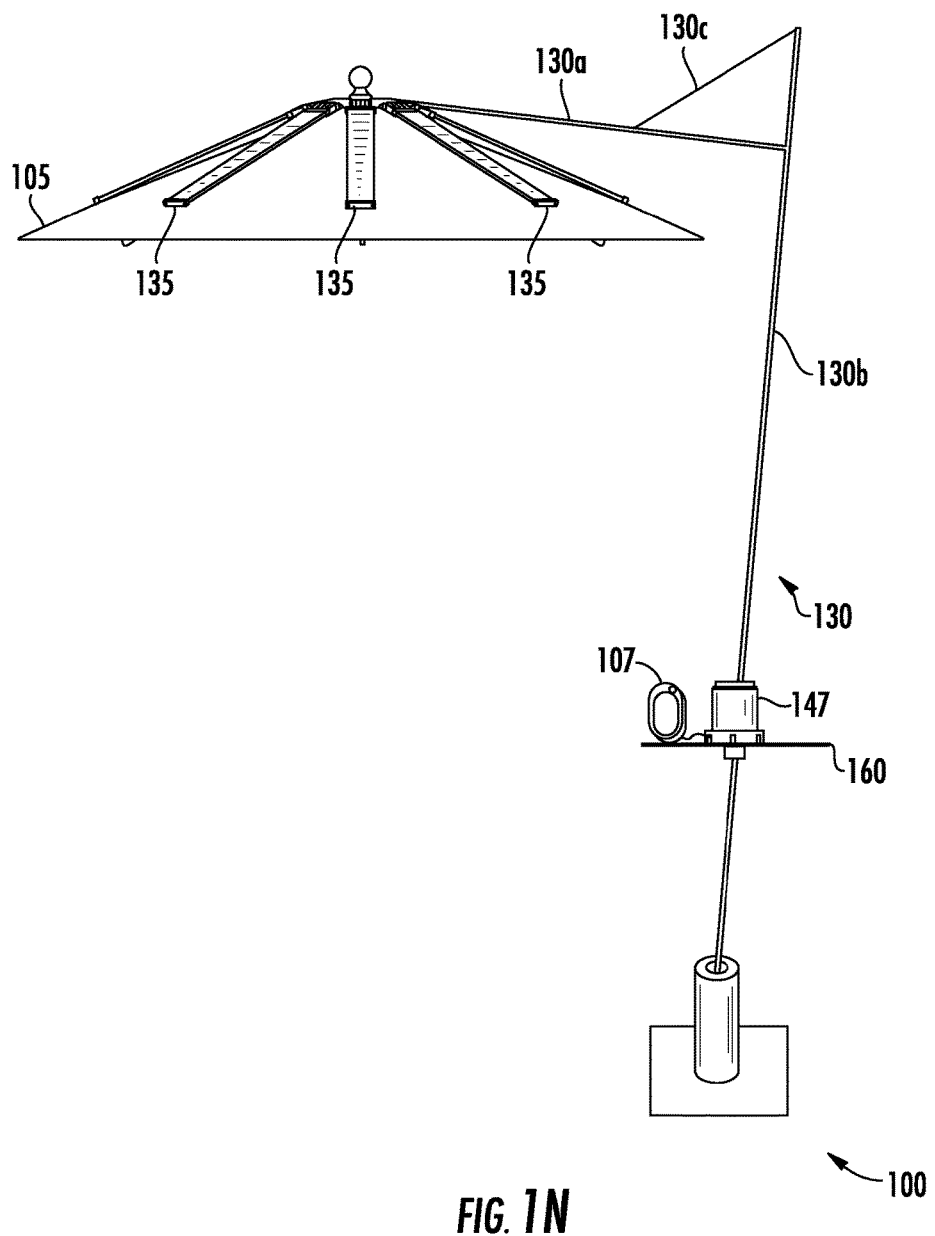

FIGS. 1N-1P show umbrella pole 130 as being relatively straight and configured to be relatively vertically oriented when umbrella 100 is in use. In alternative implementations, umbrella pole 130 has a variety of other shapes, such as the capricious-cantilever shape shown in FIG. 1N, the multiple-pole cantilever shapes shown in FIGS. 1O and 1P, or other shapes. In the implementations where umbrella pole 130 has a multiple-pole cantilever shape, a cantilever arm 130*a* of the umbrella pole may be attached (FIG. 1O) to the foldable frame structure of the umbrella or may form a portion of the foldable frame structure. For example, cantilever arm 130*a* can be attached to one of struts 110 or may be one of the struts. The cantilevered arm can be above shade material 105 or below shade material 105. In some implementations, cantilevered arm 130*a* is attached to the umbrella pole (e.g., detached from foldable the frame structure) or attached to the top of the foldable frame (FIG. 1P). Cantilever arm 130*a* may be cantilever attached to a stand pole 130*b* and may have additional support from a truss pole 130*c*.

Figure 2:
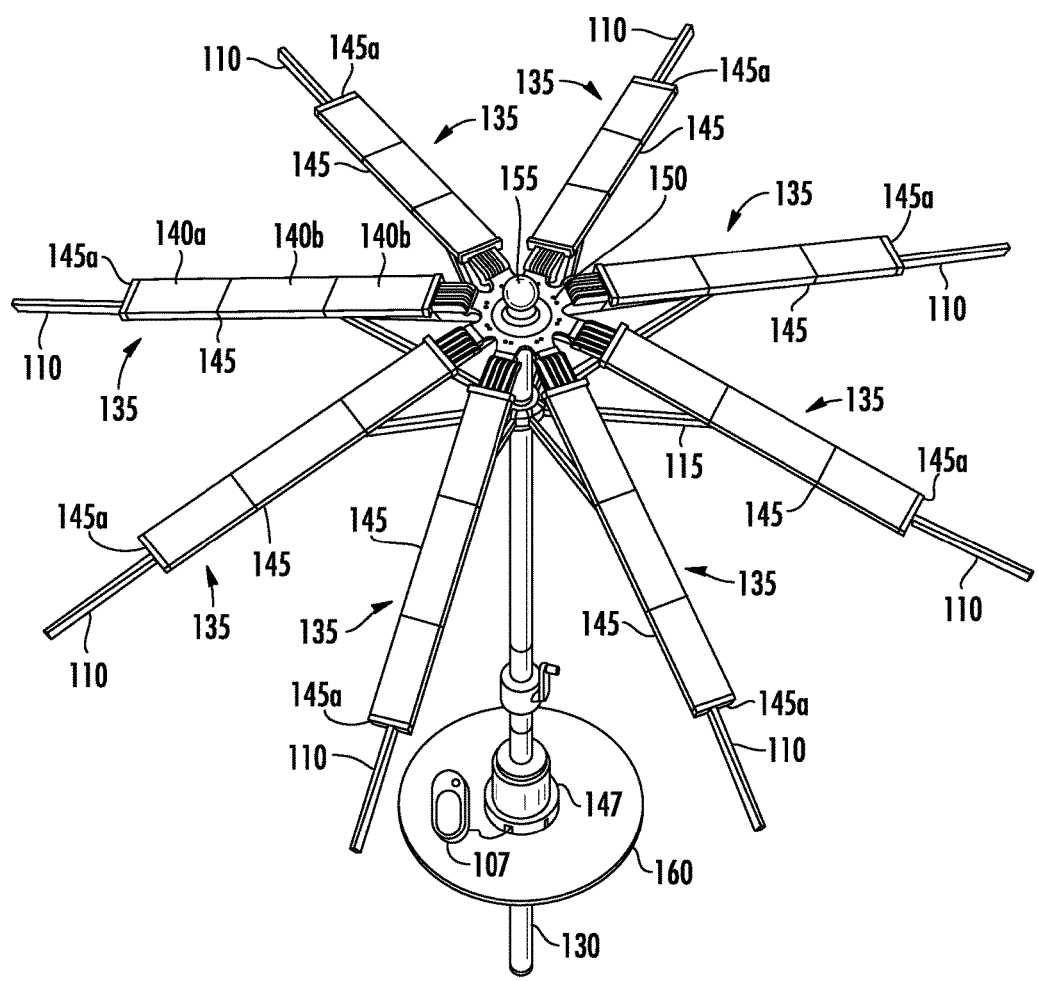
FIG. 2 shows a top view of the umbrella where the umbrella is shown without the shade.

FIG. 2 is a top view of umbrella 100 that is shown without shade 105. As shown in FIG. 2 and other figures, umbrella 100 further includes one or more of solar panels 135. Each solar panel 135 may include 3 photovoltaic cells 140*a*, 140*b*, and 140*c* (generally photovoltaic cells 140) and a housing 145 that houses the photovoltaic cells. While each solar panel 135 is described as including three photovoltaic cells, each solar panel may include more or fewer photovoltaic cells, such as one, two, four, five, six, seven, or more photovoltaic cells. Each housing 145 may be a sleeve in which photovoltaic cells 140a-140c are housed. Each housing 145 may be formed from a variety of materials such as plastic, nylon, metal (e.g., aluminum), or the like, or any combination of these materials.

In one specific implementation, each solar panel 135 has three photovoltaic cells where each photovoltaic cell is 10 inches long by 3 inches wide. Each photovoltaic cell can produce up to about 12 volts at 750 milliamps, depending on the available sunlight. The three photovoltaic cells of a solar panel are inserted into one of the housings 145 (e.g., clear housings) that holds the photovoltaic cells together and protects them. For example, each housing 145 may be configured to be substantially water resistant so that moisture (e.g., rain, mist, or the like) does not penetrate the housing and reach the photovoltaic cells in the housing. Each housing may also be configured to inhibit dust from reaching the photovoltaic cells.

In an alternative specific implementation, each solar panel 135 has two photovoltaic cells where each photovoltaic cell is 10 inches long by 3 inches wide and each photovoltaic cell can produce up to about 12 volts at 750 milliamps, depending on the available sunlight. For example, an umbrella that is used in a relatively sunny environment might include two photovoltaic cells per housing, whereas an umbrella that is used in a less sunny environment might include three or more photovoltaic cells per housing.

For some implementations, a housing 145 that is configured to house three photovoltaic cells, houses the two photovoltaic cells where an additional photovoltaic cell can be put into each housing as an optional upgrade to the umbrella. The position at which a third photovoltaic cell would have been placed in a housing can be filled with a spacer the size of a third photovoltaic cell. A spacer in a housing inhibits the two photovoltaic cells included in a housing from sliding in the housing and inhibits the photovoltaic cells from being damaged when the umbrella is moved. In implementations where each housing includes one photovoltaic cell, the housing can include two spacers where the spacers are removable for the possible later inclusion of one or two additional photovoltaic cells.

In some implementations, each housing has a length that is configured to house a specific number of photovoltaic cells. For example, a housing that includes one photovoltaic cell, is shorter than a housing that includes two photovoltaic cells, and a housing that includes two photovoltaic cells is shorter than a housing that includes three photovoltaic cells. Solar panels that include one or two photovoltaic cells can have lengths that are fifty percent of the radius of the shade of the umbrella or shorter than fifty percent of the radius. Solar panels that include three or more photovoltaic cells can have lengths that are greater than fifty percent of the radius of the shade.

In an implementation, the photovoltaic cells are 9 to 11 inches long (e.g., 10 inches long as described above) and approximately 2.5 to 3.5 inches wide (e.g., 3 inches wide, described above). Each set of three photovoltaic cells on each strut 110 may be configured to generate approximately 500 milliamps to approximately 1000 milliamps (e.g., 750 milliamps, described above) at approximately 10 volts to 14 volts (e.g., 12 volts, described above). The amount of current or power generated will depend on the intensity of the light source (e.g., sun) that is shining on the panel. The sets of three photovoltaic cells may be electrically parallel to provide approximately 4 amps to approximately 8 amps (e.g., 6 amps, described above) at the described voltages. Various photovoltaic cell technologies may be used for photovoltaic cells 140, such as single crystal silicon, polycrystalline silicon, polymer solar cells, organic solar cells, and other thin film technologies.

In the configuration described above, a 9- to 11-foot umbrella shade can support 24 cells, yielding a maximum current of about 6 amps at 12 volts. This voltage can charge a rechargeable battery having about 22,000 milliamp-hour capacity. The rechargeable battery is connected, through a printed circuit board (PCB, described below) including circuitry discussed below, to supply power to three charging terminals (e.g., 3 USB type A receptacles described below) that are used for charging one or more portable electronic devices 107 at the same time.

For example, corresponding USB plugs can connect to these charging terminals for charging of portable electronic devices 107. Power is delivered from the rechargeable battery through the charging terminals, and through cables that connect the charging terminals to the portable electronic devices. As the rechargeable battery becomes depleted, sun or another light source shining on the solar panels causes the generation of electricity, which via circuitry (described below) on the printed circuit board charge the rechargeable battery.

In some implementations, each housing 145 is attached to one of struts 110. For example, each housing 145 may be attached to one of struts 145 at a first end portion 145a of housing 145. Various clasps, brackets, or the like may attach housings 145 to struts 110. Alternatively, each housing 145 can be positioned above one of the struts 110 without being attached to the strut where shade 105 is positioned between the housing and the strut. With solar panels 135 attached to the struts or above the struts at the top of umbrella 100, the solar panels are positioned to collect a relatively large amount of light that falls on the umbrella for conversion to electrical energy.

In some implementations, each housing 145 can be hinge rotated independently of struts 110 being raised and lowered. In another alternative, each housing 145 may be positioned above shade 105 and positioned laterally between two struts 110. Further, each housing 145 may be attached to, or detached from, shade 105. In another specific implementation, each housing is not included in a fabric pocket of shade 105, but is positioned above fabric forming the shade.

Umbrella Cap. In an implementation, umbrella 100 includes a cap 150 (see FIG. 2) and a cap retainer 155 that connects the cap to a top of the umbrella pole. Cap retainer 155 may be a finial that includes a threaded rod, a threaded nut, or other attachment device that attaches (e.g., threads) the cap to the umbrella pole. In some implementations, cap retainer 155 is configured to removably attach the cap to the umbrella pole. Cap 150 may be configured to be positioned above the first hub on the umbrella pole and above the shade. The cap can be made of metal, such as steel or aluminum, nylon, plastic, composites, or other suitable material.

Figure 3A:
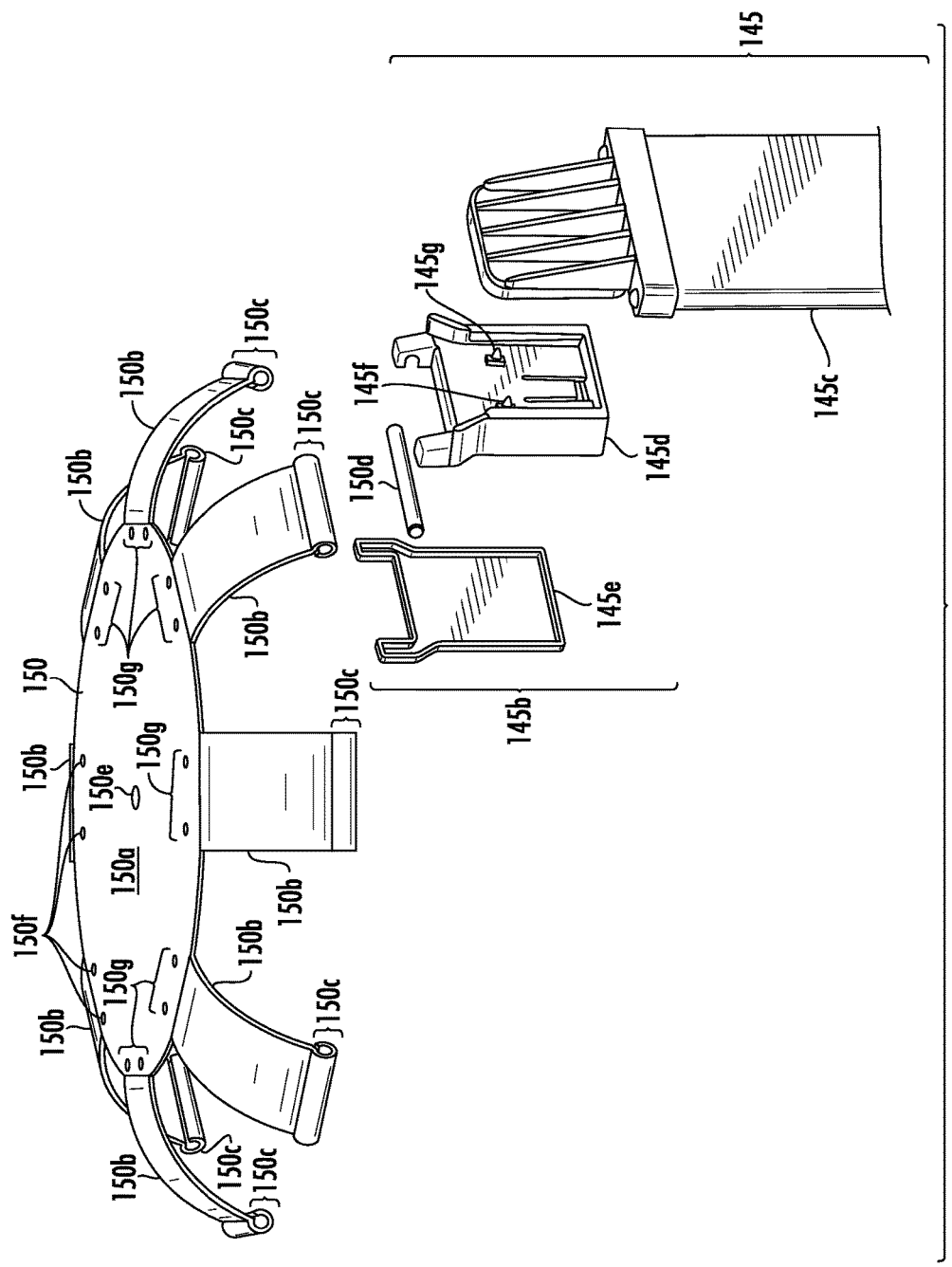
FIG. 3A shows an enlarged view of a specific implementation of a cap of the umbrella to which the solar panels are hinge connected.

FIG. 3A is an enlarged view of cap 150 in an implementation. Cap 150 includes a top portion 150a and a number of arms 150b (e.g., 8 arms that are respectively associated with ribs 115 and solar panels 135) that extend from the top portion (e.g., extend outward and down from the top portion). Top portion 150a may be substantially flat and have a centrally positioned aperture 150e formed in the top portion. Aperture 150e may be configured to receive a fastener, such as a bolt (e.g., threaded bolt) of umbrella pole 130 or cap retainer 155 for attaching cap 150 to the umbrella pole.

In an implementation, the top of the umbrella (e.g., the top of the umbrella pole) has a threaded bolt to which the cap retainer 155 (e.g., an ornament or finial) is typically screwed onto. When the cap retainer is unscrewed, the threaded bolt is exposed. Cap 150 can then be placed onto the bolt, such that the bolt passes through aperture 150e. The cap retainer is then screwed onto the bolt, holding the cap in place on the umbrella. The cap is positioned between the cap retainer and the shade material of the shade.

Arms 150b are attached to solar panels, where a hinged connection between each arm and solar panel allows the solar panels to rotate up and down (i.e., open and close) as the shade of the umbrella opens and closes.

Each arm 150b may be connected to top portion 150a of cap 150. The arms may be curved and may extend downward from the top portion 150. In an implementation, each arm has a substantially continuous curve between the ends of the arm.

The arms and the top portion of the cap can be integrally formed. For example, the cap can be a stamped piece of metal, can be cut from a single piece of metal where the arms are bent downward, or the arms can be welded to the top portion to form an integrated cap. Alternatively, the arm can be attached to the top portion of the cap via fasteners, such as nuts and bolts.

In an implementation, cap 150 has a number of apertures 150f formed in top portion 150a. The apertures may be formed in pairs 150g and each pair may be positioned adjacent to the ends of arms 150b, which are nearest to top portion 150a. Apertures 150f may be configured to receive fasteners (e.g., bolts, screws, rivets, pins, or the like) or the like for attaching cap 150 to struts 110, via brackets or the like, to top hub 120, or to laterally extending portions of umbrella pole 130. Aperture 150f can be threaded or may have attached nuts or the like, which may be threaded. In various alternative implementations, top portion 150a includes a variety of other devices for attaching cap 150 to struts 110, such as studs, threaded studs, or the like which may extend downward from the top portions for receiving various fasteners.

As briefly described above, the solar panels and their housings are hinge attached to the umbrella. This hinge attachment is currently described further. In an implementation, the hinge attachment if provided by hinge components of cap 150 and housings 145 of the solar panels. In the implementation, each end portion 150c of each arm 150b of cap 150 includes a hinge part, such as an elongated barrel. The elongated barrels are configured to respectively receive pins 150d that can rotate inside of the elongated barrel and attach to the housings. Specifically, pins 150d may be longer than the barrels and extend from the ends of barrels so that the ends of the pins may be attached to end portions 145b of housings 145 to provide for the hinge coupling and hence the rotation of the housings and solar panels with respect to the arms of the cap.

In some implementation, cap 150 does not include arms 150b and the hinge parts of the cap are attached to top portion 150a. In a further specific implementation, each end portion 145b of each housing 145 includes a front hinge plate 145d and a back hinge plate 145e, which are configured to attach to one another and hinge connected (i.e., rotationally connect) to the ends of pins 150d. The hinge coupling of front and back hinge plates 145d and 145e to pins 150d allows the solar panels and their housings to rotationally raise and lower as the umbrella opens and closes. The curve of each arm 150b can provide flex for housings 145 as the housings raise and lower to inhibit the housing from experiencing forces that might separate the housing from the arms by allowing some lateral movement of the housings along the struts.

For each housing of each solar panel, one or both of front and back hinge plates 145d and 145e may include electrical contacts 145f and 145g that are configured to mechanically and electrically connect to corresponding electrical contacts (not shown) of elongated portion 145c. The electrical contacts in the hinge plates and the electrical contacts in the elongated portions of the housings allow current generated by the photovoltaic cells to flow out from the solar panels for charging the rechargeable battery of the umbrella. A pair of wires (not shown) may electrically connect the electrical contacts of the solar panels to circuitry (described below with respect to FIG. 9A) in battery housing 147 that charges the rechargeable battery with the current received via the wires. The wires may run down the center of umbrella pole 130 for delivering the generated current to the circuit and the rechargeable battery, which is configured to be electrically connected to and charge one or more portable electronic devices 107. Positioning the wires in the umbrella pole provides the benefit of the wires not being exposed where the wires might be snagged by users, for example, when the umbrella is opened and closed, when the umbrella is being setup or taken down for storage, while the umbrella is in storage, or the like. In alternative implementations, the wires are run along the outside of the umbrella pole, which provides easy access to the wire, such as for repair or replacement.

Referring now to FIG. 3B, this figure shows an alternative implementation of a cap 152 for umbrella 100. The arms 150b of cap 152 have different shapes compared to the arms of cap 150. For example, each arm of cap 152 includes a first straight portion that extends laterally from a side of the top portion, a second portion that curves downward from the first portion, and a third straight portions that extends downward from the second portions. The curve of the second portion can be a sharp bend or a gradual bend. For example, an angle a of the bend can be about 90 degrees. In other implementations, the angle can be less sharp. For example, the bend can have an angle of 91, 92, 93, 94, 95, 96, 97, 98, 99, 100, 105, 110, 115, 120, 125, 130, 135, 140, 145, 150, or 155 degrees, or any angle in this range or greater. In other implementations, the angle may be less than 90 degrees.

Similar to the cap 150, each arm of cap 152 can have an end portion that includes a hinge part, such as an elongated barrel. The elongated barrels are configured to receive pins that can rotate inside of the elongated barrels and hinge connect the solar panels to the cap.

Referring again to FIG. 3A, for each solar panel 135, each end portion 145b of each housing 145 is removably attached to an elongated portion 145c of the housing. The elongated portions of the housings house the photovoltaic cells. Providing for the end portions 145b of the housings to be removable from the elongated portions 145c of the housings provides for the relatively easy removal and replacement of the photovoltaic cells should one or more of the photovoltaic cells fail.

Figure 4A:
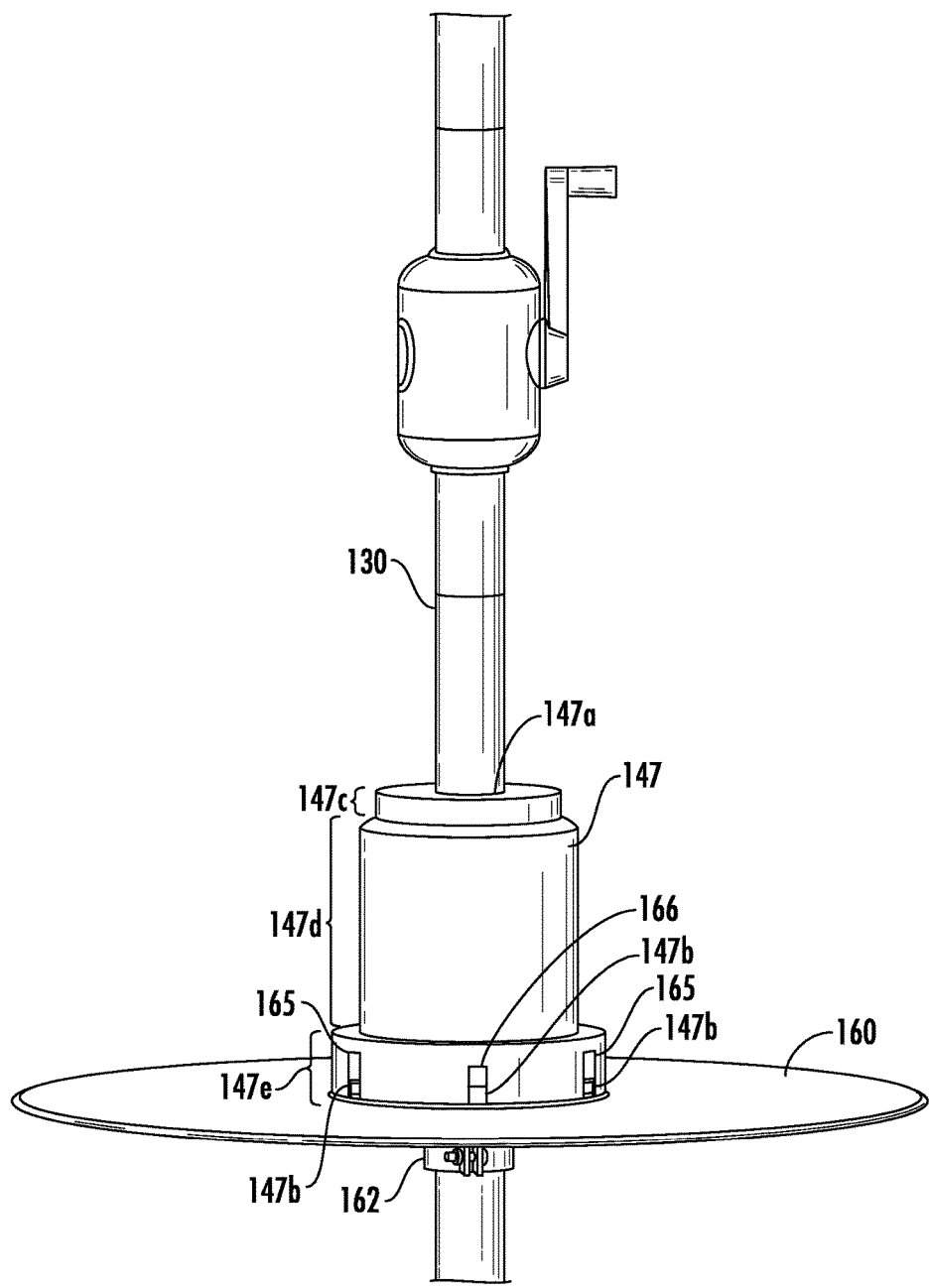
FIG. 4A shows a simplified perspective view of a central portion of the umbrella.

Central Portion of Umbrella. FIG. 4A is a simplified perspective view of a central portion of umbrella 100 in an implementation. The central portion of the umbrella may include the battery housing 147 that is configured to house the charging circuitry and the rechargeable battery. In a specific implementation, battery housing 147 has a tubular passageway or shaft 147a that extends from a top of the battery housing through to a bottom side of the battery housing. During the assembly of the solar umbrella, the shaft of the umbrella (e.g., umbrella pole 130) is placed through tubular passageway 147a.

In FIG. 4A, battery housing 147 is positioned above or on a shelf or table 160. But in other implementations, battery housing 147 can be underneath shelf 160. Further, shelf 160 can be omitted, and the battery housing 147 can be attached or fastened to the umbrella shaft, can rest on an umbrella stand (in which the umbrella shaft is placed), or can sit on an extended table, such as a backyard garden table or a picnic table where the umbrella pole passes through the extended table.

In an implementation, the battery housing has a number of charging terminal (also referred to as charging ports) 165 that are used to charge portable electronic devices 107, which can include smartphones, tablet computers, and other devices. In a specific implementation, the charging terminals are USB type A connectors, but can include other types of connectors including other types of USB connectors, Apple 30-pin connector, Apple Lightning (™) port, Firewire, DC barrel connector, and others, and combinations of these. The charging terminals are accessible via apertures 147b formed in the battery housing.

For charging, a user connects a portable electronic device to a charging terminal via a cable, and the portable electronic device will be charged by solar umbrella 100. While charging, the user can leave the device resting on table 160. In other implementation, there may be other receptacles to hold the portable electronic device such as a basket or shelf that is attached to the umbrella shaft (e.g., attached above the charging station). Other mechanisms for holding the portable electronic device include hooks, nets, cradles, smartphone holders (e.g., smartphone holder with adjustable side grips), and many other mechanisms.

In a specific implementation, battery housing 147 has three charging terminals (e.g., USB type A female ports) However, in other implementation, there can be more or fewer charging terminals such as 1, 2, 4, 5, 6, 7, 8, or 10 or more. Further, there can be a charging input port 166 (described in further below and shown in FIGS. 4F, 7, and 9) that is used to charge the rechargeable battery via an AC adapter connected to a wall socket (or other power source). This allows recharging of the battery from a power source other than only the solar panels. The charging input port is a DC barrel connector that accepts 12 volts DC. In other implementation, other types of DC power ports can be used.

Figure 4B:
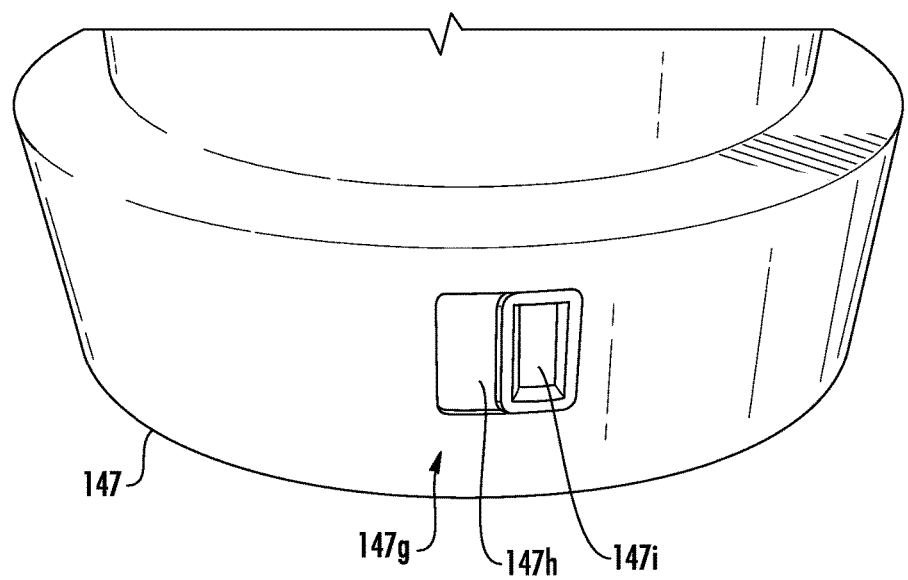
FIGS. 4B-4C show are simplified perspective views of the central portion of the umbrella in an alternative implementation where the battery housing includes at least one door positioned in front of one of the charging terminals.
Figure 4C:
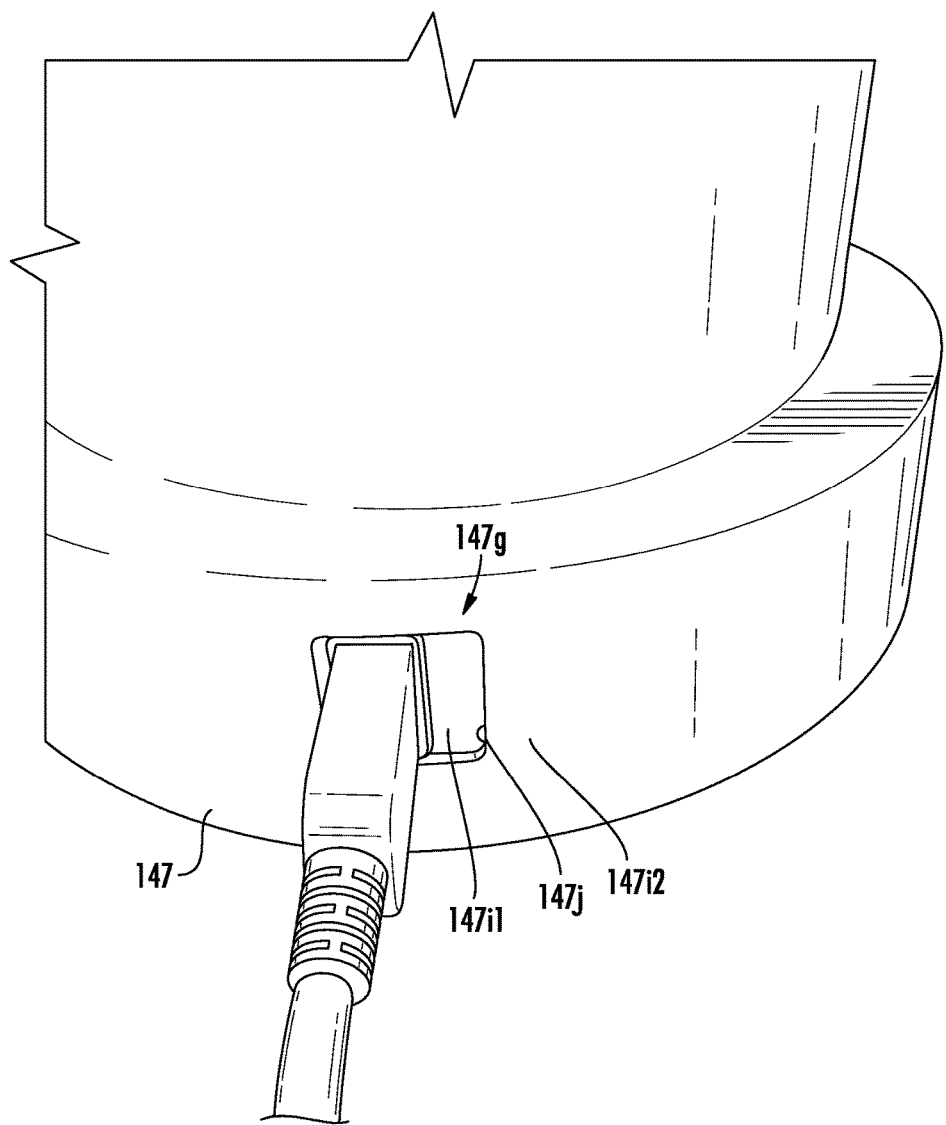

FIGS. 4B and 4C are simplified perspective views of the central portion of umbrella 100 in an alternative implementation where battery housing 147 includes at least one door 147g positioned in front of one of charging terminals 165. FIG. 4B shows door 147g closed and FIG. 4C shows the door open. Door 147g is configured to be opened by a user so that the charging terminal positioned behind the door is exposed. With the charging terminal exposed, a user can connect their portable electronic device to the charging terminal for charging.

In an implementation, door 147g is configured to close if a connector (shown in FIG. 4C) is not inserted in the charging terminal 165. When the door is closed, this helps protect the charging terminal from damage such as from the elements (e.g., dust, wind, and water) and accidental spills and splashes from a nearby pool. In some implementations, the battery housing includes one or more seals, such as rubber seals, that the door is configured to contact to further seal out moisture, dust, dirt, sand, wind, and other debris. The seals can be positioned on an inside surface of the battery housing where the seals are positioned adjacent to the sides and edges of the door. In an alternative implementation, the seal is attached to the door, such as at the sides and edges of the door. Seals can be attached to both the battery housing and the door.

Door 147g may be hinge connected to battery housing 147, may be slide-connected to battery housing 147, or otherwise connected to the battery housing. In an implementation, door 147g is a sliding door and includes a first continuous portion 147h that covers the charging terminal if the door is closed, and has an aperture 147i1 formed therein that exposes the charging terminal if the door is slid open. Door 147g may include a second continuous portion 147j that is exposed if the door is opened and is positioned inside battery housing 147 if the door is closed. Second continuous portion 147j of door 147g is configured to inhibit dust and moisture from entering battery housing 147 if the door is opened. First and second continuous portions 147h and 147j of door 147g are positioned on opposite sides of aperture 147i1.

Aperture 147i1 may have a shape (e.g., square, rectangular, trapezoid, or the like) that substantially matches the shape (e.g., square, rectangular, trapezoid, or other shape) of the charging terminal behind the door and substantially matches the shape (e.g., square, rectangular, trapezoid, or other shape) of the connector that is configured to attach to the charging terminal. With the shapes matched and with the connector inserted through the aperture into the charging terminal, the connector may press against the door to inhibit dust and moisture from passing through the aperture and reaching the charging terminal. Thereby, the charging terminal may be kept from being fouled from debris (e.g., sand) in the environment (e.g., beach) where umbrella 100 is used.

Door 147g (see FIG. 4C) may have a second aperture 147i2 formed therein that exposes an indicator light (e.g., an LED) that is positioned behind the door. If door 147g is closed, the indicator light may be hidden from view by the door (see FIG. 4B). The indicator light may be mounted a printed circuit board and connected to the circuitry located in the battery housing. The circuit controls the indicator light to indicate whether a connected portable electronic device is charging or charged. For example, circuit may control the indicator light to light orange or yellow if the connected portable electronic device is charging and light green if the portable electronic device is charged.

In some implementations, apertures that expose the indicator lights for indicating whether connected portable electronic devices are charging or charged are formed in the battery housing adjacent to the charging terminals as compared with the apertures being formed in doors 147g. These apertures might be formed in a battery housing that does not include doors that cover the charging terminals or might be adjacent to the doors.

Figure 4D:
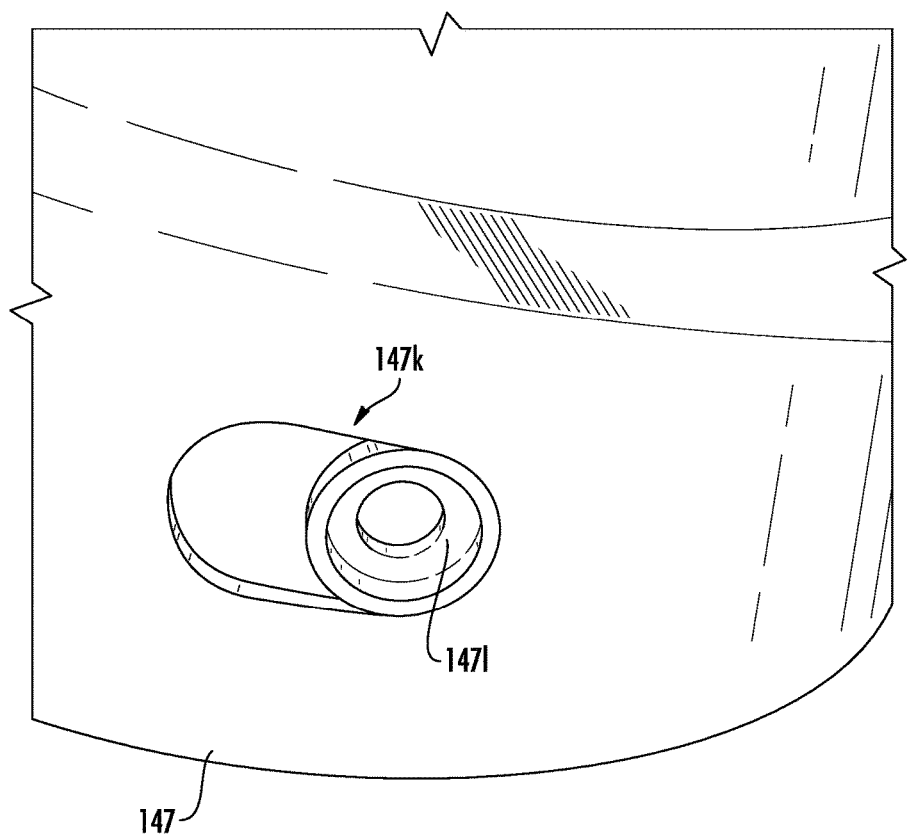
FIGS. 4D-4E show simplified perspective views of the central portion of the umbrella in an alternative implementation where the battery housing includes at least one door positioned in front of one of charging terminals where the charging terminal has a round shape.
Figure 4E:
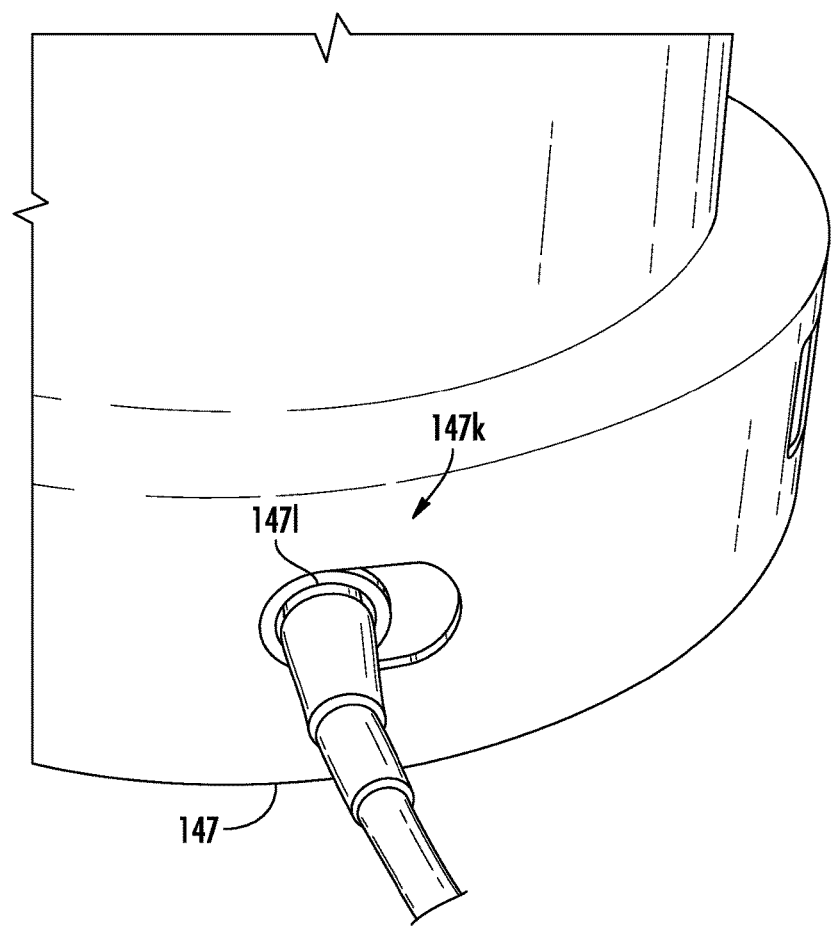

FIGS. 4D and 4E are simplified perspective views of the central portion of umbrella 100 in an alternative implementation where battery housing 147 includes at least one door 147k positioned in front of one of charging terminals 165 where the charging terminal has a round shape or in front of input port 166 where the input port has a round shape. Door 147k is substantially similar to door 147g and is configured to be opened by a user so that a connector may be inserted into the charging terminal or input port that is behind the door. Door 147k is shown as open in FIG. 4E, and is shown as closed FIG. 4D. Door 147k may be configured to be closed if the connector is not inserted in the charging terminal or the input port.

Door 147k may have an aperture 147l formed therein where the aperture has a shape (e.g., round, ovoid, oblong, or the like) that substantially matches the shape (e.g., round, ovoid, oblong, or the like) of the charging terminal or the input port behind the door and substantially matches the shape (e.g., round, ovoid, oblong, or the like) of the connector that is configured to attach to the charging terminal or the input port. Door 147k may be hinge connected to battery housing 147, may be slide connected to the battery housing, or otherwise connected to the battery housing.

Figure 4F:
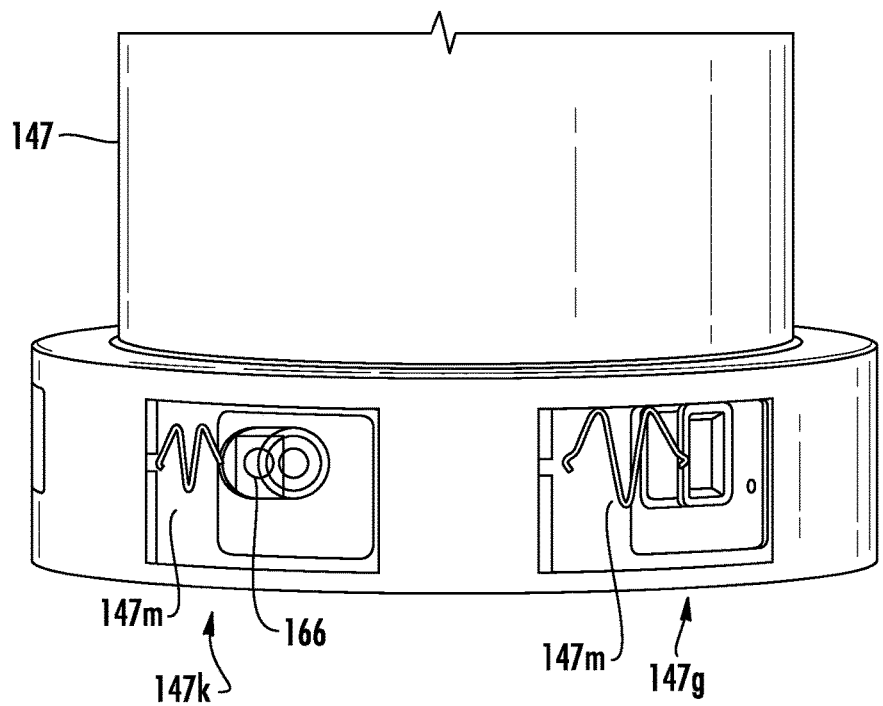
FIG. 4F shows a simplified schematic of the battery housing and the doors that cover the charging terminals.

FIG. 4F is a simplified schematic of battery housing 147, door 147g, and door 147k. As shown in figured 4F, battery housing 147 may include one or more spring devices 147m or the like that are configured to provide a force on the doors for closing the doors after a connector is removed. In an implementation, each of spring devices 147m is substantially planar in one dimension (along the planes of their respective doors) and have curved shapes along the lengths of the spring devices where the curved shapes provides at least a portion of the spring force for pushing the doors closed. It will be understood that while spring devices 147m are shown in FIG. 4F, the spring devices are positioned inside battery housing 147 where they are not visible from outside of the battery housing. In alternative implementations, springs 147m have other shapes, such as coil shapes. In other alternative implementations, the spring devices are pneumatic devices that close the doors at a relatively slow and aesthetically pleasing rate of closure.

The springs cause their respective doors to substantially automatically close when a connector is removed. Thereby, the springs and the doors of the battery housing 147 provide for automated protection for various components (electronic components, batteries, and the like described below) positioned within the battery housing from exposure to environmental elements (e.g., extreme sunlight, heat, rain, humidity, and wind) that can damage and reduce the life of these components. Battery housing not only protects the components positioned in the battery housing, but also protects users from contacting these internal components (e.g., protects users from touching electrical wires, circuitry, and the battery).

Battery housing 147 provides the additional advantage of providing an aesthetically pleasing appearance by removing from sight these various components. The battery housing may include a number of cylindrical sections 147c, 147d, 147e, where the cylindrical sections have increasing diameters downward along the battery housing. Middle section 165c might be configured to house a battery. Bottom section 165d might be configured to house various electronic components and house charging terminals 165.

The top cylindrical section 147c can have a diameter of about 3 inches to about 5 inches (e.g., 3 inches, 3.25 inches, 3.5 inches, 3.75 inches, 4 inches, 4.25 inches, 4.5 inches, 4.75 inches, or 5 inches). The top cylindrical section 147c can have a height of about 0.25 inches to about 1 inch (e.g., 0.25 inches, 0.5 inches, 0.75 inches, or 1 inch).

The middle cylindrical section 147d can have a diameter of about 4 inches to about 6 inches (e.g., 4 inches, 4.25 inches, 4.5 inches, 4.75 inches, 5 inches, 5.25 inches, 5.5 inches, 5.75 inches, or 6 inches). The middle cylindrical section 147d can have a height of about 4 inches to about 6 inches (e.g., 4 inches, 4.25 inches, 4.5 inches, 4.75 inches, 5 inches, 5.25 inches, 5.5 inches, 5.75 inches, or 6 inches).

The bottom cylindrical section 147e can have a diameter of about 5 inches to about 7 inches (e.g., 5 inches, 5.25 inches, 5.5 inches, 5.75 inches, 6 inches, 6.25 inches, 6.5 inches, 6.75 inches, or 7 inches). The battery housing can have a height of about 1 inch to about 2.5 inches (e.g., 1 inch, 1.25 inches, 1.5 inches, 1.75 inches, 2 inches, 2.25 inches, or 2.5 inches. The battery housing can have a height of about 5 inches to about 9 inches (e.g., 5 inches, 5.25 inches, 5.5 inches, 5.75 inches, 6 inches, 6.25 inches, 6.5 inches, 6.75 inches, 7 inches, 7.25 inches, 7.5 inches, 7.75 inches, 8 inches, 8.25 inches, 8.5 inches, 8.75 inches, or 9 inches).

Battery housing 147 may have a top 147f that seals the battery housing from debris, moister, and the like. Top 147f of battery housing 147 may be integrally formed with the cylindrical sections of the battery housing.

The battery housing is also aesthetically pleasing because the battery housing is centered on the battery pole due to the shaft of the battery housing passing through the center of the battery housing and thereby providing for the umbrella pole to be centered in the battery housing. This circularly symmetric configuration of the battery housing and the umbrella pole is a highly compact design the does not take up excessive space around the umbrella pole.

Figure 4G:
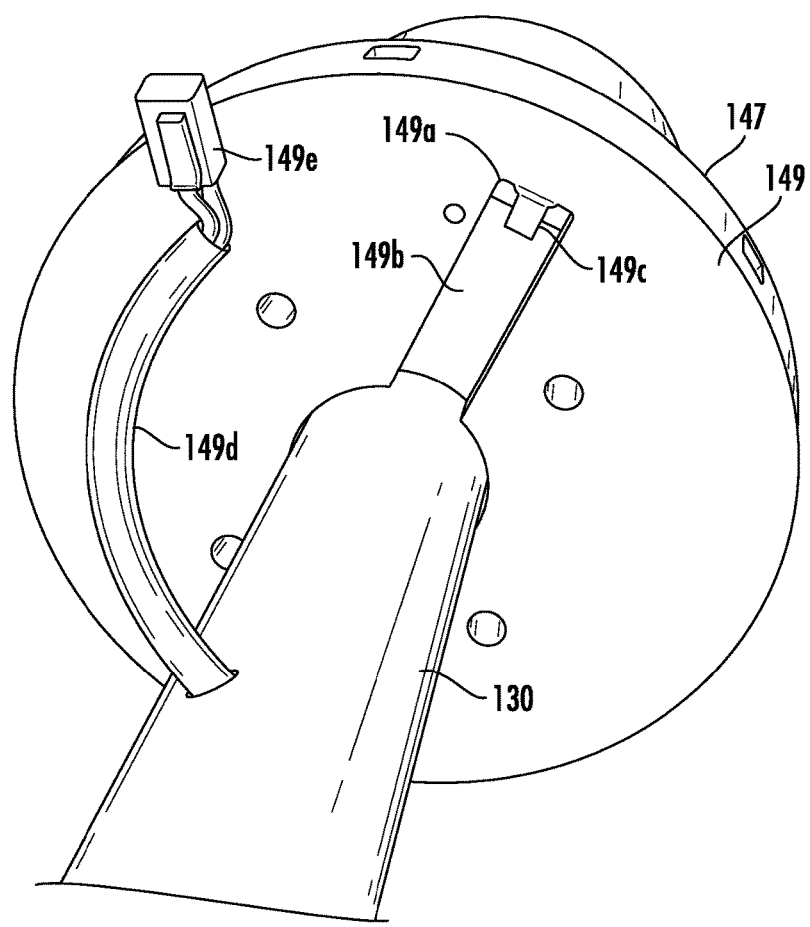
FIG. 4G shows a bottom view of the battery housing and shows a removable bottom that provides access to the interior of the battery housing.

FIG. 4G is a bottom view of battery housing 147 in an implementation where the battery housing includes a bottom 149 (e.g., a removable bottom) that provides access to the interior of the battery housing. Bottom 149 may have an aperture 149a and a recess 149b formed therein that allows access to a connector 149c. Specifically, aperture 149a provides for passage of connector 149c from the interior of the battery housing to the exterior of the battery housing for connection to a wire 149d that runs down the interior of umbrella pole 130 and carries current generated by solar panels 135 to the circuit and the battery located in battery housing 147. Umbrella pole 130 may have an aperture formed therein through which wire 149d passes from the interior of the umbrella pole to the exterior of the umbrella pole.

Wire 149d has a connector 149e (e.g., female connector) that is configured to connect to connector 149c (e.g., male connector). Connectors 149c and 149d are slip-friction connectors (e.g., not a solder connection) that can be slipped together by a user with relatively low force, and can be detached by a user with relatively low force. Connectors 149c and 149d provide that wire 149d can be relatively easily connected and disconnected from battery housing 147 to that the battery housing can be relatively easily attached and unattached from the umbrella pole. With the battery housing relatively easily removed from the umbrella pole, the bottom of the battery housing can be removed by the owner, the seller, or a qualified service technician so that the battery can be replaced as needed. For example, the seller can provide a mail service where battery housings can be sent to the seller or the seller qualified technicians for serving battery housing and sending the battery housings back to the owners after servicing. Providing a mail in service for serving battery housings inhibits umbrella owners from disposing of used batteries in landfill sites. In other implementation, wire 149d can be soldered to the battery housing to inhibit owners from disassembling the battery housing so that the owners use a seller or qualified service technician for servicing the battery housing.

Recess 149b provides that the portion of wire 149d that extends from the umbrella pole and connector 149e can sit flush within bottom 149. The flush fit of the wire and its connector inside the recess provides for the bottom the battery housing to sit flush on shelf 160 or other table on which the battery housing is placed. The flush placement of the battery housing on the shelf or other table provides for an aesthetic appearance of the battery housing on the shelf or table.

Connector 149c may be configured to relatively easily connect to, and disconnect from, connector 149e of wire 149d. This relatively easy connection and disconnection from wire 149d allows battery housing 147 to be relatively easily removed from umbrella pole 130 (e.g., slid up along the umbrella pole to an end of the umbrella pole) and connected to the umbrella pole (e.g., slid down from the end of the umbrella pole into a position above shelf 160). Providing for the battery housing and the umbrella pole of the umbrella to be modular further provides for relatively easy to service of the battery housing, such as removing the battery housing for changing the battery, updating firmware of circuits in the battery housing, changing out the circuits in the battery housing, or other service.

The relatively easy connection and disconnection of wire 149d also provides that the wire may be untwisted (e.g., by hand from the portion of the wire extending from the hole in the umbrella pole) if the wire becomes twisted during use or assembly of the umbrella. The wire might become twisted, for example, if a top portion of the umbrella (e.g., the frame, the shade, and top portion of the umbrella pole for a two piece umbrella pole that separates at a central portion of the umbrella pole) rotates with respect to a bottom portion (e.g., lower portion of the umbrella pole and the battery housing) of the umbrella. Providing for the wire to untwist inhibits the wire from applying excessive forces on the connectors, on the battery housing, on the solar panels, and on one or more printed circuit boards in the battery housing to thereby inhibits damage to these devices.

In some implementations, wire 149d is a two piece wire having (i) an upper portion that connects to the solar panels and passes through a top portion of the umbrella pole and (ii) a lower portion that passes through the bottom portion of the umbrella pole to the battery housing. The two portions of wire 149d can be attached by electrical connectors where the top and bottom portions of the umbrella pole are connected. A two piece wire provides for relatively easy untwisting of the wire by detaching the top and bottom portions of the umbrella pole to allow the wire to untwist. In some implementations, the two portions of the wire are physically attached to interior or exterior portions of the umbrella pole to inhibit the wire from becoming twisted. In other implementations, the wire is allowed to twist and may have a length that allows the wire to shorten when twisted so that the twisted wire does not apply excessive damaging forces to the wire's connectors, the solar panels, the battery housing, and the printed circuit board.

Figure 4H:
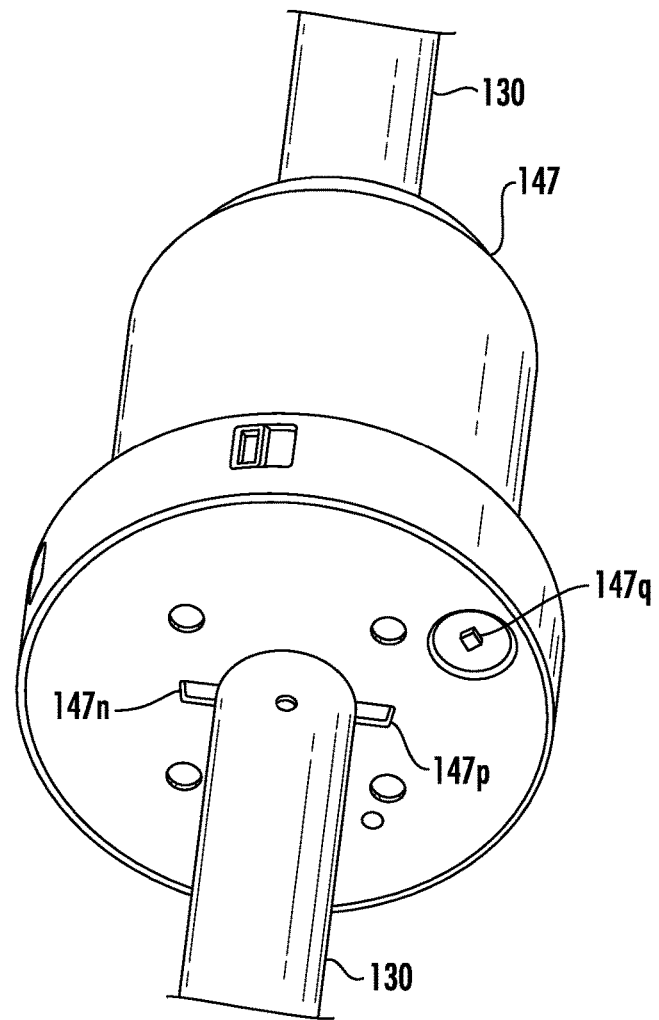
FIG. 4H shows a bottom view of the battery housing attached to the umbrella pole in an implementation where the battery housing includes one or more elements that inhibit the battery housing from rotating with respect to the umbrella pole.
Figure 41:
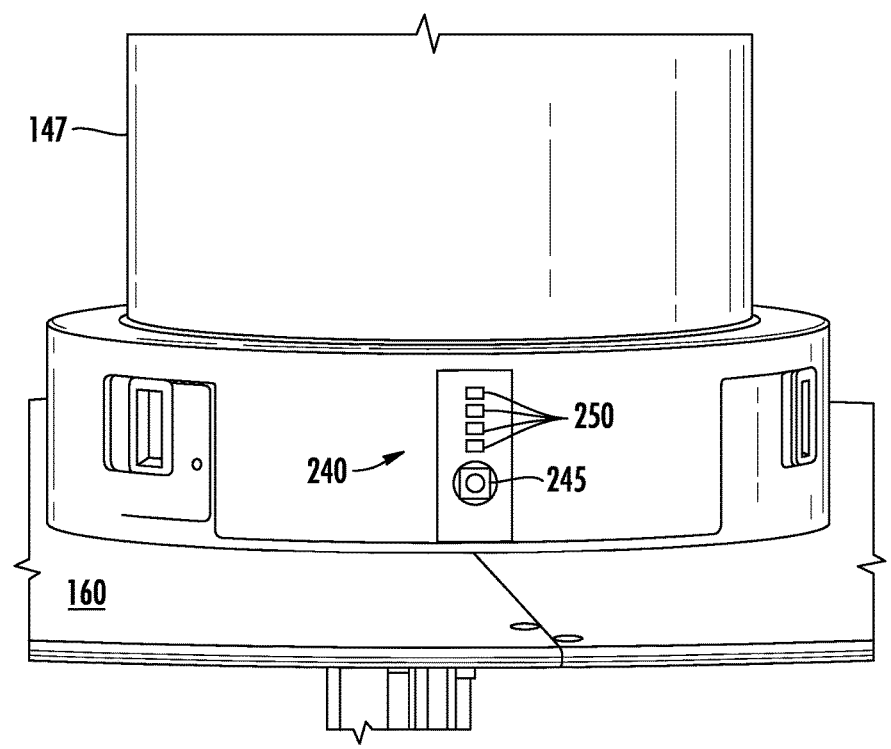

FIG. 4H shows bottom 149 of battery housing 147 attached to umbrella pole 130 in an implementation of the umbrella. Bottom 149 includes a first trench structure 147n formed in the bottom that inhibits the battery housing from rotating about the umbrella pole. Specifically, the trench may rest on a pin 147p or similar device that passes through the umbrella pole or is otherwise attached to the umbrella pole where the pin does not rotate about the umbrella pole thereby inhibiting the battery housing from rotating with respect to the umbrella pole. In other implementations the battery housing can be clipped to the umbrella pole, screwed to the umbrella pole, or otherwise attached to the umbrella pole to inhibit the battery housing from rotating with respect to the umbrella pole. In some implementations, the battery housing includes one or more mechanical surface features that surround the battery that also inhibit the battery from rotating inside the battery housing. The battery housing can also include padding positioned between the inside walls of the battery housing and the battery that inhibit the battery from rotating inside the battery housing. Inhibiting the battery housing and the battery from rotating inhibits the electrical connectors connected to the printed circuit board, the battery housing, and the battery from being mechanically stressed from rotations and from breaking.

Figure 5A:
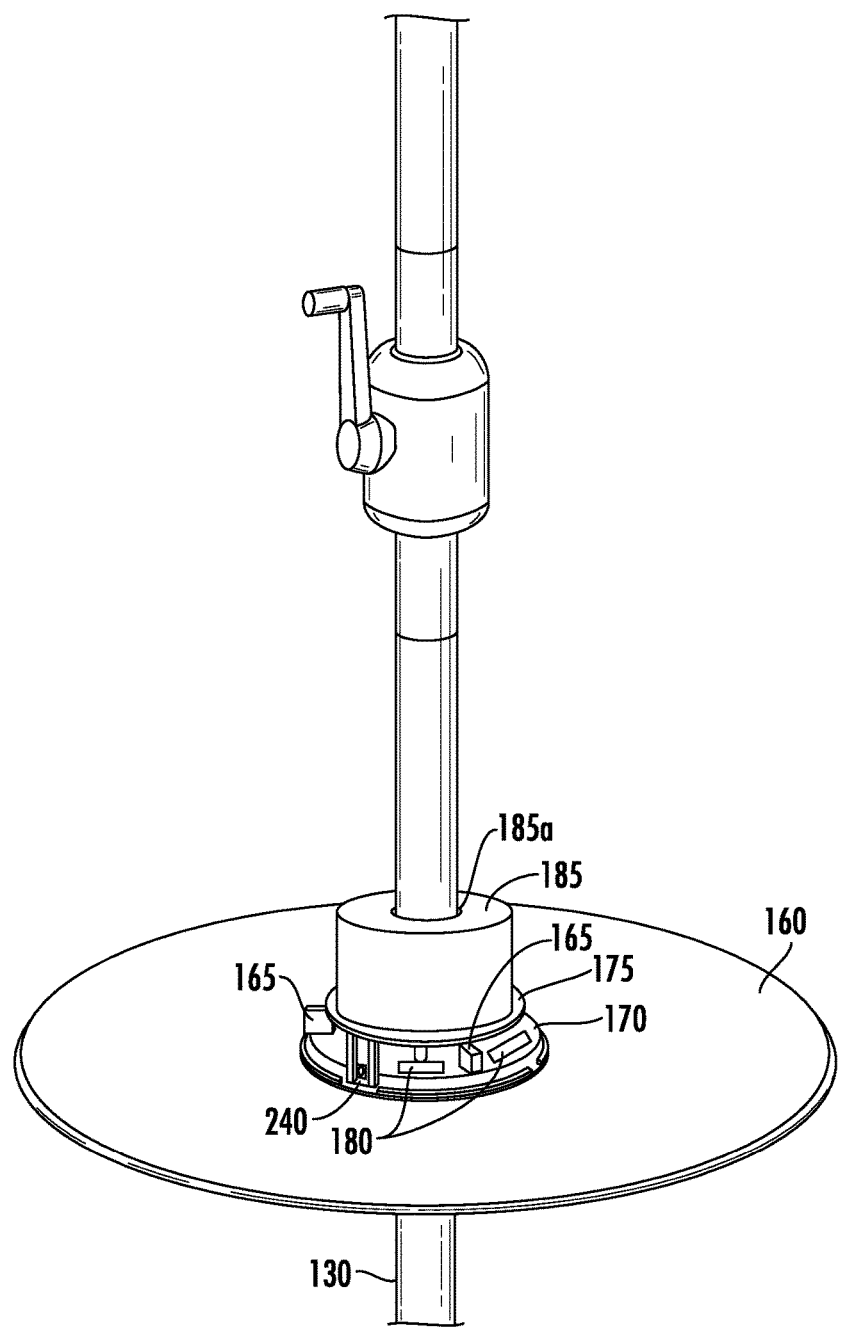
FIG. 5A shows a simplified perspective view of the central portion of the umbrella with a battery housing for the printed circuit board and battery removed.

FIG. 5A is a simplified perspective view of the central portion of umbrella 100 with battery housing 147 removed. Battery housing 147 houses a printed circuit board 170 (PCB) and a battery riser or a battery shelf 175 on which a battery 185 (e.g., a rechargeable battery) is positioned. PCB 170 includes a circuit 180 (briefly mentioned above and described in further detail below). Circuit 180 is configured to receive electrical energy (voltage and current) generated by solar panels 135 and provide the electric energy to battery 185 for charging the battery. Circuit 180 may include various electronic components (described below) that transform or condition (or both) the current, the voltage, or both, which are received from solar panels 135. After the current, the voltage, or both are transformed or conditioned, this electrical energy is supplied to battery 185 (e.g., a rechargeable battery) for charging the battery. Transforming and conditioning the voltage can include reducing or increasing the voltage and current and can include clamping the current available for charging the battery. Conditioning the voltage or current can include smoothing the voltage or current.

In an implementation, battery 185 is separated from circuit 180 via the battery shelf (or riser, spacer, or standoff assembly) on which the battery is configured to sit. One or more electrical traces or wires may connect battery 185 to circuit 180. Battery shelf 175 may include one or more apertures formed therein for routing the traces or wires from the circuit to the battery. Stacking the battery and circuit using the battery shelf allows for the battery housing to be relatively compact around the umbrella pole and allows for a compact aesthetic design of the battery housing.

Battery 185 may be cylindrical, round, rod shaped, or the like. As shown in FIG. 5A, battery 185 may be cylindrically shaped and have a shaft 185a located in a central portion of the battery where the shaft is configured to receive umbrella pole 130. The cylindrical shape of battery 185 allows the battery to occupy a substantially optimal amount of space in battery housing 147 and accordingly allows the battery to provide relatively high charge storage. For example, battery 185 may be configured to store about 20,000 milliamp-hours or more of charge. In a specific implementation, battery 185 is a 22,000 milliamp-hour battery. Other battery sizes are possible, such as 5200 milliamp hours, 8600 milliamp hours, 10,000 milliamp hours, 15,000 milliamp hours, 25,000 milliamp hours, 30,000 milliamp hours, 50,000 milliamp hours, or 100,000 milliamp hours, or other values, or values smaller or less than these values. Battery 185 may use a variety of battery chemistries, such as lithium ion, nickel cadmium, nickel metal hydride, or the like.

In some implementation, battery 185 includes a plurality of battery cells. A number of sets of two battery cells may be arranged in series electrically, and these sets may then be arranged in parallel electrically. Each battery cell may output 3.7 volts for example, and a set of two battery cells in series electrically may output 7.4 volts. In parallel electrically, a number of these sets of two battery cells in series electrically, can provide 7.4 volts at relatively high current, such as for charging three tablet computers (e.g., Apple iPads (™)) simultaneously. The battery calls that form battery 185 may be arranged in a substantially cylindrical arrangement to form shaft 185a in the center of the battery cells. In an implementation, two battery cells are vertically stacked, and numerous ones of these two battery cells stacks are adjacently arranged to form a cylinder. The diameter of battery 185 may be about 5 centimeters to about 10 centimeters (e.g., 5.0 centimeters, 5.5 centimeters, 6.0 centimeters, 6.5 centimeters, 7.0 centimeters, 7.5 centimeters, 8.0 centimeters, 8.5 centimeters, 9.0 centimeters, 9.5 centimeters, 10.0 centimeters, or other diameter). The length of battery 185 may be about 10 centimeters to about 16 centimeters (e.g., 10.0 centimeters, 10.5 centimeters, 11.0 centimeters, 11.5 centimeters, 12.0 centimeters, 12.5 centimeters, 13.0 centimeters, 13.5 centimeters, 14.0 centimeters, 14.5 centimeters, 15.0 centimeters, 15.5 centimeters, 16.0 centimeters, or other length). The battery housing, in an implementation, includes a set of pads that holds the battery substantially securely in the battery housing so that the battery cannot rotate or translate within the battery housing, for example, when the umbrella is moved or rotated. The padding provides that the battery cannot twist any wires that connect the battery to the circuit, and therefore, the wires will be inhibited from twisting and breaking when the umbrella is moved.

Figure 5B:
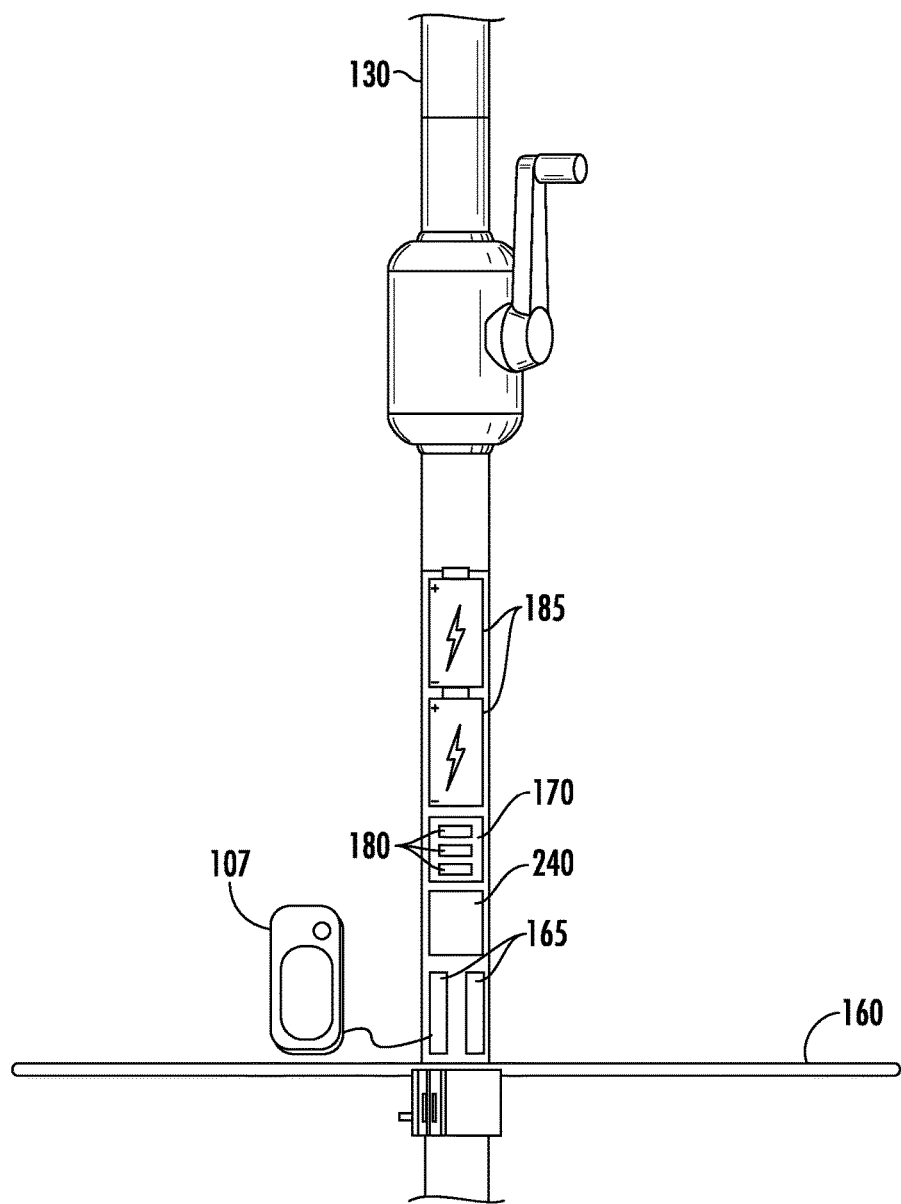
FIG. 5B shows a simplified schematic of an implementation of the umbrella where the battery, the circuit, and one or more charging terminals are positioned within the umbrella pole of the umbrella.

In one alternative implementation, one or more batteries 185 may be alternatively positioned in or on umbrella 100. For example, one or more batteries 185 may be positioned in umbrella pole 130, which may be hallow or have a compartment configured for storing the batteries. FIG. 5B is a simplified schematic of a central portion of umbrella 100 and umbrella pole 130 where one or more batteries 185 are positioned in the umbrella pole. In addition to one or more batteries 185 being positioned in umbrella pole 130, PCB 170, circuit 180, one or more charging terminals 165, and other circuit elements descried below may be positioned in the battery pole. Battery pole 130 may have a number of apertures formed therein where charging terminals 165 may be positioned for connecting to one or more portable electronic device 107 for being powered or charging. In some implementations where additional electrical power may be used, one or more batteries may be positioned in battery housing 145, in umbrella pole 130, or at other locations on the umbrella.

Figure 7:
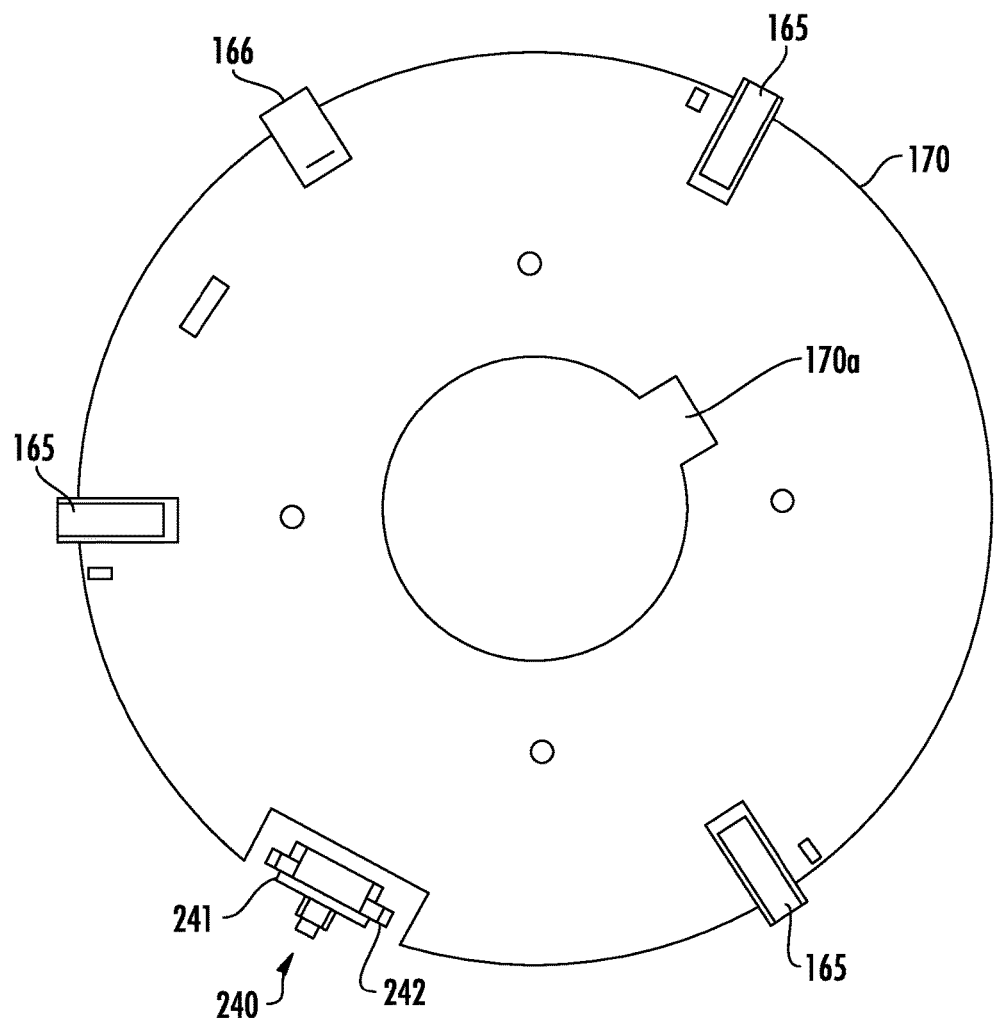
FIG. 7 shows a top view of the printed circuit board.

FIG. 6 provides a further enlarged view of shelf 160, PCB 170, and battery shelf 175, and FIG. 7 provides a simplified top view of PCB 170. Central apertures are formed in shelf 160, PCB 170, and battery shelf 175 and are respectively labeled with reference numbers 160*a*, 170*a*, and 175*a*. Each central aperture 160*a*, 170*a*, and 175*a* is configured to receive umbrella pole 130 so that shelf 160, circuit board 170, and battery shelf 175 may each be substantially centered on the umbrella pole providing a relatively compact, symmetric, and aesthetic design. Each of the central apertures 160*a*, 170*a*, and 175*a* may have diameters of about 1.75 inches to about 3.25 inches (e.g., 2 inches) for receiving umbrella pole 130, which may have a diameter of about 1.5 inches to about 3.5 inches (e.g., 1.5 inches, 2.0 inches, 2.5 inches, 3.0 inches, or 3.5 inches.). It is noted that while each of battery housing 147, shelf 160, circuit board 170, and battery shelf 175 are shown in FIGS. 5-7 as being generally round from a top view, one or more of the battery housing, the shelf, the circuit board, and the battery shelf may have alternative shapes such as square, rectangular, pentagonal, hexagonal, or the like.

In an implementation, the shapes of the PCB and the battery shelf substantially match a cross-section shape of the battery housing to provide substantially optimal space on the PCB for circuit and substantially optimal space for the battery. For example, when the battery housing has a cross-section shape that is round or circular, then the PCB and the battery shelf have corresponding round or circular shape.

Moreover, while battery housing 147, shelf 160, circuit board 170, and battery shelf 175 are described and shown as including central apertures for receiving umbrella pole 130 therethrough, in alternative implementations one or more of the battery housing, the shelf, the circuit board, and the battery shelf may not have the central apertures formed therein and might be configured to mount on a side of umbrella pole 130 or mount to portions of the umbrella frame structure.

In a specific implementation, battery shelf 175 has a smaller diameter than PCB 170. For example, battery shelf 175 may have a diameter of about 5 inches to about 6 inches (e.g., 5.75 inches) and PCB 170 may have a diameter of about 6 inches to about 6.5 inches (e.g., 6.25 inches). Battery shelf 175 may be mounted on the PCB via a number of posts 172 (see FIG. 6) or the like, which positions the battery shelf above the PCB with an air gap between the battery shelf and the PCB. Screws or other fasteners can be used to connect the PCB to the posts of the battery shelf. In an implementation, screws that pass through the bottom of the battery housing also pass through the PCB and screw into the battery shelf to connect the PCB to the battery shelf. With the central aperture formed in PCB 170, PCB may have an area of about 640 square centimeters to about 670 square centimeters (e.g., 640 square centimeters, 645 square centimeters, 650 square centimeters, 655 square centimeters, 660 square centimeters, 665 square centimeters, 670 square centimeters, or other area).

Shelf 160 may be mechanically attached to umbrella pole 130 via a bracket 162 (see FIG. 4A) or the like that clamps to the umbrella pole and attaches to the shelf. In some implementations, shelf 160 is detachable from umbrella pole 130, or the height of shelf 160 may be adjusted upward or downward via bracket 162. For example, the height of shelf 160 may be adjusted to the height of the top of an outdoor table that umbrella 100 is being used with. Battery housing 170 or PCB 170 may be attached to shelf 160 via a one or more fasteners, clamps, or the like.

While shelf 160 is shown as being relatively continuous, the shelf may have a number of apertures formed therein (e.g., having a grate pattern) where the apertures allow air to circulate under a portable electronic device that is sitting on the shelf and charging. The circulating air allows the portable electronic device to dissipate heat into the circulating air while the portable electronic charges. The apertures also allow debris, such as sand, to pass through the shelf and not accumulate, which inhibits the debris from accumulating on portable electronic devices on the shelf. In some implementation, shelf 160 is a metal shelf and is coated with plastic, rubber, is painted, or the like. In other implementations, shelf 160 is a plastic type material, a resin-coated fiber material (e.g., fiberglass type material), or the like.

Figure 8A:
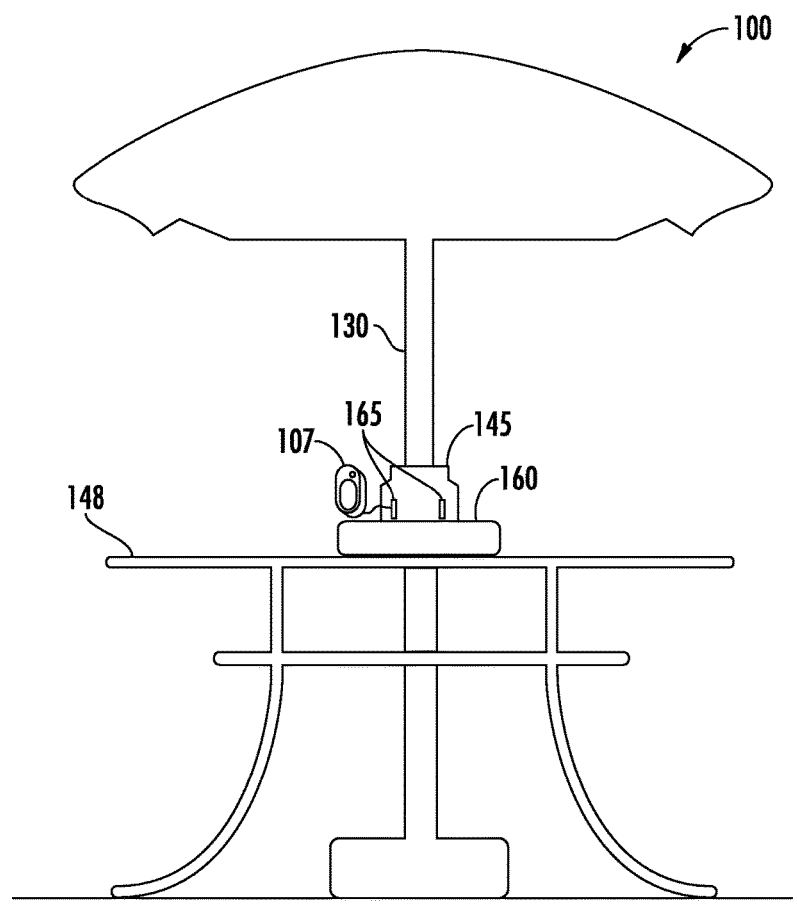
FIG. 8A shows a simplified image of an umbrella in an implementation inserted into an outdoor table.

With battery housing 147, shelf 160, charging terminals 165, PCB 170, battery shelf 175, battery 185, and the like positioned at a central portion of umbrella pole 130, this positioning provides a convenient height for use by a user for charging and power devices while a user sits or stands near umbrella 100. For example, FIG. 8A shows an implementation of umbrella 100 where the height of battery housing 147, shelf 160, charging terminals 165, PCB 170, battery shelf 175, battery 185 are positioned along umbrella pole 130 at about the height of a table top of an outdoor table 148 (e.g., a patio table, a picnic table, or the like).

Not only does the central location along battery pole 130 provide for convenient use for powering and charging device, the central location also provide for easy maintenance of these elements by maintenance technicians or the like. In some implementations, such as where battery housing 147 is positioned substantially at the height of outdoor table 148, umbrella 100 might not include shelf 160. In an implementation where umbrella 100 does not include shelf 160, portable electronic devices 107 may be placed on the tabletop of outdoor table 148. In other implementations, battery housing 147, umbrella pole 130, or both include one or more holders into which a portable electronic device 107 may be placed and held during charging by umbrella 100. Each holder may be configured to hold a portable electronic device 107 loosely so that the portable electronic device may be relatively easily placed into the holder and relatively easily removed from the holder. In some implementations, the holders include nets, such as netted bags, that are configured to hold portable electronic devices 107 during charging. In an implementation, umbrella 100 includes one holder that is an extended net bag that partially encircles or fully encircles battery housing 147, umbrella pole 130, or both.

In other implementations, the holder is an extended basket type device that has sides and a bottom and opens upward. The holder may hold a number of portable electronic devices 107 relatively loosely for charging. The holder's sides, bottom, or both may be perforated so that portable electronic devices in the holder may be seen through the sides and the bottom and so that debris (e.g., sand, dust, or the like) may fall through the perforations and not accumulate in the holder. The holder may fully or partially encircle battery housing 147 or umbrella pole 130 and may be attached thereto. In the implementations where battery housing 147, umbrella pole 130, or both include one or more holders, such as those described above, for holding portable electronic devices 107, the umbrella might not include shelf 160.

Figure 8B:
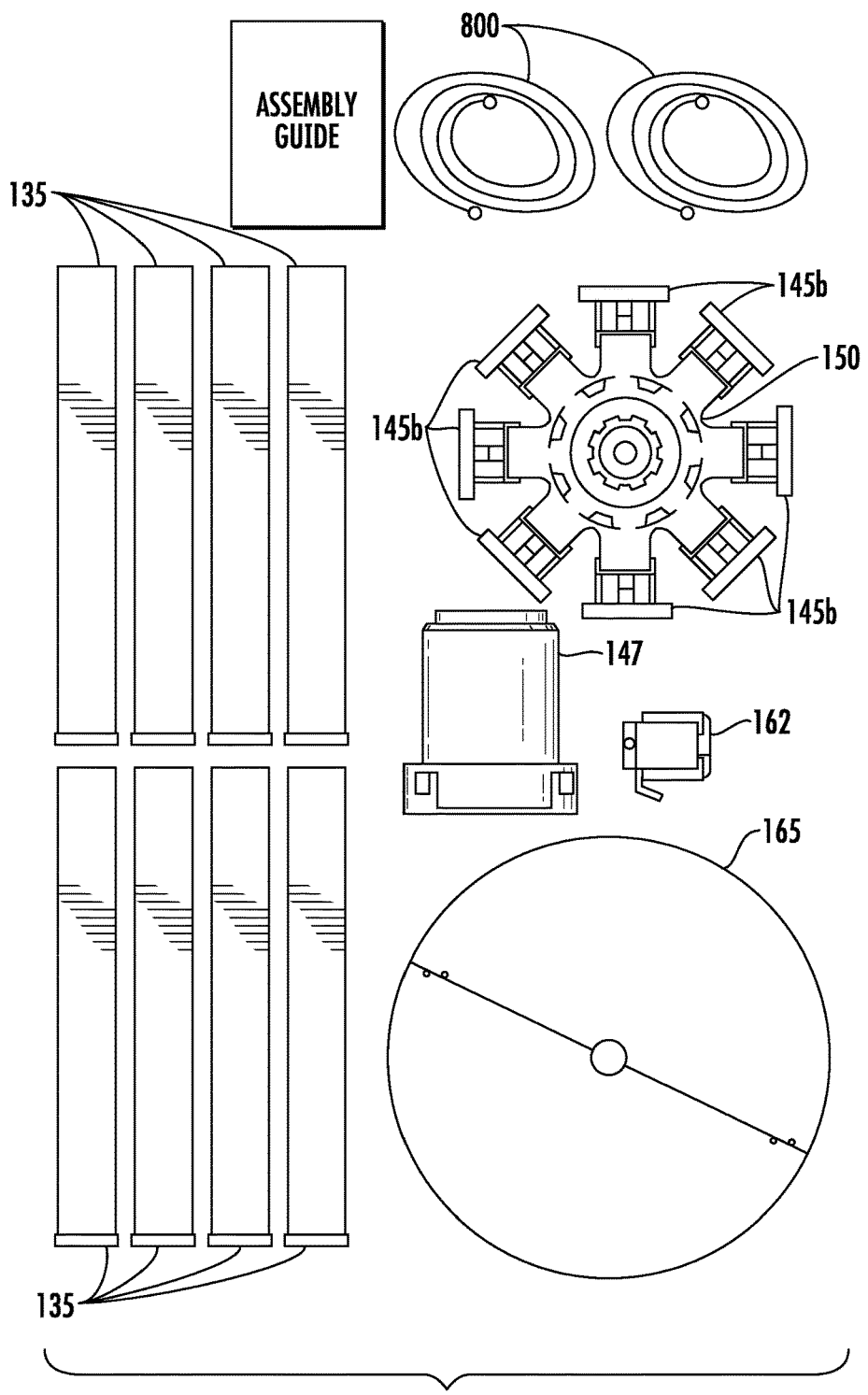
FIG. 8B shows a kit for converting a standard umbrella into a solar umbrella with charging station.

Retrofit Kit. FIG. 8B shows the components of a conversion or retrofit kit for retrofitting an existing outdoor umbrella to operate substantially as solar charging umbrella 100. The retrofit kit may include one or more solar panels 135, cap 150, a number the hinge end portions 145*b* of housings 145 of the solar panels, a battery housing 147, a set of wires 800, and an assembly guide for assembling the kit. Optionally, a shelf 165 and a bracket 162 can also be included in the kit. The retrofit kit may be supplied with the hinge end portions 145*b* of housing 145 attached to housing 145 or to cap 150 as shown in FIG. 8B.

While the retrofit kit shown in FIG. 8B includes eight solar panels 135, the retrofit kit may include more or fewer solar panels, or solar panels of other configurations, such as solar panel 135'. The retrofit kit may include two wires 800 where a first wire may be configured to connect to an electrical connector in the cap, and drop down to an end of a top section of an umbrella pole 130, and a second wire may be configured to connect to the first wire and to battery housing 147. The wires are configured to deliver electricity generated by solar panels 135 to battery housing 147 for charging rechargeable battery 185 (included in the battery housing in the retrofit kit along with circuit 180). While the retrofit kit is shown as including two wires, the retrofit kit may include more or fewer wires.

The elements of the retrofit kit may be relatively easily attached to an existing outdoor umbrella. For example, a shade retainer 155 (e.g., a finial) of an existing umbrella may be removed (e.g., unscrewed) from the existing outdoor umbrella and cap 150 may be placed on the existing outdoor umbrella and the shade retainer may be secured to the existing outdoor umbrella thereby securing the cap to the existing outdoor umbrella. Solar panels 135 may thereafter be snapped onto the copy by snapping the hinge end portions 145*b* of housings 145 to the arms of the cap. In some retrofit kits the solar panels are provided with the solar panels attached to the cap.

A first one of wires 800 in the kit may be attached to an electrical connector of cap 150 to which the solar panels attach. This wire and the electrical connector of the cap can include connectors that are relatively easy to attach and detach. After the wire is electrically connected to the solar panels, for example, via an electrical connector of the cap or other electrical connector that connects to the solar panels, the wire may be run through a top section of the umbrella pole of the existing outdoor umbrella. A second one of wires 800 may be run through a bottom section of the umbrella pole. These two wires may be attached via connectors where the top section and the bottom section of the umbrella pole meet for being attached.

Thereafter, shelf 165, bracket 162, and battery housing 147 may be slid onto to the bottom section of the umbrella pole. Bracket 162 may be also secured to the bottom section of the umbrella pole and shelf 160 may be attached to the bracket. Battery housing 147 may be lowered onto shelf 160 and attached to the second wire. For some existing outdoor umbrellas, a hole may need to be drilled or otherwise created in the bottom section of the umbrella pole for feeding the second wire out of the bottom section and coupling it to battery housing 147. The battery housing and wire may include connectors that are configured to easily coupling the wire to the battery housing. Thereafter, the existing outdoor umbrella may be opened and operated for charging portable electronic devices 107.

The retrofit kit may include a variety of optional devices, such as a variety of shaft adapters that are configured to be fitted into the shaft of the battery housing 147 for accommodating umbrella poles having a variety of diameters. Further, a wiring harness for cap 150 may be provided as an element that needs to be attached to the cap and solar panels 135. Further, battery housing 147 may be provided assembled with circuit 180 and a rechargeable battery, or may be provided such that the battery housing requires assembly.

Figure 9A:
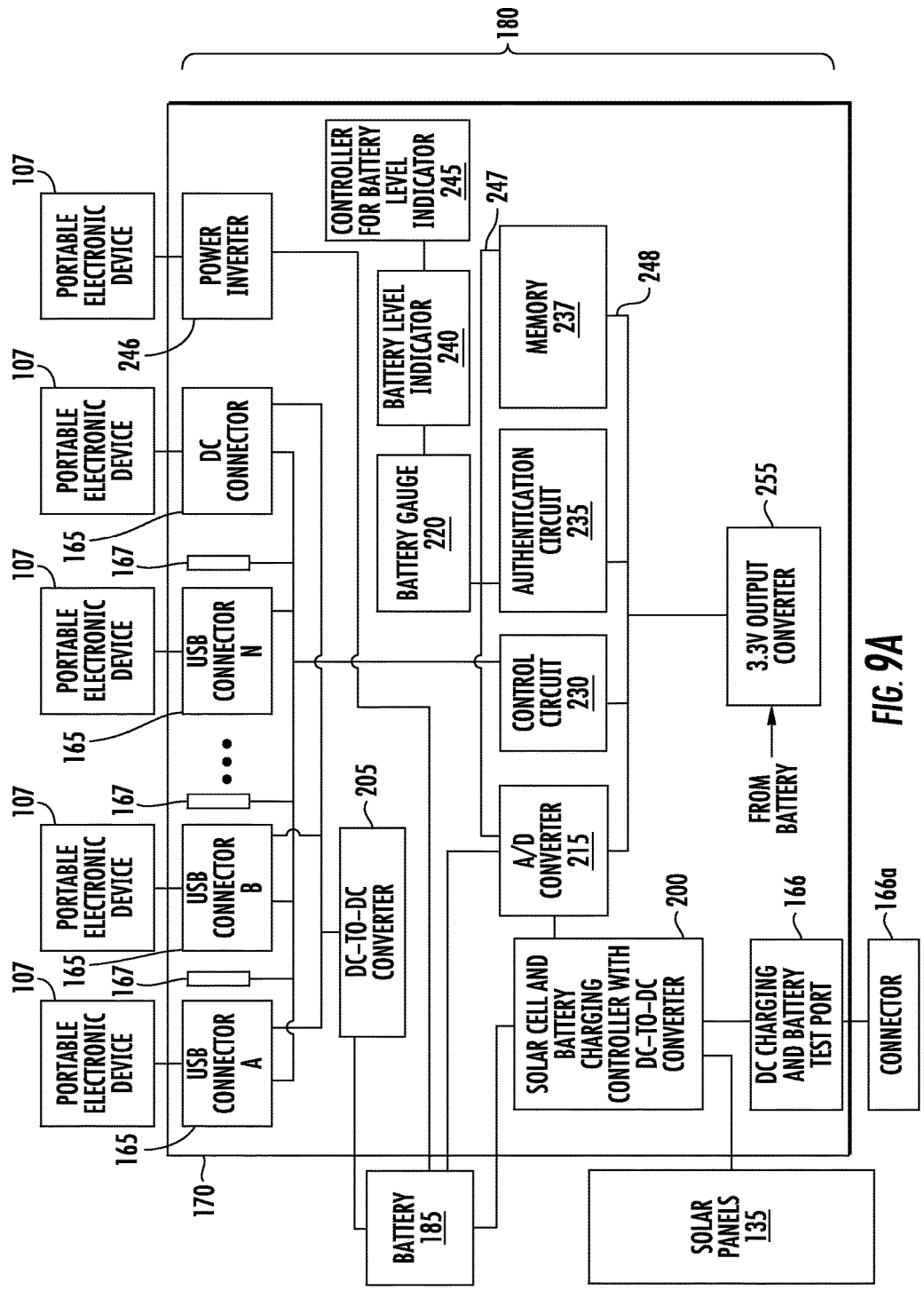
FIG. 9A shows a simplified block diagram of a circuit of the umbrella that may be mounted at least in part on the printed circuit board.

Charging Circuit. FIG. 9A is a simplified block diagram of circuit 180, which is mounted at least in part on PCB 170. Circuit 180 implements the electronic functionality and electronic modes of the umbrella as briefly described above and described in further detail below. Circuit 180 may include the charging terminals 165, a DC charging port 166, the charge indicators 167, a solar-panel and battery-charging controller 200 (battery-charging controller), a DC-to-DC converter 205, an analog-to-digital converter (ADC) 215, a battery gauge 220, a processor or other control circuit 230, an authentication circuit 235, a memory 237, a battery level indicator 240, an indicator controller 245 for the battery level indicator, an output converter 255, a power inverter 246, a digital communication bus 247, and a power distribution bus 248. In some implementations, battery housing 147 (e.g., the bottom 149 of the battery housing) and circuit 180 include a power switch 147*q* (see FIG. 4H) that can power down circuit 180 (i.e., power down the circuit elements included in circuit 180). Circuit 180 may include all or a portion of the foregoing listed circuit elements in any combination.

In some implementations, digital communication bus 247 communicatively connects one or more of charging terminals 165, DC charging port 166, charge indicators 167, battery-charging controller 200, DC-to-DC converter 205, analog-to-digital (ADC) converter 215, battery gauge 220, control circuit 230, authentication circuit 235, memory 237, battery level indicator 240, indicator controller 245, power inverter 246, output converter 255, and power switch 147*q*. The digital communication bus may be configured to operate according to one of a variety of bus protocol and route digital signal between one or more of the elements connected to this bus. Power distribution bus 248 may be configured to receive power from the output converter 255 and distribute the receive power to elements of circuit 180 that require a power source, such as control circuit 230, authentication circuit 235, memory 237, battery level indicator 240, indicator controller 245, or other circuit elements that require power.

In some implementations, the battery level indicator 240 includes or is positioned on a second PCB 241 (see FIGS. 6 and 7) that is oriented transversely with respect to PCB 170 inside battery housing 147. Indicator controller 245 is also mounted on second PCB 241 in some implementations. The second PCB can be attached to an inside wall of the battery housing by a bracket 242 into which the second PCB can slide. Bracket 242 can be integrally formed with battery housing 147. PCBs 170 and 241 are connected by a wiring harness, such as a ribbon cable, in some implementations.

In an implementation, solar panels 135 are electrically connected to battery-charging controller 200 and configured to supply generated voltage and current to the battery-charging controller. Battery-charging controller 200 may also be electrically connected to battery 185 and may convert the generated current, generated voltage, or both to levels used by battery 185 for charging. For example, the battery-charging controller may include a DC-to-DC converter that may convert the charging voltage to about 4.2 volts to about 4.4 volts for charging a lithium ion battery and may provide a suitable current for charging a lithium ion battery. For example, the DC-to-DC converter may include a current clamp circuit for clamping the current provided to battery 185 to a suitable charging level.

Battery-charging controller 200 in an implementation is configured to operate as an electrical isolation circuit that prevents solar panels 135 from directly supplying electrical energy to charging terminals 165. In some implementation, circuit 180 may include additional or alternative circuits that are configured provide electrical isolation between solar panels 135 and charging terminals 165.

Battery-charging controller 200 may further monitor the charge of battery 185 and manage the conditions for initiating charging, topping off charging, and stopping charging. Battery-charging controller 200 may be implemented using an integrated circuit manufactured, for example, by Texas Instruments, Linear Technology Corporation, Maxim Integrated Products, Incorporated, or National Semiconductor Corporation. For example, battery-charging controller 200 may be the TI BQ24650 circuit of Texas Instruments, which is referred to by the manufacturer as a "High Efficiency Synchronous Switch-Mode Charger Controller-Solar Battery Charger." The data sheet and product information for the TI BQ24650 product and other products in its product family are incorporated by reference.

Battery 185 may alternatively be charged via DC charging port 166, which may include a charging connector 166a, which may be a barrel connector. A DC voltage applied to DC charging port 166 may be routed through battery-charging controller 200 for charging the battery. Battery-charging controller may convert the voltage, the current, or both that applied through the charging port as necessary for charging the battery. For example, if 12 volts is applied to DC charging port 166, the DC-to-DC converter of battery-charging controller 200 may convert the applied 12 volts to about 4.2 volts to about 4.4 volts for charging lithium ion battery technology. In some alternative implementations, DC charging port 166 may bypass battery-charging controller 200 for charging battery 185.

DC charging port 166 may also operate as a test port for testing battery 185 for determining whether the battery is diminishing in charging capacity. DC charging port 166 may include test circuitry for testing battery 185 or may be connected to an external device configured to test the battery. In some implementations, Battery-charging controller 200 includes test circuitry for testing battery 185 and is configured to operate with the DC charging port for testing the battery.

Battery-charging controller 200 is configured to detect whether a DC voltage (e.g., 12 volts) is being supplied to DC charging port 166 and provide the battery with the power supplied to the DC charging port. Further, if the battery-charging controller 200 detects a DC voltage applied to the DC charging port, the battery-charging controller can stop supplying the battery with power generated by the solar panels. If the DC voltage is disconnected from the DC charging port, the battery-charging controller can resume providing power generated by the solar panels to the battery. The battery-charging controller can include auto-detect circuitry for this switching. The battery-charging controller and the switching circuitry in the battery-charging controller can operate as an isolation circuit that provides that only one of the solar panels and the DC charging port can supply charging power to the battery.

Figure 9B:
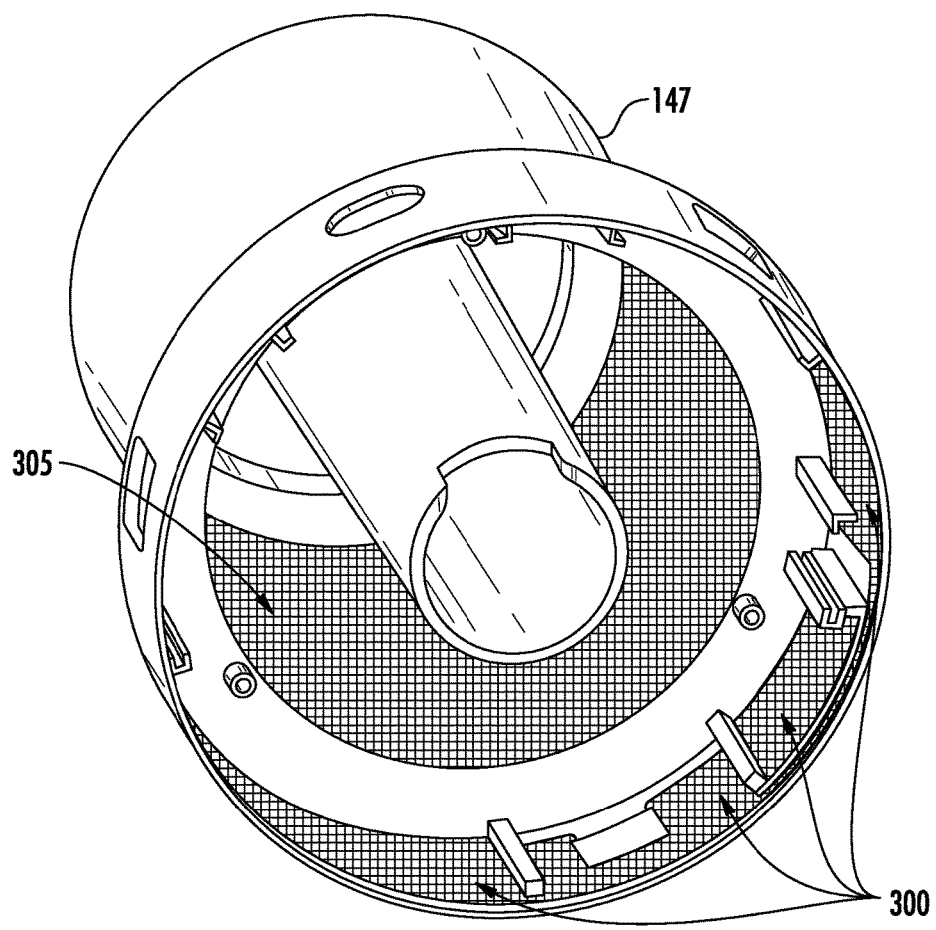
FIG. 9B shows an interior view of the battery housing where a metallic shield is positioned on an interior wall of the battery housing.

Metallic Shield. FIG. 9B shown in interior view of battery housing 147 where the battery housing 147 includes a metallic shield 300 that is positioned on a lower interior wall of the battery housing. The metallic shield can be any conductive material, such as copper, aluminum, platinum, gold, or silver, that protects a connected portable electronic device 107 from electrical or radio frequency (RF) interference noise that is generated by circuit 180, battery level indicator 240, battery 185, and any other electronic elements located in battery housing 147.

In an implementation, metallic shield 300 is a metallic coating that is coated onto the lower interior wall of the battery housing. The metallic shield can be coated onto the lower interior wall by spraying, dusting, an electrostatic process, or other process. In an implementation, the metallic coating is conductive paint that is sprayed onto the lower interior wall. The metallic coating can also be sprayed on a power that is later cured, such as by backing or via a chemical process. In another implementation, the metallic shield is a thin sheet of metal, such as copper foil, that is mechanically or adhesively (e.g., a metal sheet with a sticky backing) attached to the lower interior wall.

In another implementation, a metallic shield 305 is positioned on an upper interior wall of battery housing 147. Metallic shield 305 is substantially similar to metallic shield 300 and can be similarly applied. In some implementations, additional metallic shields are positioned on additional interior surfaces of the battery housing.

In other implementations, battery housing 147 includes one or more metallic shields that are positioned above, below, or around a side of PCB 170. For example, a metallic shield can be attached to a top, a bottom, or both of battery riser 175 where this metallic shield is above PCB 170. As another example, a metallic shield can be attached to a top, a bottom, or both of the battery housing's bottom 149 where this metallic shield is below the PCB. Metallic shield 300 that is positioned at a side the PCB is described immediately above.

In another implementation, battery housing 147 is coated with a surface treatment, such as metallic paint that can be applied to the interior, the exterior, or both of the battery housing. In another implementation, the material from which the battery housing is formed is conductive and provides RF shielding. Specifically, the battery housing can be formed of a metal impregnated plastic, nylon, or other similar material. In another implementation, the battery housing is formed, at least in part, of metal (e.g., sheet metal) that provides RF shielding. These metallic shields can be relatively thin pieces of metal, such as copper foil.

The metallic shields provide that portable electronic devices 147 (such portable phones and tablet computers) that are connected to the charging terminals of umbrella 100 will have better reception and transmission (e.g., less drop outs, voice conversations will be clearer, and content streaming will have fewer interruptions). Touch screens on the portable electronic devices will also operate more reliably, such as by having fewer false touch interactions and having improved accuracy.

Charging. As described briefly above, battery 185 may be configured to store 22,000 milliamp-hours of electrical charge and in a fully charged state may fully charge a number of portable electronic devices from a state of complete discharge to a state of full charge. For example, battery 185 may be configured to store sufficient power for charging three tablet computers, such as iPad (™) tablet computers of Apple of Cupertino Calif. and tablet computers by other manufacturers such as Google, Samsung, or Amazon, at the same time. Any trademarks listed in this patent application are the property of their respective owners.

Tablet computers charge using about 10 watts of power. When three tablets are charged at the same time, the tablet computers will draw about 30 watts of power. Therefore, the solar charging umbrella station can supply at least 30 watts of power, and is designed to supply more, such as 60 watts, in order to ensure the robustness of the battery and circuitry.

Via DC-to-DC converter 205 and circuit 180, battery 185 may provide the requisite voltages, currents, and power (sometimes referred to as a charging rate) for a variety of battery types of a variety of types portable electronic devices connected to charging terminals 165. Specifically, DC-to-DC converter 205 may convert the output voltage of battery 185 (e.g., 7.4 volts) to a voltage level used by a portable electronic device for charging (e.g., about 3.3 volts or 5 volts for a portable phone (e.g., 2G, 3G, 4G, or LTE) or tablet computer).

DC-to-DC converter may also be configurable to supply different currents to various portable electronic devices according to the currents required by the portable electronic devices as determined by authentication circuit 235. Specifically, DC-to-DC converter 205 in an implementation is configured to operate as a current clamping circuit that supplies current up to a given level required by a portable electronic device for charging. The DC-to-DC converter clamps this supplied current to the given level and does not supply a higher level of current.

For example, in an implementation, the DC-to-DC converter is configured to supply up to 5 volts and current up to 0.5 amps (2.5 watts of power, e.g., a first charging rate) for some types of portable devices (such as portable PDAs and portable phones), or supply 5.0 volts and current up to 1.0 amp (5 watts of power, e.g., a second charging rate) for other types portable phones (e.g., some types of Apple iPhones (™) or some types tablet computers, or supply 5.0 volts and current up to 2.1 amps (10 watts of power, e.g., a third charging rate) for other types of portable devices (e.g., tablet computers such as an Apple iPads (™)). The foregoing charge voltages, charge currents, and charge power are exemplary and the DC-to-DC converter can supply other charge voltages, charge currents, and charge powers based on the type of portable electronic device detected, such as an Apple iPad (™) third generation device, fourth generation device, fifth generation device, or later generation device. In some implementations, where authentication circuit 235 cannot determine the type of device connected to one of the charging terminals, DC-to-DC converter may be set to a set of default charging parameters for charging a portable electronic device, such as 5 volts, 0.5 amps (2.5 watts of power) or other defaults.

In an implementation, the circuit includes a current meter, a voltage meter, or both electrically positioned between the solar panels and the rechargeable battery. In an implementation, the current meter, the voltage meter, or both are integrally formed with battery-charging controller 200. Battery level indicator 240 or other indicator can be configured to operate in conjunction with the battery-charging controller 200, the control circuit 230, or both of these circuits as well as other circuits for displaying the charge current or the charge voltage generated by the solar cells.

Charging Terminals. One or more of charging terminals 165 may be universal serial bus (USB) terminals. The USB terminals may be configured as type A, type B, mini-A, mini-B, micro-A, micro-B, or the like, or any combination of the foregoing. Also, other types of connectors such as FireWire (i.e., an IEEE 1394 interface, i.LINK, or Lynx), eSATA, or proprietary connectors (e.g., Apple 30-pin connector, Apple 19-pin connector, Apple 8-pin connector (e.g., Apple's Lightning (™) connector) may be used instead of, or in addition to, USB terminals. Portable electronic devices may be connected to the charging terminals via cables, such as USB cables where the connectors of the charging terminals may have the same or different terminal types at opposite ends of the cables. Charging terminals 165 may be configured to operate according to a variety of USB protocol, such as USB 1.0, 2.0, or 3.0 or other versions so that a variety of portable electronic devices 107 may be charged, such as the devices listed above as well as MP3 players, handheld GPS devices, portable game consoles, battery rechargers, laptop computers, and the like.

In an implementation, charging terminals 165 are substantially circularly arranged on PCB 170 as shown in FIGS. 6 and 7 and are positioned within battery housing 147. The substantially circular arrangement of charging terminals 165 provides that at least one charging terminal may be easily reached by a user located at any angular position with respect to umbrella 100, so that the user does not have to move or rotate the umbrella to reach and access a charging terminal for charging the user's portable electronic device 107. In a lounging environment in which umbrella 100 may be used, this substantially circular arrangement provides for increased ease of use of the umbrella for charging portable devices. Also, as shown in FIGS. 6 and 7, PCB 170 and battery housing 147 position charging terminals 165 a distance (e.g., 2 to 7 inches) away from umbrella pole 130 and towards where users may be seated or the like for easy and convenient access.

One or more of charging terminals 165 may be DC connectors that provide a relatively low DC output voltage, such as 12 volts. The DC connector may be a barrel type connector, a cigarette lighter type receptacle, a mini-jack, a micro-jack, or other connector type. The DC connector may supply DC voltage for powering or charging a variety of devices, such as lights, fans, music players, computers (e.g., laptop computers), beverage heating devices, beverage cooling device, and small motorized tools. The 12-volt outlet may be used in an implementation of the present invention. The foregoing described implementations of charging are provided for example and the described implementations are not exhaustive of the types of charging terminals that that may be included in circuit 180.

Turning now to power inverter 246, the power inverter changes direct current (DC) to alternating current (AC), such as 110 volts AC. Power inverter 246 may be electrically connected to one or more of battery 185 (as shown in FIG. 9A), DC-to-DC converter 205, and solar panels 135 and may invert the DC voltages supplied by one or more of these elements to AC voltage. An AC voltage put out by power inverter 246 may be used for powering or charging a number of devices, such as electronic devices, tools, and appliances. Many common appliances run on AC power. For implementations of the umbrella that include the power inverter, the power inverter can be positioned on PCB 170 or can be configured as a stand alone circuit in battery housing 145. Further, while FIG. 9A shows that umbrella 100 includes one power inverter, various implementations of the umbrella may include one or more power inverters. The power inverter can be configured to deliver AC power through an AC outlet (e.g., NEMA 1 15 or NEMA 5-15 sockets, or other socket types) that may be in housing 145. Some umbrella implementations do not include a power inverter.

Some implementations of umbrella 100 include a number of solar panels 135 that is sufficient to provide an amount of current that can be used by the umbrella to charge a variety of portable electronic devices without accumulating charge in battery 185. These implementations might not include a battery and electrical energy generated by the solar panels might be directed to connected portable electronic devices for charging. The electrical energy generated by solar panels 135 might be routed through DC-to-DC converter 205 for conversion to voltages and currents useful for charging the batteries of connected portable electronic devices.

It is noted that while umbrella 100 is described as being configured to charge the batteries of portable electronic devices, umbrella 100 may be configured to charge a variety of charge store devices that are often included in portable electronic devices, such as capacitors, super capacitors, or other charge store devices. While various implementations described include solar panels for charging battery 185, alternative implementations of umbrella 100 may include alternative or additional elements for generating electrical energy, such as wind turbines, thermoelectric generators, bioenergy sources, or the like.

Control Circuit. Turning now to control circuit 230 and authentication circuit 235, the control circuit may be a microcontroller, a microprocessor, control logic (e.g., programmable logic or a field programmable gate array), or the like, or any combination of these circuits. In a specific implementation, control circuit 230 is the ATMega32 microcontroller from Atmel Corp.

Among other functions, control circuit 230 controls communication with portable electronic devices 107 that are connected to charging terminals 165. Control circuit 230 may operate in conjunction with a USB stack (not shown) that can be included in the control circuit. The USB stack facilitates communication between the control circuit and connected portable electronic devices by operating according to a communication protocol, such as one or more of the standard USB communication protocols. Other implementations of the umbrella operate according to other communication protocols, such as one or more Apple protocol, one or more proprietary protocols, or other protocols.

Figure 9C:
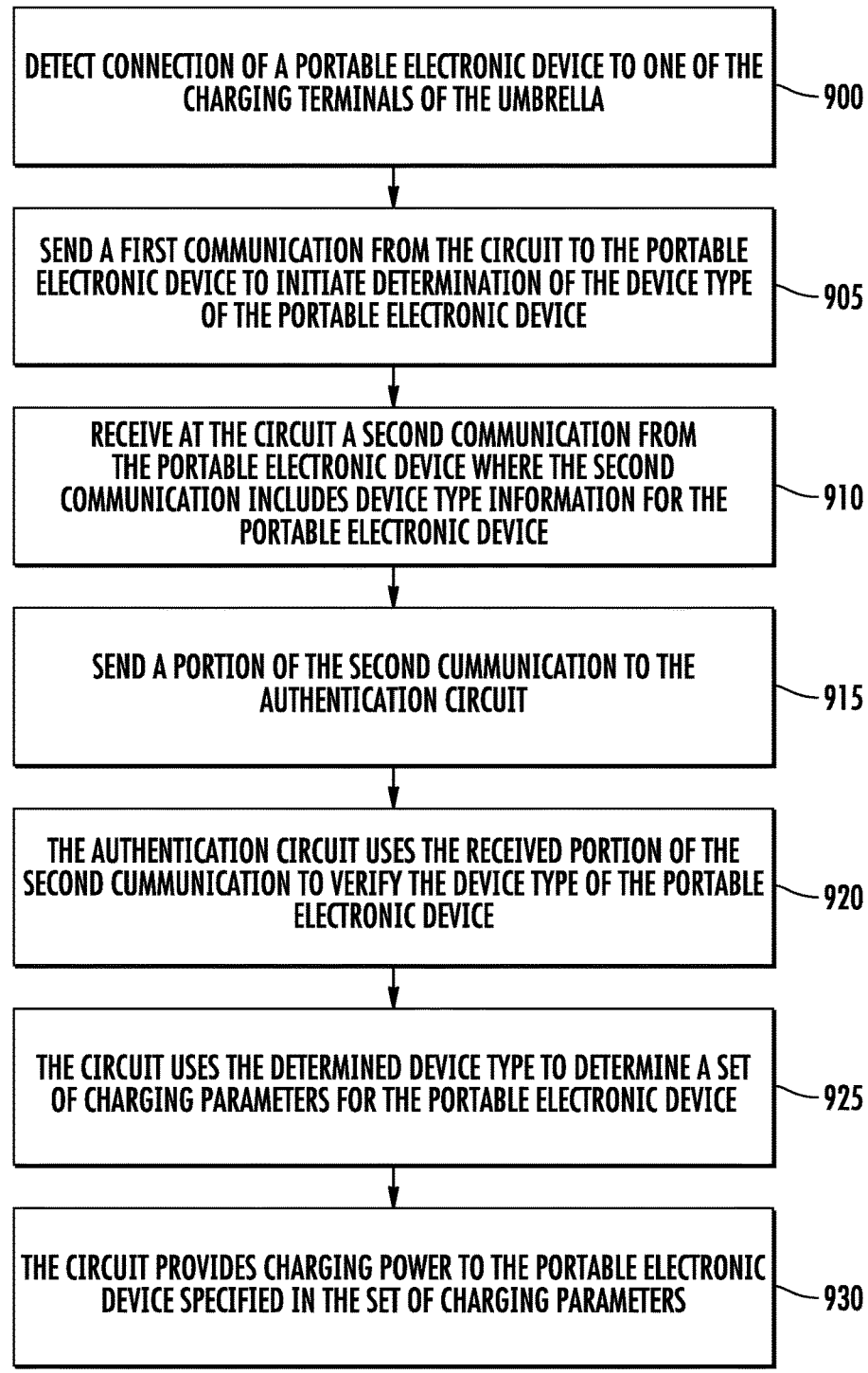
FIG. 9C shows a flow diagram of a communication method in an implementation of the invention.

For example, when a portable electronic device is initially connected to a charging terminal 165, control circuit 230 may operate according to one of the standard USB protocols or other protocols for communicating with the portable electronic device to collect device type information, which specifies the device type of the portable electronic device. The collected device type information may include information that identifies the portable electronic device, for example, as a phone, a tablet computer, a PDA, or the like. The device type information may include information that identifies the manufacturer of the portable electronic device. The authentication circuit can use this information to determine a device type (e.g., Apple iPod, Apple iPhone, Apple iPad, and identify the version (e.g., first generation, second generation, third generation, fourth generation, fifth generation, or future generations) of the portable device and FIG. 9C is a flow diagram of a communication method in an implementation of the invention. The flow diagram represents one example implementation and steps may be added to the flow diagram, removed from the flow diagram, or combined without deviating from the scope of the invention.

In a step 900, when a portable electronic device 107 is connected to one of charging terminals 165, circuit 180 (e.g., control circuit 230) detects the connection. Thereafter, circuit 180 implements a handshaking protocol by sending a first communication (e.g., a self-identification signal) through the charging terminal to the portable electronic device, see step 905. If the portable electronic device recognizes the signal, the portable electronic device accepts the signal. In some implementations, the portable electronic device authenticates the circuitry of the umbrella based on the signal.

Thereafter, the portable electronic device sends a second communication back to the circuit (e.g., control circuit 230) through the charging terminal (see step 910). The second communication is sent in response to the first communication. The second communication received by the circuit includes device type information for the portable electronic device.

The circuit (e.g., control circuit 230) sends one or more portions (e.g., the device information) of the second communication to the authentication circuit (see step 915). The authentication circuit then uses the device type information to determine a device type of the portable electronic device (see step 920). For example, the authentication circuit uses the device type information to determine that the portable electronic device is a first device type (e.g., Apple iPod (™)), a second device type (e.g., Apple iPhone (™)), a third device type (e.g., Apple iPad (™)), or other device type. Circuit 180 (e.g., the control circuit, the authentication circuit, or both) then use the determined device type to determine (e.g., lookup in memory 237) a set of charging parameters (e.g., one or more of a charging voltage, charging current, a current rate, or other parameters) for the portable electronic device (see step 925).

Thereafter, the circuit (e.g., battery control circuit 200, DC-to-DC converter 205, or both) is configured to supply the charging voltage and charging current (based on the determined charging parameters) to the charging terminal for charging the portable electronic device (see step 930). Battery control circuit 200, DC-to-DC converter 205, or both can be configured by one or both of control circuit 230 and authentication circuit 235 for supplying the charging voltage and charging current.

For example, if battery 185 is a lithium ion battery that supplies 7.4 volts, DC-to-DC converter 205 can lower the voltage supplied through the charging terminal to about 5.0 volts for charging the portable electronic device connected to the umbrella. One or both of the battery control circuit and the DC-to-DC converter is configured to clamp the current supplied from the battery to the charging terminal. The clamped current is the specified current or less.

In an implementation, if authentication circuit 235 determines that the portable electronic device is a first type of device (e.g., PDA (e.g., Apple iPod (™)), portable phone (e.g., Apple iPhone (™)), or other device), then circuit 180 (e.g., the DC-to-DC converter) is configured to supply a first level of power (e.g., 2.5 watts) to the portable electronic device for charging the portable electronic device where the first level of power is associated with the first type of device. For example, according to the voltage, the current, or the power required by a first type of portable electronic device, the DC-to-DC converter can be configured to supply up to 5 volts and current up to 0.5 amps (i.e., up to 2.5 watts of power).

Alternatively, if authentication circuit 235 determines that the portable electronic device is a second type of device (e.g., portable phone (e.g., Apple iPhone (™)), tablet computer (e.g., Apple iPad (™)), or other device), then circuit 180 (e.g., the DC-to-DC converter) is configured to supply a second level of power (5 watts) to the portable electronic device for charging the portable electronic device. The second level of power can be greater than the first power level. For example, for a second type of portable electronic device, the DC-to-DC converter can be configured to supply up to 5 volts and current up to 1.0 amps (i.e., up to 5 watts of power).

Alternatively, if the authentication circuit 235 determines that the portable electronic device is a third type of device (e.g., a tablet computer (e.g., Apple iPad (™)), then circuit 180 (e.g., the DC-to-DC converter) is configured to supply a third level of power (e.g., 10 watts) to the portable electronic device for charging the portable electronic device. The third level of power can be greater than the first and second levels of power. For example, for a third type of portable electronic device, the DC-to-DC converter can be configured to supply up to 5.0 volts and current up to 2.0 amps (e.g., up to 10 watts of power).

In other implementations, other device types (e.g., Apple iPads (™) of the third generation, the fourth generation, the fifth generation, or higher generations, Samsung Galaxy tablet computers, Amazon tablet computer, Google tablet computers, or other types of devices) may be detected by the authentication circuit, and based on the type of detected portable device, circuit 180 may be appropriately configured to supply power to these types of devices.

In some implementations, where authentication circuit 235 cannot determine the type of portable electronic device connected to one of the charging terminals, DC-to-DC converter may be set to a set of default charging parameters for charging a portable electronic device, such as 5 volts, 0.5 amps (2.5 watts of power) or other defaults. In some implementations, DC-to-DC converter is configurable by control circuit 230, authentication circuit 235, or a combination of these circuits for supplying appropriate voltages, currents, and power simultaneously to one or more portable electronic devices connected to one or more corresponding charging terminals.

The table below shows a number of example device types and their associated charging voltages, charging currents, and charging powers (i.e., charging parameters) that can be associated with the device types. The device type numbers (e.g., first type, second type, third type, and the like) shown in the table are shown for purposes of example. The device type numbers shown in the table can switched for specific number schemes that may be used by specific manufacturers (e.g., number schemes used by Apple, Samsung, Motorola, or others). The information in the table can be stored in memory 237 in a database for lookup and retrieval by control circuit 230 or other circuit elements of circuit 180.

TABLE

| Type of Device | Charge Voltage (volts) | Charge Current (amps) | Charge Power (watts) |
|---|---|---|---|
| First | 5 | 0.40 | 2.0 |
| Second | 5 | 0.42 | 2.1 |
| Third | 5 | 0.44 | 2.2 |
| Fourth | 5 | 0.46 | 2.3 |
| Fifth | 5 | 0.48 | 2.4 |
| Sixth | 5 | 0.50 | 2.5 |
| Seventh | 5 | 1.00 | 5.0 |
| Eighth | 5 | 1.02 | 5.1 |
| Ninth | 5 | 1.04 | 5.2 |
| Tenth | 5 | 1.06 | 5.3 |
| Eleventh | 5 | 1.08 | 5.4 |
| Twelfth | 5 | 1.10 | 5.5 |
| Thirteenth | 5 | 2.00 | 10.0 |
| Fourteenth | 5 | 2.02 | 10.1 |
| Fifteenth | 5 | 2.04 | 10.2 |
| Sixteenth | 5 | 2.06 | 10.3 |
| Seventeenth | 5 | 2.08 | 10.4 |
| Eighteenth | 5 | 2.10 | 10.5 |

In some implementations, the DC-to-DC converter is configured to operate as a current clamp circuit, a power clamp circuit, or both. That is, the DC-to-DC converter is configured to provide current, power, or both up to a given limit and not supply current, power, or both beyond the given limit. For example, if portable electronic device connected to a charging terminal is determined to require 2.5 watts of power for charging, then the DC-to-DC converter will supply up to 2.5 watts of power and not supply more power.

In an implementation, the above described authentication process or handshake process uses certificates, which get exchanged between the circuitry and the portable electronic device when the device is connected to one of the charging terminals. The circuitry of the umbrella and the connected portable electronic device open up communication channels once these certificates have been exchanged and authenticated. After the communication channels are opened, the portable electronic device supplies the device type information to the circuit as described above with respect to FIG. 9A, and thereafter the authentication circuit determines the device type and determines the charging parameters for the device. Charging can proceed as described above.

In one specific implementation, upon connecting the portable electronic device to one of the charging terminals, if portable electronic device authenticates the umbrella, via circuit 180, the portable electronic device will display its normal screen and no warning messages regarding the umbrella will appear on the screen of the device. In another specific implementation, if the portable electronic device does not authenticate the umbrella, via circuit 180, the umbrella will not be presented as a valid accessory and the screen of the portable electronic device displays a warning message. This warning message may be referred to as a "nag message," informing the user that the umbrella is not a valid accessory or has not been approved by the manufacturer of the phone. In an implementation, the umbrella communicates with the portable electronic device to prevent a nag message from being displayed if authentication is not successful, and thereafter the umbrella may supply the default charge voltage and default charge current to the connected portable electronic device.

Battery Gauge. Turning now to battery gauge 220 and A-D converter 215, the A-D converter is electrically connected to battery 185 and is configured to determine a voltage level of the battery in at least an implementation of the umbrella. More specifically, the A-D converter is configured to sense the voltage across the battery's terminals, and thereafter convert the sensed analog voltage to a digital voltage value. The A-D converter then supplies the digital voltage value to control circuit 230, which then determines the amount of charge stored in battery 185 based on the digital voltage value. Control circuit 230 may execute battery gauge computer code (e.g., battery gauge 220 in an implementation) to determine the amount of charge stored in battery 185.

The battery gauge computer code includes one or more mathematical formulas that are used by the control circuit to determine the charged stored in the battery based on the battery's output voltage. The one or more mathematical formulas may be based on known information about the battery, such as the charge capacity of the battery, the battery chemistry, the drop in the output voltage of the battery versus the drop in charge stored in the battery, or other known information about the battery.

In some implementations, the battery gauge computer code can be stored in memory 237 and can be changed, updated, or modified if the battery 185 changed, if battery models are developed, or for other reasons. As described briefly above, memory 237 can be FLASH, EEPROM, EPROM, PROM, or other memory type.

In one alternative implementation, battery gauge 220 includes a battery gauge circuit that is configured to receive the digital value for the voltage and determine the charge stored in battery 185. The battery gauge circuit can be an independent circuit element that is included in circuit 180 and is located in PCB 170. The battery gauge circuit may operate independently of control circuit 230 or in conjunction with the control circuit to determine the charge stored in battery 185. In some implementations, control circuit 230 includes the battery gauge circuit.

After the battery gauge determines the charge stored in the battery, one or both of the battery gauge and the control circuit may operate to turn on (i.e., light) none, or one or more of the indicators (e.g., lights, such as LEDs) included in battery level indicator 240 to indicate the amount of stored charge in the battery.

As briefly described briefly above and in further detail below, battery level indicator 240 may include a number of indicators 250 for indicating the charge status of battery 185. For example, battery level indicator 240 may include 1, 2, 3, 4, 5, 6, or other number of indicators, such as LEDs or the like, to indicate a stored charge level of battery 185. Typically, the more indicators turned on indicates a greater amount of stored charge in the battery, and less indicators turned on indicates a lesser amount of stored charge. When no indicators turn on, the battery will be discharged or have a relatively low charge (e.g., less than 5 percent charge, less then 4 percent charge, less then 3 percent charge, less that 2 percent charge, less then 1 percent charge, or other low charge percentage).

When battery 185 is fully charged, all indicators should be turned on. In other implementations, in a reverse indicator scheme, the indicators can be turned off to indicate a charged battery and turned on to indicate a discharged battery. If battery level indicator 240 indicates that battery 185 has a low level of charge, a user might turn the top of the umbrella to face the sun to increase the electrical energy generated by solar panels 135 so that the battery can be charged at an increate charge rate. One benefit, however, of various implementations of umbrella 100 described is that solar panels 135 may be disposed on a number of faces of shade 105 such that the umbrella does need to be rotated to provide increased charging current for battery 185. As such, if a low charge of battery 185 is indicated by the battery level indicator, then the ambient light may be relatively low (e.g., dawn, dusk, or night). In such circumstances, the battery can then be charged via DC charging port 166.

Figure 4J:
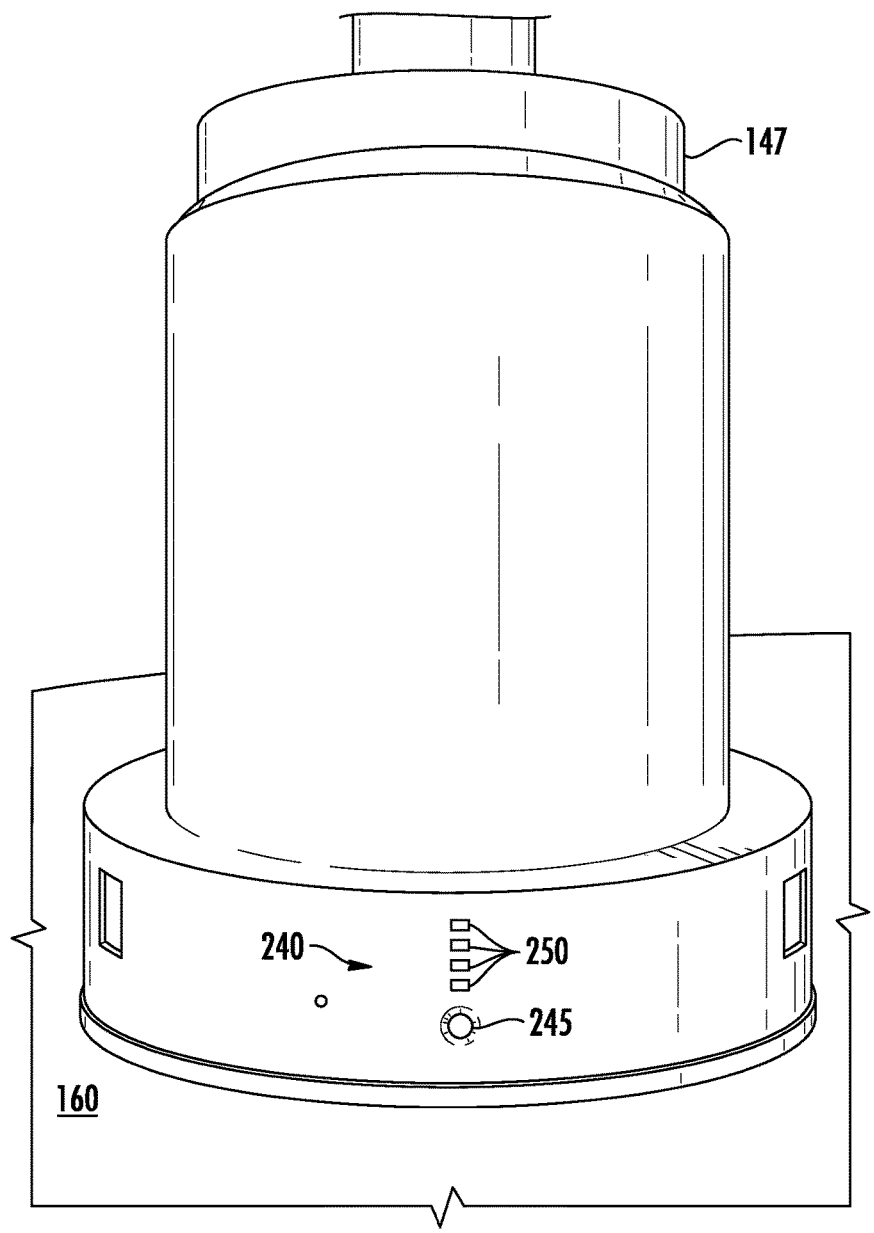

FIGS. 4I and 4J show views of battery housing 147 and battery level indicator 240 in an implementation. The battery housing has one or more openings formed in the battery housing that expose indicators 250 (e.g., lights, such as LEDs or OLED, or LCD indicators) of battery level indicator 240. In an implementation, battery level indicator 240 includes the indicator controller 245 (e.g., button or switch), which is configured to be activated by a user for turning on indicators 250.

In another implementation, when activated, indicator controller 245 is configured to initiate the determination of the output voltage of the battery by analog-to-digital (A-D) converter 215 and control circuit 230. When activated, the indicator controller is further configured to initiate the determination of the charge level of the battery by battery gauge 220, and thereafter control battery level indicator 240 to indicate the charge level.

While FIGS. 4I and 4J show that the individual indicators 250 of battery level indicator 240 are vertically oriented, the indicators can be oriented in other orientations. For example, indicators 250 may horizontally arranged, arranged in an arc, arranged in a circle, or have other arrangements.

Battery gauge 220 may also be configured to provide information for a number of operating hours that battery 185 has operated, a number for the charge percentage of the battery, the maintenance status of the battery (e.g., whether the battery needs replacing, the battery is new, or the like), or any combination of these and other parameters. These parameters may be indicated to a user via battery level indicator 240 on indicators 250 or other display types, such as a display (e.g., a liquid crystal display, which may display text and numbers). This information may be important to a user of the present invention in order to gauge the types and quantity of devices to charge at a given time. In other implementations, more than one gauge may be used with umbrella 100.

In an implementation, circuit 180 includes a voltage conversion circuit 255 to step down the generated voltage of the solar panels 135, the output voltage of battery 185, or both for powering the various circuit elements of circuit 180. For example, voltage conversion circuit 255 may step down the 12 volts, for example, generated by solar panels 135 to 3.3 volts, 5.0 volts, or the other voltage used by the circuit elements. The voltage conversion circuit may step down the 7.4 volts, for example, output by battery 185 to 3.3 volts, 5.0 volts, or the other voltage used by the circuit elements.

Various components of circuit 180 may be in sleep modes when not in use to preserve the charge of battery 185. For example, A-D converter 215, battery gauge 200, control circuit 230, authentication circuit 235, and memory 237 may each have sleep modes that are used by these circuits when the circuits are not in use. User activation of indicator controller 245, detection of a recently connected portable electronic device, or the like may wake (e.g., enter a full power mode) the sleeping circuits. A sleep mode as referred can include a number of power down states including states that are sometimes referred to as low power modes and deep sleep modes.

Network Communication Device. In an implementation, a solar-charging battery device includes a wireless communication interface such as a wide area network (WAN) connection interface (e.g., 4G module, 3G module, or the like), for connecting a mobile device in proximity to the device to a wide area network, such as the mobile Internet (e.g., provided by Verizon, AT&T, Sprint, or T-Mobile).

As an example, the circuitry in FIG. 9A can include a 4G module, thus creating a mobile hotspot to the 4G LTE mobile Internet. The solar panels charge the rechargeable battery, which powers the 4G circuitry. A smartphone, tablet, laptop, or other client device can connect wirelessly (e.g., Wi-Fi or Bluetooth) or by wire (e.g., USB cable) to the 4G circuitry. Then the smartphone, tablet, laptop, or other device can connect to the Internet.

Typically, portable mobile hotspots use significant power and drain batteries quickly. In a solar-powered implementation, since power comes from the sun, as long as the sun is shining, the mobile hotspot will provide continuous continuity. And at night, the battery will power the mobile hotspot. With sun, the mobile hotspot can be available for the entire day.

Figure 9D:
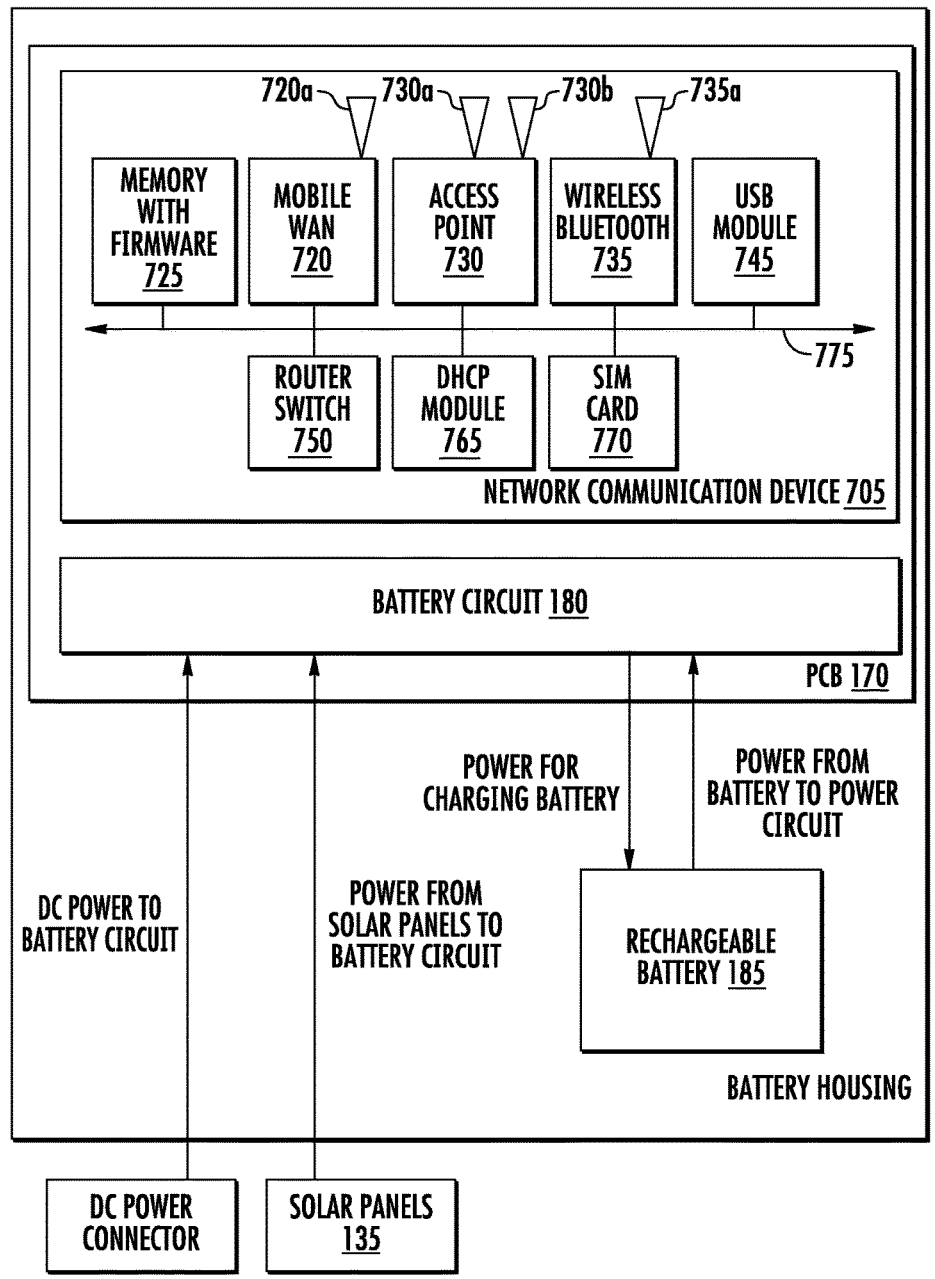
FIG. 9D shows a diagram of the network communication device in an implementation.

FIG. 9D shows a block diagram of a specific implementation of a solar-powered mobile hotspot. The circuitry is similar to that shown in FIG. 9A, but further includes the wide area network circuitry. The components can be contained in a battery housing 700, such battery housing 147. The circuitry includes a network communication device 705. The network communication device is configured to provide network access for one or more electronic devices 107. That is, the network communication device is configured to operate as a network portal that provides network access, such as Internet access, intranet access, or both, for the electronic devices.

In an implementation, network communication device 705 (e.g., including a 4G module) can be on the same printed circuit board (PCB) as the solar charging and rechargeable battery circuitry. In an implementation, network communication device 705 (e.g., including a 4G module) can be on a different printed circuit board from the solar charging and rechargeable battery circuitry. For example, solar charging and rechargeable battery circuitry can be a first printed circuit board while network communication device 705 is on a second printed circuit board. The second printed circuit board (may be referred to as a "daughterboard") and can plug into (or otherwise connect) to the first printed circuit board (may be referred to as "motherboard") through a connector.

Network communication provided by the network communication device may include packetized network communication or other types of communication that are specified by an communication protocol, such as an internet protocol (IP), such as the transmission control protocol IP (TCP/IP).

The network communication device may be configured for wired communication with one or more portable electronic devices, wireless communication with one or more portable communication devices, or both. The network communication device may also be configured for wired communication with an external network (e.g., the Internet, an internet, or both), wireless communication with an external network or both for providing network access to one or more portable electronic devices.

In an implementation, network communication device 705 includes a mobile WAN (wide area network) module 720, a memory 725, an access point 730, a wireless Bluetooth module 735, a USB module 745 (e.g., USB stack firmware and USB circuitry), a router switch 750, a DHCP (dynamic host configuration protocol) module 765, a SIM card 770, and a communication bus 775. The network communication device can also include a power distribution bus (not shown) that distributes power to the circuit elements. The network communication device can include one or more of the circuit elements in any combination.

In the implementation, one or more of the circuit elements are positioned on PCB 170 of circuit 180. In another implementation, one or more of the circuit elements are positioned on a network communication PCB that is electrically connected (e.g., ribbon cable, edge connector, or other connector types) to PCB 170.

Memory 725 can be FLASH, EEPROM, EPROM, PROM, or other memory type. The memory can store computer code, such as firmware, that can be used by one or more of the circuit elements for providing network access, for example via a cell tower, for one or more portable electronic devices that are communicatively linked to the network communication device. The firmware can also be used by one or more of the circuits (e.g., access point 730) for providing password protection for allowing authorized portable electronic devices to login to the access point, and for disallowing unauthorized portable electronic devices to login to the access point.

The firmware can be resident in a memory of the network communication device. The firmware can updated by a wired connection to the device, or a wireless connection, such as a firmware update delivered via the mobile WAN (e.g., provided by a carrier such as Verizon, AT&T, Sprint, or T-Mobile. The firmware can be code that presents users' client devices (e.g., smartphone or laptop) who connect to a mobile hotspot device a graphical user interface, for signing into and connected to the mobile WAN. For example, the user can enter their carrier account information in the graphical user interface on the phone to identify themselves. If they do not have an account with the carrier, the graphical user interface can provide options for paying for one-time user, such as entering credit card information.

Alternatively, instead of firmware (or software) stored locally at the hotspot device, the login or sign-in screen may be presented via software that executes on the remote server. Or, the login or sign-in code may be a combination of local firmware or software and remote software on a server.

Mobile WAN 720 can be configured for cellular communication with a cellular network via a variety of communication protocols such, as one or more 2G protocols, one or more 3G protocols, one or more 4G protocols, or other communication protocols in use, such as 5G, 6G, 7G, or higher generation protocols. In an implementation, mobile WAN 720 is a 4G module. The 4G module can communicate via one or more of: IEEE 802.16m standards (e.g., WiMAX protocol or Mobile WiMAX protocol), one or more long term evolution (LTE) protocols, one or more LTE Advanced protocols, one or more IEEE 802.16e standards (e.g., the WirelessMAN-Advanced protocol), the Flash-OFDM protocol, one or more IEEE 802.20 standards (e.g., the iBurst protocol, or the MBWA protocol), the HIPERMAN protocol, the EDGE Evolution protocol, the UMTS protocol, the EV-DO protocol, or other standards or protocols.

The mobile WAN can use a transmission technology such as CDMA, TDMA, GSM, or EDGE. TDMA stands for time division multiple access. CDMA stands for code division multiple access. GSM stands for Global System for Mobile Communications. Most GSM device use a removable Subscriber Identity Module or SIM cards, more commonly known as a smart card, containing a user's account information, phone book, and security parameters.

The mobile WAN includes an antenna 720a that provides for communication with a cellular network that includes a number of cell towers, a wireless router, or other network access devices. Antenna 720a can be an on-chip antenna (e.g., mounted on the printed circuit board) or an external antenna (e.g., connected through an antenna connected to the printed circuit board). In an implementation, antenna 720a is an external antenna that is positioned in the battery housing, such as positioned on an interior surface of the battery housing. In another implementation, antenna 720a is positioned on one or more portions of the umbrella, such as along (e.g., inside) umbrella pole 130, along (e.g., inside) one or more struts 110, ribs 115, or a combination of these positions. The antenna can also be positioned along shade 105, such as positioned on a lower surface of the shade. Typically, the more elevated the antenna, the greater the range of the broadcast, since there are fewer obstacles that interfere with the signal.

The mobile WAN and antenna can operate at a variety of frequencies based on the protocol that the mobile WAN is configured to operate under. In an implementation where the mobile WAN and antenna are 4G devices, the mobile WAN and antenna can operate at frequencies ranging from about 500 megahertz to about 5 gigahertz, such as 500 megahertz, 800 megahertz, 1 gigahertz, 1.1 gigahertz, 1.3 gigahertz, 1.5 gigahertz, 1.7 gigahertz, 1.9 gigahertz, 2 gigahertz, 2.3 gigahertz, 2.5 gigahertz, 2.7 gigahertz, 2.9 gigahertz, 3.0 gigahertz, 3.3 gigahertz, 3.5 gigahertz, 3.7 gigahertz, 3.9 gigahertz, or higher frequencies.

In an implementation, the mobile WAN operates as a portal that provides network access for one or more portable electronic devices via one or more of the access point 730, the wireless Bluetooth module 735, and the USB module 745. In an implementation, one or more portable electronic devices 107 can wirelessly connect to the access point, one or more portable electronic devices can wirelessly connect to the wireless Bluetooth module, and one or more portable electronic devices can connect via a wired cable through the USB module.

In an implementation, the access point includes a Wi-Fi router or a router that operates according to one or more related standards. The access point can provide network access (e.g., via the mobile WAN) for one or more portable electronic devices wirelessly connected to the access point. For example, a client device connects through the access point to the router or switch. The DHCP server assigns an IP address to the client device. This IP address may be assigned via network address translation (NAT). Through the router or switch, multiple client devices can be connected to the wide area network at the same time. The router or switch routes the network traffic from the wide area network to the appropriate client.

The access point can be single band (e.g., 2.4 gigahertz Wi-Fi or 5 gigahertz Wi-Fi) or multiple bands (e.g., both 2.4 and 5 gigahertz Wi-Fi). The access point can include one or more antenna, for example antennas 730a and 730b, that allow the access point to communicate at a variety of frequencies. For example, the access point and one of the antennas can be configured to operate at frequencies specified by IEEE 802.11a or 802.11ac (e.g., 5 gigahertz frequency band). The access point and the other of the antenna can be configured to operate at frequencies specified by IEEE 802.11b, 802.11g, or 802.11n (e.g., 2.4 gigahertz band) or operate at frequencies that are specified by other standards.

The access point can be one or more antennas tuned for the specific frequency bands being used. In other implementations, for multiple-input and multiple-output (MIMO) operation, there can be two or more antennas for each frequency band.

The access point can be configured for secured access via one or more passwords, or may be configured for unsecured access where a password is not required for accessing the access point. A guest at a location (e.g., a hotel, a resort, a restaurant, or other location) may be able to collect a password for the access point at the location (e.g., from a hotel check in desk, a host or waiter at a restaurant, or from other people of devices).

In an implementation, the wireless Bluetooth module can provide network access (e.g., via the mobile WAN) for one or more portable electronic devices wirelessly connected to the wireless Bluetooth module. The wireless Bluetooth module can be a standard power Bluetooth module or a low power Bluetooth module. The wireless Bluetooth module includes an antenna 735 that provides for wireless communication with a wirelessly connected portable electronic device. The wireless Bluetooth module and antenna can operate at a variety of frequencies, such as the 2.4 gigahertz band.

In an implementation, the USB module includes, or is configured to use, one or more of the USB charging ports 165 of the battery housing. The USB module can provide network access (e.g., via the mobile WAN) for one or more portable electronic devices connected to the USB charging ports. At the same time while providing network connectivity, circuit 180 of the battery housing can provide electrical power to the one or more portable electronic device for charging the one or more portable electronic devices. That is, the network communication device and the battery charging circuits of circuit can provide substantially simultaneous network access and battery charging power for one or more connected electronic devices. For example, there are four USB ports to allow four client devices to connect to the wide area network (and potentially charge) at the same time.

The DHCP module is electronically connected via bus 775 to each of the access point, the wireless Bluetooth module, the USB module, and the mobile WAN. The DHCP module provides Internet protocol (IP) parameters, such as IP addresses, to the electronic devices that connect to one of the access point, the wireless Bluetooth module, and the USB module. The DHCP protocol operates based on the client-server model, and is common to modern networks that range in size from home networks to large campus networks and regional Internet service provider networks.

Network switch is connected to bus 775 and filters and forwards packets from the mobile WAN to the access point, the wireless Bluetooth module, the USB module. The access point, the wireless Bluetooth module, the USB module thereafter forward the packets appropriately to one or more portable electronic devices that are communicatively connected to these communication devices. The network switch also receives packets from the access point, the wireless Bluetooth module, and the USB module and forward the packets to the mobile WAN for further transmission, such as to a cell tower.

One or more antennas of the mobile WAN, the access point, and the wireless Bluetooth module can be on-chip antennas, can be positioned within the battery housing, can be positioned along umbrella pole 130, can be positioned along the stays, the ribs, the shade, or a combination of one or more of these elements.

In an implementation, the battery housing includes the network communication device, and the battery housing includes one or more solar panels that can charge the rechargeable battery as described above. The solar panels can be positioned on the top of the battery housing, along the sides of the battery housing, or both. Solar panels on top of the battery housing can be substantially planar, and solar panels on the side of the battery housing can be planar or curved to substantially match an exterior shape of the battery housing. The battery housing can have a variety of shapes, such as a cuboid, a cube, or other shapes.

In an implementation, the battery housing may be detachable from the umbrella pole or may be a stand-alone device that recharges the rechargeable battery via the solar panels attached to the battery housing.

In an implementation, the battery housing and the components contained within it are a stand-alone device that can supply battery power to the USB ports, and can be recharged via DC charging port 166. The hole for the umbrella pole can blocked with a cover. A handle can be attached to the unit. Such a stand-alone device can be used as a portable power pack for use at, for example, a hotel or other conference facility for use by users to charge their battery-operated device. The portable power pack can be placed at conference room tables or other locations convenient for users. As discussed above, in a specific implementation, this power pack can be used by four people simultaneously to charge four device (even higher drain devices such as tablet computers). The battery housing can include a locking mechanism (such as a Kensington security slot) to secure the power pack to a table. After use, the conference room staff can easily move the power packs to a storage location, where they can be charged via the charging jack, or wirelessly (as described elsewhere in this application).

Figure 9E:
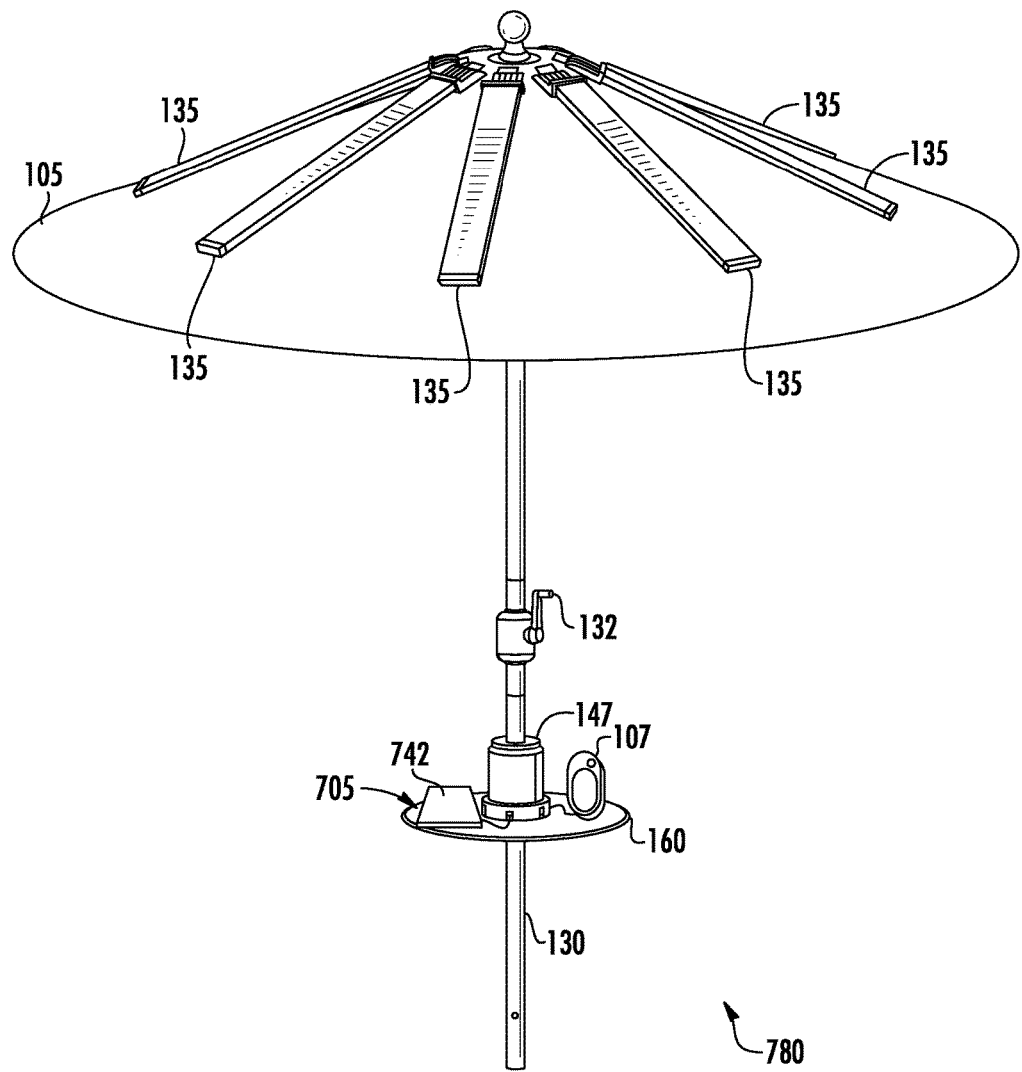
FIG. 9E shows a diagram of an umbrella in an alternative implementation where the umbrella includes a network communication device configured to communicate with the portable electronic device.

FIG. 9E is a diagram of an umbrella 780 in an implementation. Umbrella 780 is similar to umbrella 100 but differs in that umbrella 780 includes a network communication device 705 having an external housing 742 that is connected to the battery housing via a wired connection. The network communication device connects to one of the battery housing's charging terminals (e.g., a USB charging terminal), and can operate according to a USB protocol. The battery housing provides for charging a connected portable electronic device 107 and the network communication device provides a network portal for the portable electronic device while the device's rechargeable battery is being charged by the battery housing.

In an implementation, the network communication device receives electric power from the rechargeable battery through circuit 180. In another implementation, the network communication device receives electrical power directly from the solar panels. Electrical power received directly from the solar panels bypasses circuit 180 but may be routed through PCB 170.

Figure 9F:
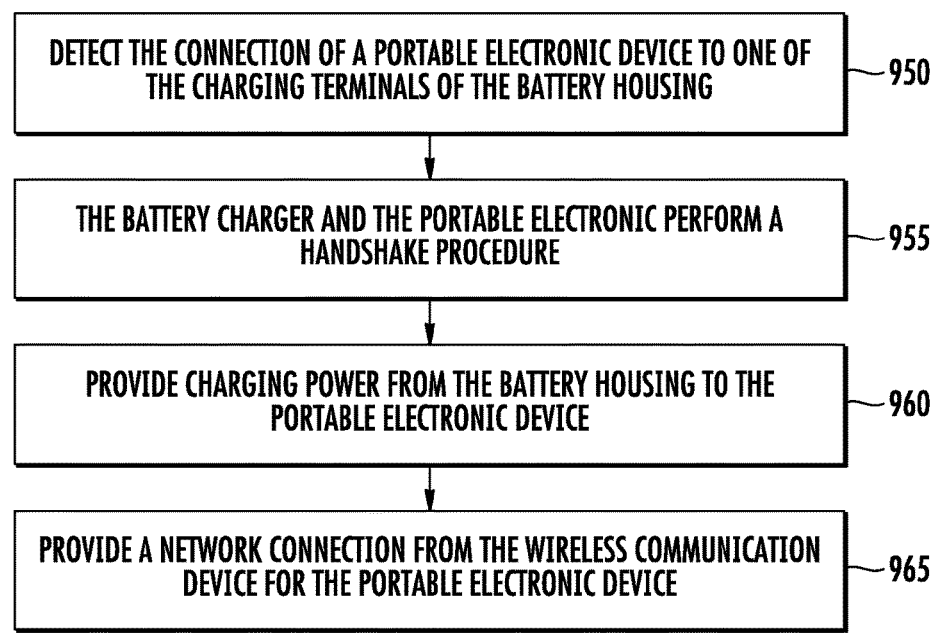
FIG. 9F shows a flow diagram of a method for charging a portable electronic device and substantially simultaneously providing network access to the portable electronic device.

FIG. 9F is a flow diagram of a method for charging a portable electronic device and substantially simultaneously providing network access to the portable electronic device in an implementation. The flow diagram represents on example embodiment. Steps may be added, combined, and removed from the flow diagram without deviating from the prevue of the implementation.

At an initial step 950, a portable electronic device 107 is connected to one of the battery housing's charging terminals. Circuit 180 of the battery housing performs a handshake operation with the portable electronic device (see step 955). Thereafter, the battery housing may begin providing electric power to the portable electronic device for charging the battery of the portable electronic device (see step 960), and the network communication device links to the portable electronic device for providing network access to the device (see step 965).

In some embodiments, the network communication device also performs a handshake procedure with the portable electronic device prior to providing network access to the device. In some implementations, the wireless network device can provide network access to the portable electronic device via the access point or the wireless Bluetooth module while the potable electronic device is connected to the USB charging terminals.

In one embodiment, the handshake procedure includes the transmission of an access code (e.g., password) from the portable electronic device to the network communication device. Acceptance of the access code allows the portable electronic device to link to the network communication device. Subsequent the portable electronic device linking to the wireless communication device, the wireless communication device operates as a network portal for the portable electronic device so that the portable electronic device can access the Internet, an intranet, or both via the wireless communication device.

In a further embodiment, a second portable electronic device is connected to another one of the charging terminals of the battery housing. Steps 950-965 are repeated for the second portable electronic device. That is, the battery housing and the network communication device can provide electrical power for charging the rechargeable battery of the second portable electronic device and provide network access for the second device. Additional portable electronic device can be connected to additional charging terminals of the battery housing for being charged and receiving network access.

In one embodiment, subsequent to a portable electronic device being charged by the battery housing, the portable electronic device can be disconnected from the battery housing by a user while the network communication device continues to provide network access to the portable electronic device. In one embodiment, if the USB module of the network communication device provides network access to the portable electronic device while the portable electronic device is connected to the battery housing, after disconnection, the network communication device wirelessly connects to the portable electronic device via one of the access point or the wireless Bluetooth module. The wireless connection to the access point or the wireless Bluetooth module may occur in the background of the portable electronic device where the user is not made aware of the new wireless connection. That is, the network communication device can initiate wireless connection to the portable electronic device subsequent to the disconnection. Accordingly, the transition from receiving wired network access to receiving wireless network access from the network communication device can occur without notification from the network communication device and the portable electronic device.

In another implementation, if the access point or the wireless Bluetooth module is providing wireless network access for the portable electronic device, and the portable electronic device is disconnected from the battery housing, the portable electronic device and the network communication device remain wirelessly connected. That is, after being disconnected, the portable electronic device will continue to receive network access via the network communication device.

In another implementation, the battery housing includes a display device that is configured to display information for the network connection status for one or more connected portable electronic devices. The network communication device can include a processor that collected information from the circuits and control the display device. The network communication device and display may also be configured to display information that identifies the particular circuit module (e.g., access point (Wi-Fi), Bluetooth, or USB) that currently provides network access to a given portable electronic device. The display may be configured to display other information, such as the strength of the signal that the network communication device is receiving from a cell tower, a Wi-Fi device, or other network source. The display device may also display an identifier for a particular network provider (e.g., a cellular telephone company) currently providing network access to the network communication device. The display device may also be configured to provide information for the charging state for the rechargeable batteries of portable electronic device connected to the battery housing.

Figure 10A:
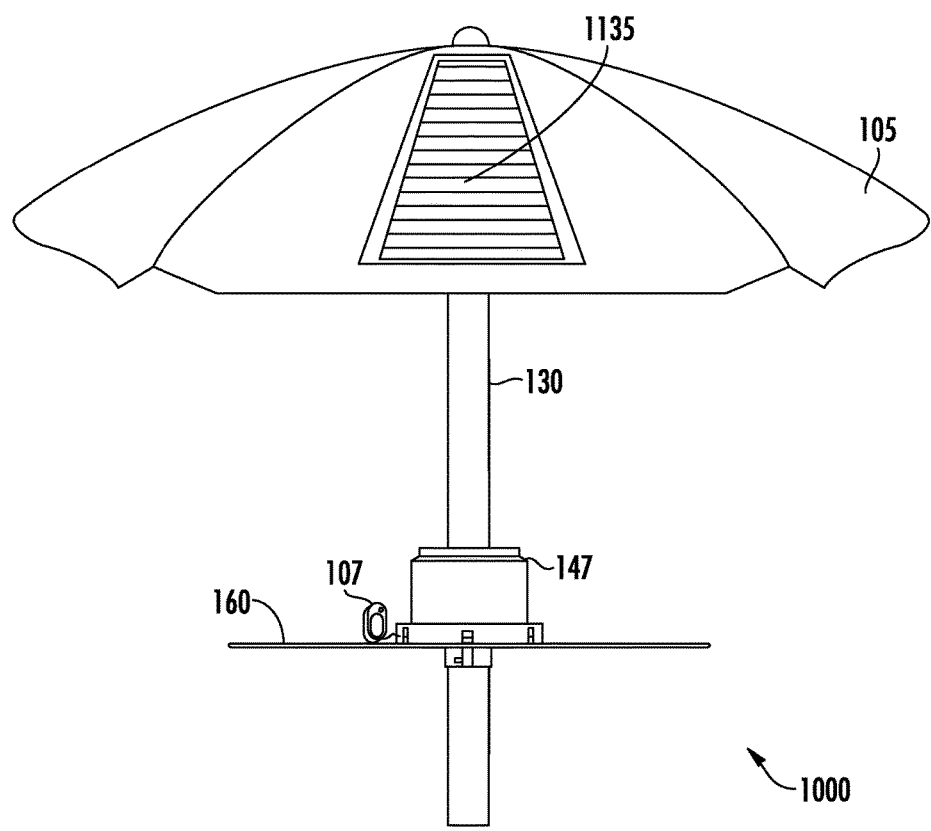
FIGS. 10A-10B show simplified side and top views, respectively, of an umbrella in an alternative implementation.
Figure 10B:
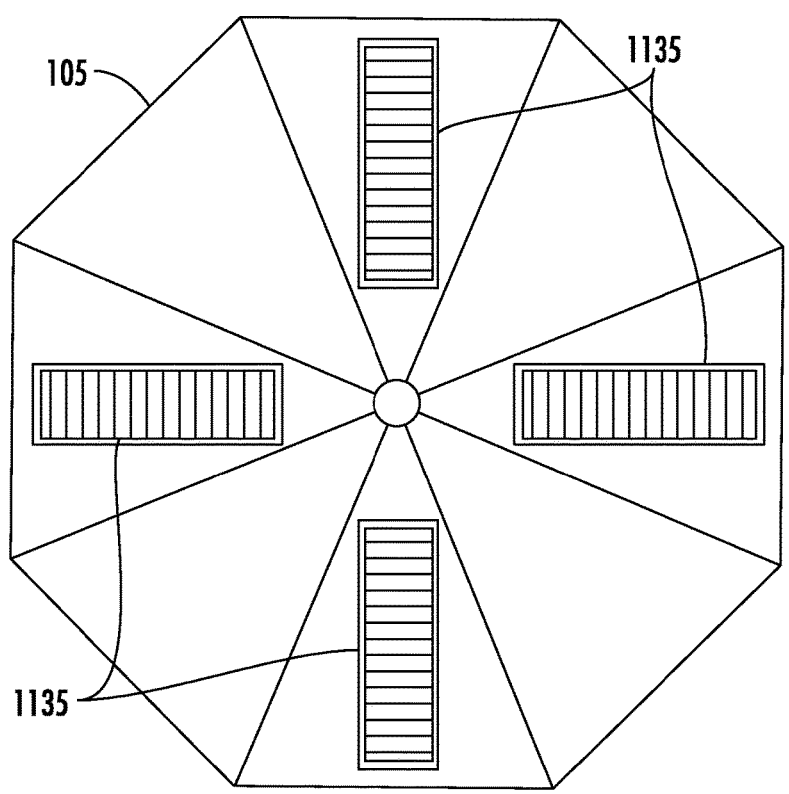

FIGS. 10A and 10B are a simplified side view and a top view of an umbrella 1000 in an alternative implementation of the present invention. Umbrella 1000 is substantially similar to umbrella 100 described above, but differs from umbrella 100 in that solar panels 1135 are foldable and may be attached to shade 105, struts 110, or both. Solar panels 1135 may be foldable solar panels and may be folded with shade 105 as the shade is closed, and may be unfolded with the shade as the shade is opened. In an implementation, solar panels 1135 are positioned on shade 105 and between struts 105 where sides of the solar panels may or may not be attached to the struts. In another alternative implementation, solar panels 1135 are positioned on shade 105 and straddle struts 105. For example, solar panels 1135 may be on shade 105 and may be laterally centered on struts 105.

Umbrella 1000 may include one or more solar panels 1135, which may be positioned on each panel (i.e., each section of the shade between a pair of struts 110) of shade, on every other panel, or the like. In other implementations, the quantity and arrangement of the solar panels may be varied in accordance for various other types of outdoor umbrellas or other types of sunshades and furniture having sunshades.

Solar panels 1135 may include an electronic integrated photovoltaic system (EIPV) which may be made from copper-indium-gallium-diselenide (CIGS) thin-film semiconductors. The EIPV may be manufactured on relatively thin plastic substrates which provide the flexibility for integrating solar panel 1135 onto the material forming shade 105 and for folding with the shade as the shade is opened and closed. In one specific implementation, each of the soar panels 1135 has a width of about 9.38 inches, and a length of about 27 inches. In a folded arrangement, a width of each of the folded solar panels 135 is about 5 inches or less, and may have a length of about 9.5 inches, and a height is about 1.25 inches.

A weight of each of solar panels 1135 may be about 12 ounces to about 16 ounces (e.g., about 14.8 ounces). The dimensions of the solar panels can vary, however, according to the type and size of the shade of the umbrella. Furthermore, the shape (e.g., rectangular, square, circular, triangular, or trapezoidal) of solar panels 1125 may vary according to the size of umbrella. Solar panels 1135 may be custom made to fit various shapes and sizes of shades 105. Specific implementations of solar panels 135 and 1135 may be manufactured by Ascent Solar Technologies, Inc. and known as the WaveSol Mobile, WaveSol Mobile Fringe, and WaveSol Light, all of which are trademarks of Ascent Solar Technologies, Inc.

Solar panels 1135 may be attached to shade 105 by a variety of devices and techniques, such as fasteners, eyelets and hooks, buttons and button holes, grommets, zip ties (also known as cable ties and tie wraps), Velcro® of Velcro Industries B.V., sewing, adhesives, material infusion (application of heat to bond the raw materials), or the like. These attachment devices allow for the removal and replacement of solar panel 1135 if a solar panel needs to be replaced. While both solar panels 135 and 1135 are shown in the various figures as being arranged from a top of shade 105 and extending outward along the shade, the solar panels can be arranged in a variety of configurations, such as side-by-side, in rings or arcs about circumferences of the shade, or a variety of other configurations.

Figure 10C:
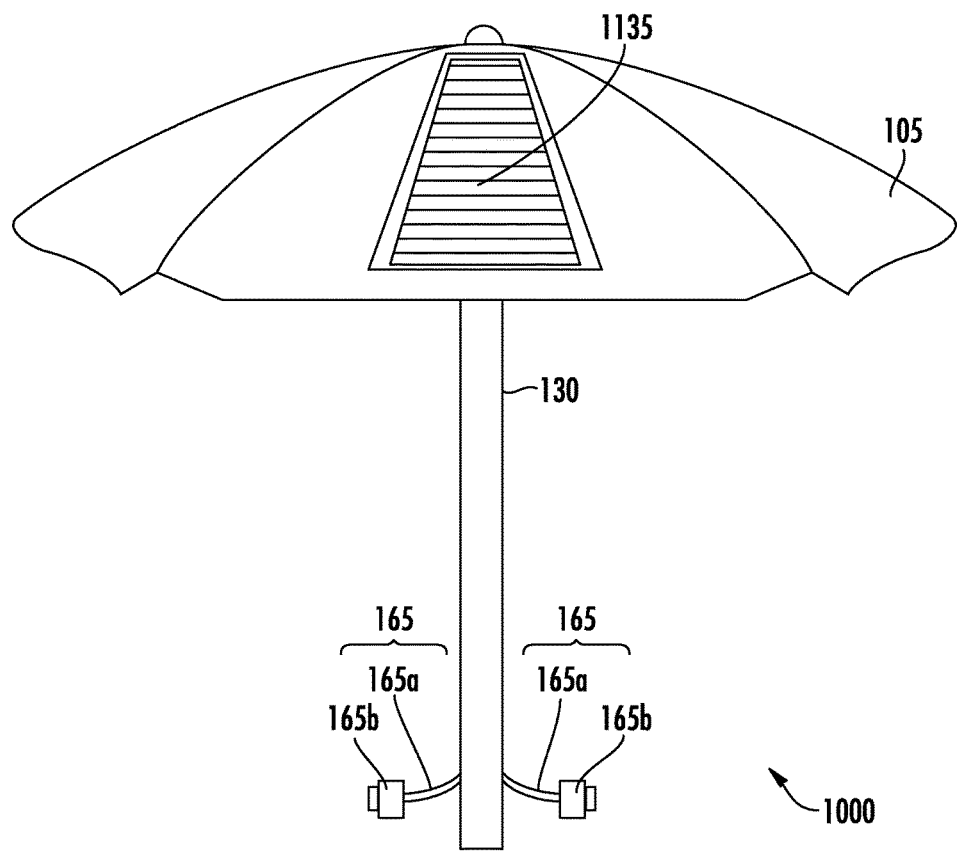
FIG. 10C show a simplified image of the umbrella shown in FIGS. 10A-10B where the charging terminals includes wires that extend the charging terminals from the umbrella pole or the battery housing.

FIG. 10C is a simplified image of umbrella 1000 in an alternative implementation where charging terminals 165 includes wires 165a that extend the charging terminals (e.g., end terminals 165b) from umbrella pole 130 or battery housing 147 (not shown in FIG. 10c). Wires 165a may be retractable into battery pole or battery housing 147. Alternative implementations of umbrella 100 may similarly include charging terminals 165 with wires 165a that extend the charging terminals from umbrella pole 130 or battery housing 147.

Figure 11:
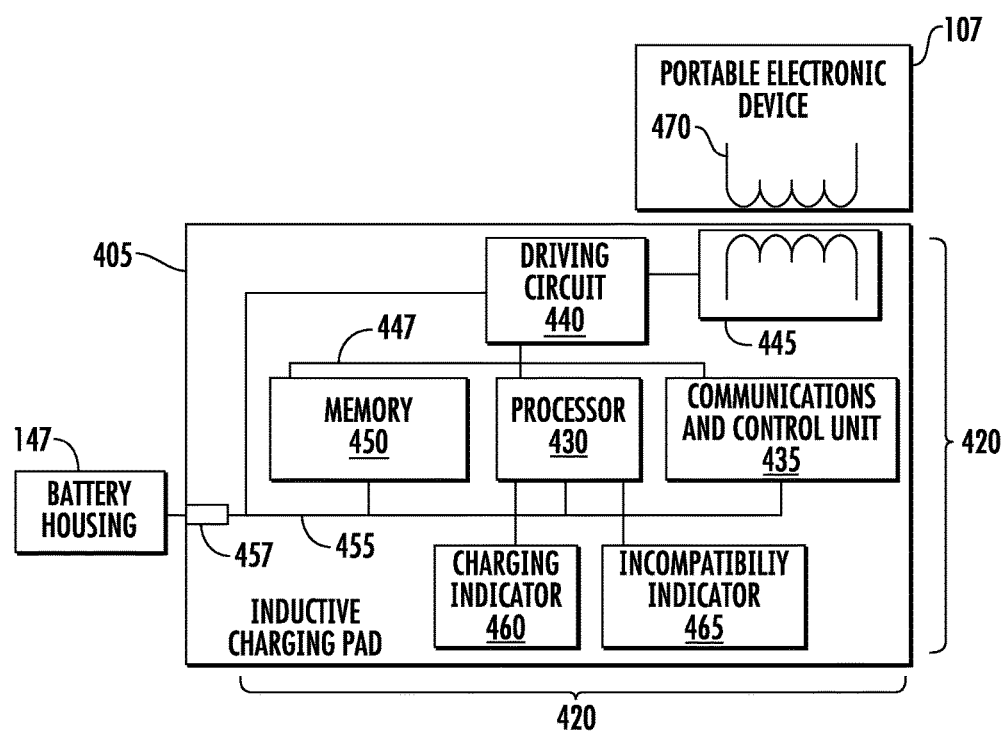
FIGS. 11A-11C show simplified side views, top view, and back views, respectively of specific implementation of the invention incorporated in a chaise lounge.
Figure 11B:
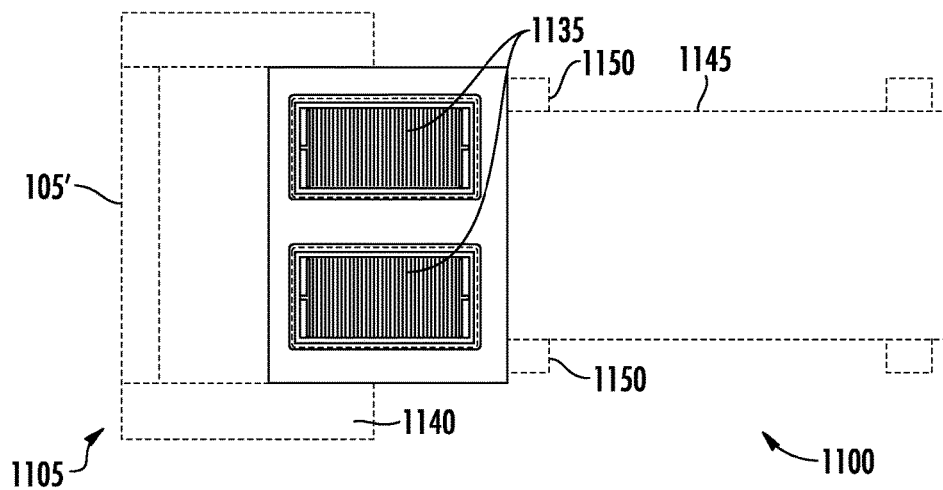
Figure 11C:
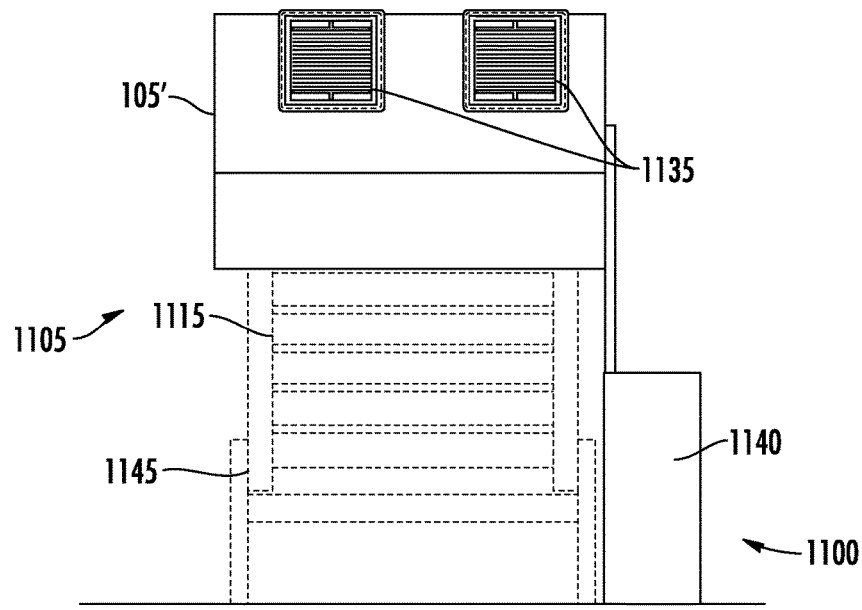

FIGS. 11A, 11B, and 11C show a simplified side view, top view, and back view, respectively, of specific implementation of the invention incorporated in a chaise lounge 1100. Chase lounge 1100 includes an umbrella 1105 that includes one or more solar panels 135 or 1135 attached to a panel 1110 of a foldable shade 105'. Foldable shade 105' may be connected to a frame structure 1115 that connects to a seating portion of chase lounge 1100. Foldable shade 105' and frame structure 1115 may be adjustable by folding the foldable shade and the frame structure backward or forward with respect to the length of the chase lounge by a user to protect against direct sunlight. Frame structure 1115 may include a hinge 1115a that allows the frame structure to fold including being foldable for storage.

In the specific implementation shown in FIGS. 11B and 11C, two solar panels are attached to an upper panel of foldable shade 105'. In other implementations, fewer or more solar panels are integrated into foldable shade 105'. Chase lounge 1100 may include a storage unit 1140 configured to house battery 185, PCB 170, circuit 180, charging terminals 165, and the like described above. Storage unit 1140 may be box shaped and be incorporated with chase lounge 1100 along a side of the chase lounge as shown in FIGS. 11A-11C or may be incorporated into other elements of the chase lounge such as the frame 1145 and the arm rests 1150 of the chase lounge to provide an esthetic and functional design. In other implementations, storage unit 1140 may be incorporated into the frame structure 1115, or a combination of the elements of the chase lounge. For example, the storage unit 1140 may be located on a back side of foldable shade 105'. Charging terminals 165 and charge indicator 167 may be located on a variety of locations on chase lounge 1100. For example, one or more charging terminal 165 and charging terminal 167 may be located on frame structure 1115, storage 1140, frame 1145, arm rest 1150, or the like. In some implementation, the umbrella 1105 and from structure 1115 are separable from the sitting portion of chase lounge 1100 and are moveable from one location to another. For example, umbrella 105' and foldable structure 1115 may be configured for free standing use and might include at least one wheel allowing for relatively easy moving.

Figure 12B:
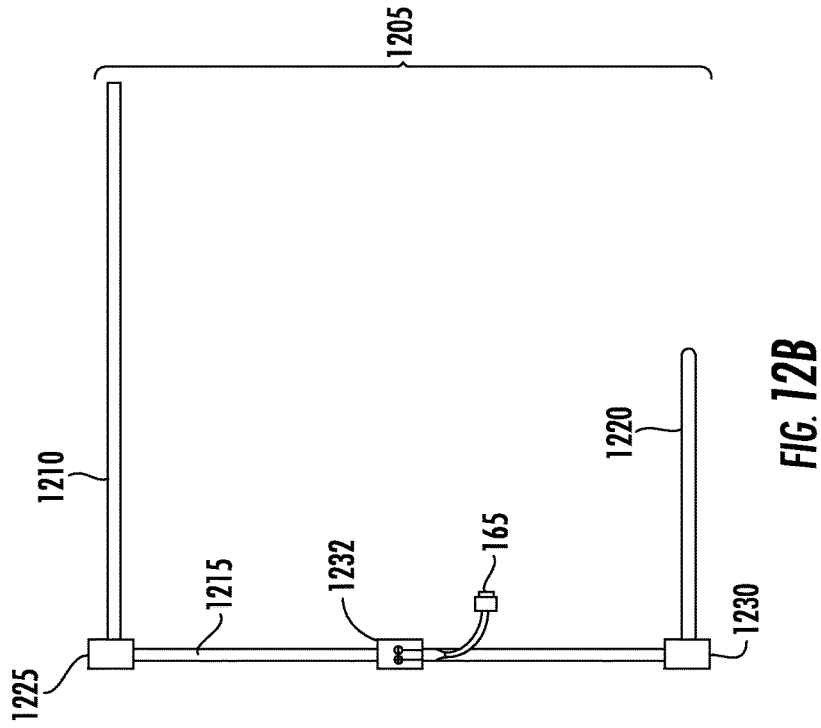
FIGS. 12A-12B show side views of a detachable sunshade in an implementation.
Figure 12A:
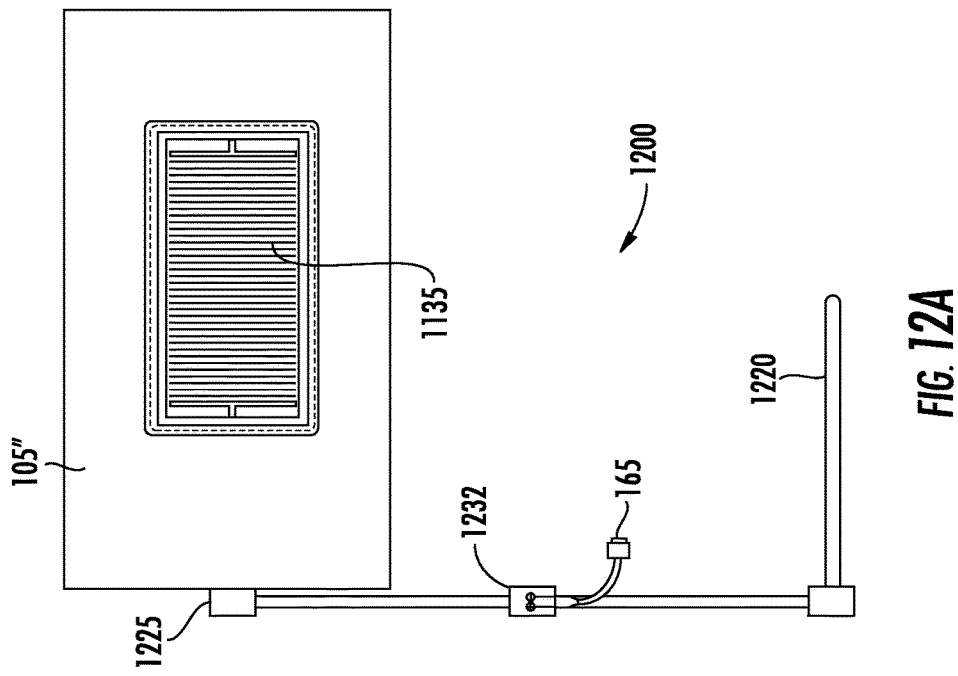
Figure 12C:
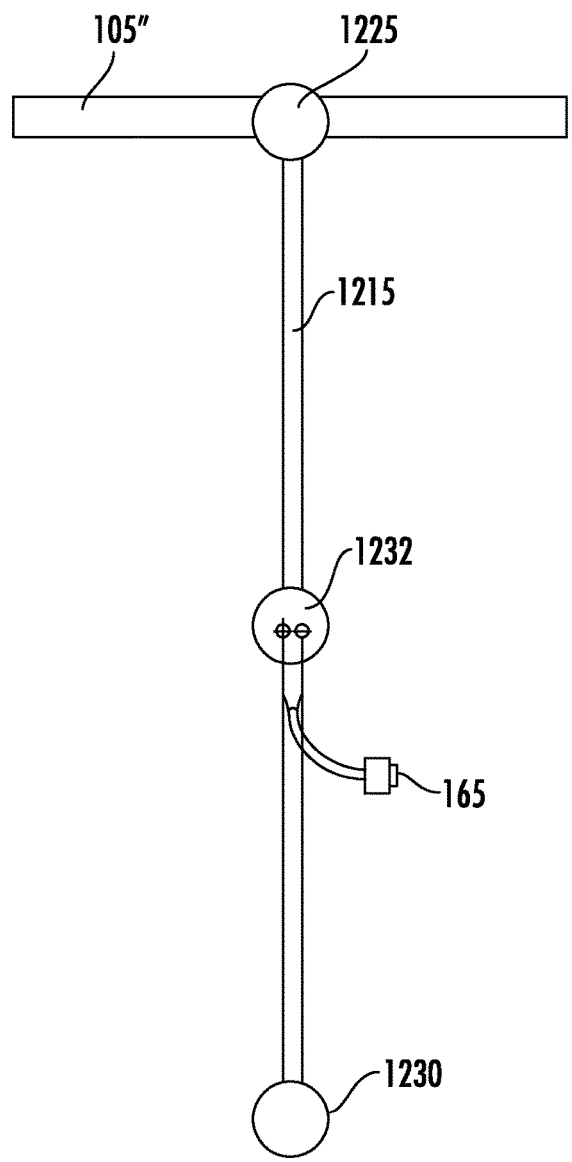
FIG. 12C show a back view of the detachable sunshade.

FIGS. 12A and 12B are side views of a detachable sunshade 1200, and FIG. 12C is a back view of the detachable sunshade in another implementation. Sunshade 1200 includes a frame structure 1205 that in-turn includes a sunshade support 1210, a spine 1215, and a connector 1220. Sunshade support 1210 and spine 1215 may be connected by a first hinge section 1225, and spine 1215 and connector 1220 may be connected be a second hinge section 1230. Detachable sunshade 1200 may further include a shade 105" that is connected to sunshade support 1210 and is adjustable by rotating sunshade support 1210 with respect to spine 1215 via the first hinge section 1225. Shade 105" may be further adjustable by rotating spine 1215 with respect to connector 1220. Accordingly, first hinge section 1225 may provide for relatively fine rotational adjustments of detachable sunshade 1210, and second hinge second 1225 may provide for relatively coarse rotational adjustments of detachable sunshade 1210. In alternative implementations, one or both of the first and the second hinge sections 1225 and 1230 may be fixed joints that do not allow for rotation of sunshade support 1210. FIG. 12A shows shade 105" rotated into a planar view and FIG. 12B shows the shade rotate about ninety degrees from the planar view of FIG. 12A. In an additional implementation, frame structure 1205 may include a rotational joint 1232 that is positioned at a central location on spine 1215 (see FIG. 12C) where the rotational joint provides for the detachable sunshade to be folded substantially in half for storage or the like.

Connector 1220 may be configured to be removably attached to an outdoor table, a bar, chair, or the like. Accordingly, connector 1220 provides for relatively easy movement of detachable sunshade 1200 from one location to anther location.

In an implementation, a length of the shade 105" is about 20 inches to about 30 includes long and is about 10 inches to about 20 includes wide. Shade 105" includes a solar panel 135 or 1135 that may be integrated onto the shade. Frame structure may include the various electronic elements describe above, such as battery 185, PCB 170, circuit 180, charging terminals 165, and the like. One or more charging terminals 165 and charge indicator 167 may be located on a variety of locations on detachable sunshade 1200, such as on shade 105", sunshade support 1210, spine 1215, and connector 1220, or any combination of these. Further, while shade 105' is shown in FIG. 10A as including one solar panel, shade 105" may include more solar panels, such as are needed for various current demands for charging battery 185 or for substantially direct connection to charging terminals 165.

In a specific implementation, one or more self adjusting solar panels may be attached to outdoor furniture. The solar panels may be configured to self adjust to changing sunlight conditions by using various mechanisms to face the solar panels more favorably towards a light source (e.g., to track the moving sun). For example, some solar panels 135 contain converters that allow the solar panels to turn automatically to collect a substantially optimum amount of sunlight for generating a substantially optimum amount of electrical energy. Other solar panels may include servo motors or the like to adjust the angle of the solar panels toward a light source to substantially optimize light exposure and light capture.

In another specific implementation, the present invention includes a reset feature which allows the user to reset the charging function of the solar panels. Portable solar panels, such as solar panels 135 and 1135 may need to be unplugged and re-plugged from time to time in order to reset charging. This can be cumbersome and dangerous to the user. The improved reset feature may be incorporated into the present invention in the form of a reset switch, button, or other type of user control. The reset option would disengage the electrical current and then reengage it to reset the charging.

In further implementations, the solar panels or solar cells are integrated into the shades and are not necessarily separate panels incorporated onto the outdoor furniture. In an implementation, solar cells are printed onto a surface of the shade material (e.g., printed on textile, material, fabric, cloth, photovoltaic fabric, or similar materials). Printing solar panels can be on materials made by weaving, knitting, crocheting, knotting, or pressing fibers together. The photovoltaic fabric can be used for, for example, sails for boats, or cabanas for boats and ships.

For example, the solar panels can be printed on materials that are used for shades 105, 105', 105", or the like. Using printed solar panels, the fabrics of the shades can continue to bend, fold, crease, stretch, or otherwise used as they normally would.

In an implementation, the fabric portion of the shades is constructed, in part or in whole, from solar thread. This solar thread incorporates photovoltaic material (e.g., a coating) to generate solar energy. For example, the threads may include a core that is surrounded by one or more layers (e.g., electrode layer, power generating layer, conductive layer, and layers for hole transport). Light shines on the photovoltaic material of the thread, which generates electricity, and the thread carries this electrically energy to an electrode (e.g., for charging batteries or an electronic device).

Using solar thread, solar panels can be woven into a variety of materials used in the shades, or shades can be made entirely from solar thread. The material incorporating the solar thread can be used to generate solar energy. The solar cells need not be limited to specific arrangements on the fabric (e.g., between adjacent ribs of an umbrella). They may be incorporated into the fabric as desired.

In another implementation, photovoltaic material is infused into the fabric material of the shades. For example, individual fibers are coated with photovoltaic material (i.e., semiconducting material) to convert collected sunlight into electrical energy. In another implementation, the photovoltaic material is infused into a distinct fibrous layer of the fabric of the shades. Further, in other implementations, a system of building integrated photovoltaics is used, in which solar cells are embedded, infused, or otherwise incorporated into building materials. For example, plastic-based solar panels can be used to construct a plastic awning for a building.

In other implementations, solar panels are incorporated into shades using various other techniques. For example, solar panels may be deposited on surfaces of materials using a spray-on technique or other application techniques. Furthermore, solar-powered textiles can be created using processes such as weaving, knitting, braiding, and felting.

In other implementations, outdoor furniture collects ambient thermal energy or generates thermal energy from collected light, such as sunlight. Heat from solar energy can be used to generate thermal energy that is used to produce various types of power including electrical, mechanical, and chemical power. Sunlight from solar radiation may be collected, concentrated, and converted into heat energy. This heat energy may be used to generate alternative forms of energy. For example, heat may be collected in solar concentrators (e.g., parabolic mirrors, lenses, and reflectors, flat mirrors and receivers, or dish systems), and used to drive a generator to produce electrical energy.

In another implementation, a combination of thermal conversion systems and photovoltaic systems is used to collect both light and heat from solar radiation that is used to generate electrical energy, mechanical energy, and chemical energy.

FIG. 13 is an image of an environment where implementations of the present invention, such as umbrellas 100, lounge chairs 1100, detachable sunshades, beach cabanas 1300 (e.g., also cabanas for boats or ships), or the like, may be used by a user for charging a portable electronic device. For example, in a beach environment as shown in FIG. 1O, a main power source 1100 or an electrical outlet 1105 on a hotel building 1110 may not be relatively close to where umbrellas 100 or lounge chars 1100 may be used on a beach or other recreation location, and therefore, running power lines to such areas may not be convenient or safe. Even if power lines could be run to such areas, the power lines may not have the movable convenience of the implementations of the present invention when uses might move and move their umbrellas 100 or lounge chairs 1100 to follow the sun, follow the shade, move to a different section of beach, or the like.

As users often enjoy such outdoor locations for several hours, and as user use their portable electronic device for several hours, the batteries of these devices need to be recharged for continued use and enjoyment. Outdoor furniture and sunshades, such as umbrella 100, of the present invention provide users with a convenient, portable, and local source for charging their portable electronic devices throughout the daytime hours and into the evening and night where charge stored in batteries 185 may be used for such charging.

Other benefits of the implementations of the present invention include simple storage in a storage area 1320 or the like. The implementations can be stored without the need to unplug and wind up any power cords. Each implementation can be folded, disassembled, moved, or the like, as it normally would, and moved to storage area 1320 while the parts of the power supply systems (i.e., solar panel, battery, and circuits, and charging connectors for devices) stay incorporated with the implementations since they are physically integrated.

As discussed previously, umbrella 100, chair 1100, detachable sunshades 1200, and cabana 102 with solar panels 135 or 1135 are movable and can be collapsed into a compact form (e.g., folded umbrella, folded lounge chair, or the like) or otherwise folded into a housing (e.g., shade rolled up into a box). In one business application for umbrella 100, chair 1100, detachable sunshade 1200, cabana 102, or the like, guests of a hotel, cruise ship, or the like can rent out these devices and can move them (e.g., wheeled from location to another location) where the guests would like to be. Further, a number of umbrella, lounge chairs, cabanas, or the like with integrated solar panels can be rented by a rental company (e.g., which can deliver via a truck or van) to various locations. Ordering or reservations may be via the Internet (e.g., Web browser) or a smartphone application. Then during winter, a hotel (and other rental customers) can stop renting and let the rental company pick up and store the sunshades with integrated solar panels in a warehouse.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A kit for an umbrella comprising a shaft and umbrella shade, the umbrella shade being coupled between a fastener and the shaft, the kit comprising:
    a cap, coupled between the fastener and the umbrella shade, comprising a cap opening and at least a first hinge portion and a second hinge portion, wherein the fastener couples to a bolt of the shaft that passes through the cap opening;
    a first strut, comprising first and second ends, a third hinge portion at the first end, and between the first and second ends is a first solar panel, wherein the third hinge portion couples with the first hinge portion of the cap to form a first strut hinge;
    a second strut, comprising third and fourth ends, a fourth hinge portion at the third end, and between the third and fourth ends is a second solar panel, wherein the fourth hinge portion couples to the second hinge portion of the cap to form a second strut hinge,
    the umbrella comprises an open position during which the umbrella shade is extended into a position away from the shaft and a closed position during which the umbrella shade is folded into a position closer to the shaft,
    when changing the umbrella from the closed to the open position, the umbrella shade pushes against a bottom of the struts while the umbrella shade is extended, causing the struts to rotate via the first and second strut hinges in a first turn direction, so that an angle between a top of the first strut and a top of the cap increases from a first angle in the closed position to a second angle in the open position, and the second angle is greater than the first angle, and
    when changing the umbrella from the open to the closed position, the bottom of the struts rest against the umbrella shade while the umbrella is folded, causing the struts to rotate via the first and second strut hinges in a second turn direction, so that the angle between the top of the first strut and the top of the cap decreases from the second angle to the first angle, and the second turn direction is opposite of the first turn direction;
    a battery housing comprising a battery housing hole through which the shaft of the umbrella is passed through, wherein the battery housing houses a rechargeable battery, battery charging circuit, and voltage converter circuit;
    first, second, and third USB charging ports, coupled to the rechargeable battery; and
    a printed circuit board (PCB), contained within the battery housing, wherein the printed circuit board comprises a PCB hole through which the shaft of the umbrella will pass through, wherein the battery charging circuit is formed on the printed circuit board.

2. The kit of claim 1 comprising:
    a first spring-loaded retractable cover, coupled to the battery housing, covering the first USB charging port;

a second spring-loaded retractable cover, coupled to the battery housing, covering the second USB charging port; and a third spring-loaded retractable cover, coupled to the battery housing, covering the third USB charging port.

3. The kit of claim 1 wherein the rechargeable battery is configurable to be recharged by the first and second solar panels, and the first USB charging port is coupled to the rechargeable battery, configurable to connect to a portable electronic device, and when connected, capable of supplying charge from the rechargeable battery to the portable electronic device.

4. The kit of claim 1 comprising:

a battery level indicator circuit, coupled to the rechargeable battery; and at least one indicator element, coupled to the battery level indicator circuit and visible from an exterior of the rechargeable battery housing, wherein the battery level indicator circuit causes the at least one indicator element to indicate a charge level of the rechargeable battery.

5. The kit of claim 1 wherein the first, second, and third USB charging ports are capable of supplying at least 10 watts of output power each simultaneously.

6. The kit of claim 1 wherein when the umbrella is in the closed position, at least a portion of a weight of the first and second struts is supported by the cap.

7. The kit of claim 1 comprising:

a battery level indicator circuit, coupled to the rechargeable battery; and a plurality of light emitting diodes, coupled to the battery level indicator circuit and visible from an exterior of the rechargeable battery housing, wherein the battery level indicator circuit causes a number of the light emitting diodes to illuminate corresponding to a charge level of the rechargeable battery.

8. The kit of claim 1 comprising:

an electrical socket, coupled to the battery housing and the battery charging circuit; and electrical wires, wherein the electrical wires are to be coupled between the electrical socket and the first and second solar panels.

9. A kit for an umbrella comprising a shaft and umbrella shade, the umbrella shade being coupled between a fastener and the shaft, the kit comprising:

a cap, coupled between the fastener and the umbrella shade, comprising a cap opening and at least a first hinge portion and a second hinge portion, wherein the fastener couples to a bolt of the shaft that passes through the cap opening, wherein the cap comprises:

a first strut, comprising first and second ends, a third hinge portion at the first end, and between the first and second ends is a first solar panel, wherein the third hinge portion couples to the first hinge portion of the cap to form a first strut hinge, and a second strut, comprising third and fourth ends, a fourth hinge portion at the third end, and between the third and fourth ends is a second solar panel, wherein the fourth hinge portion couples to the second hinge portion of the cap to form a second strut hinge, the umbrella comprises an open position during which the umbrella shade is extended into a position away from the shaft and a closed position during which the umbrella shade is folded into a position closer to the shaft, when changing the umbrella from the closed to the open position, the umbrella shade pushes against a bottom of the struts while the umbrella shade is extended, causing the struts to rotate via the first and second strut hinges in a first turn direction, so that an angle between a top of the first strut and a top of the cap increases from a first angle in the closed position to a second angle in the open position, and the second angle is greater than the first angle, and when changing the umbrella from the open to the closed position, the bottom of the struts rest against the umbrella shade while the umbrella is folded, causing the struts to rotate via the first and second strut hinges in a second turn direction, so that the angle between the top of the first strut and the top of the cap decreases from the second angle to the first angle, and the second turn direction is opposite of the first turn direction; and a battery housing comprising a battery housing hole through which the shaft of the umbrella is passed through, wherein the battery housing comprises:

a rechargeable battery, contained within the battery housing, a battery charging circuit, contained within the battery housing and coupled to the rechargeable battery and contained;

a plurality of electrical wires, coupling the first and second solar panels to the battery charging circuit, wherein the battery charging circuit can charge the rechargeable battery using solar power received from the first and second solar panels; and a first printed circuit board (PCB), contained within the battery housing, wherein the first printed circuit board comprises a PCB hole through which the shaft of the umbrella passes through, wherein the battery charging circuit is formed on the printed circuit board.

10. The kit of claim 9 wherein a voltage converter circuit is coupled to the rechargeable battery, and the kit comprises:

a first universal serial bus (USB) charging port;

a second USB charging port; and a third USB charging port, wherein the first, second, and third USB charging ports are coupled to the voltage converter circuit to receive power.

11. The kit of claim 10 wherein the first, second, and third USB charging ports are capable of supplying at least 10 watts of output power each simultaneously.

12. The kit of claim 9 comprising:

a first cover, coupled to cover the first USB charging port;

a second cover, coupled to cover the second USB charging port; and a third cover, coupled to cover the third USB charging port.

13. The kit of claim 9 comprising:

an electrical socket, coupled to the battery housing and the battery charging circuit;

a plurality of electrical wires, wherein electrical wires are to be coupled between the electrical socket and the first and second solar panels.

14. The kit of claim 9 wherein when the umbrella is in the closed position, at least a portion of a weight of the first and second struts is supported by the cap.

15. The kit of claim 9 comprising:

a battery level indicator circuit, coupled to the rechargeable battery; and a plurality of light emitting diodes, coupled to the battery level indicator circuit and visible from an exterior of the rechargeable battery housing, wherein the battery level indicator circuit causes a number of the light emitting diodes to illuminate corresponding to a charge level of the rechargeable battery.

16. A method comprising:

providing a kit for an umbrella comprising a shaft and umbrella shade, wherein the umbrella shade will be coupled between a fastener and the shaft;

providing a cap to be coupled between the fastener and the umbrella shade, the cap comprising a cap opening and at least a first hinge portion and a second hinge portion, wherein the fastener couples to a bolt of the shaft that passes through the cap opening;

providing a first strut, comprising first and second ends, a third hinge portion at the first end, and between the first and second ends is a first solar panel, wherein the third hinge portion couples to the first hinge portion of the cap to form a first strut hinge;

providing a second strut, comprising third and fourth ends, a fourth hinge portion at the third end, and between the third and fourth ends is a second solar panel, wherein the fourth hinge portion couples to the second hinge portion of the cap to form a second strut hinge, the umbrella comprises an open position during which the umbrella shade is extended into a position away from the shaft and a closed position during which the umbrella shade is folded into a position closer to the shaft, when changing the umbrella from the closed to the open position, the umbrella shade pushes against a bottom of the struts while the umbrella shade is extended, causing the struts to rotate via the first and second strut hinges in a first turn direction, so that an angle between a top of the first strut and a top of the cap increases from a first angle in the closed position to a second angle in the open position, and the second angle is greater than the first angle, and when changing the umbrella from the open to the closed position, the bottom of the struts rest against the umbrella shade while the umbrella is folded, causing the struts to rotate via the first and second strut hinges in a second turn direction, so that the angle between the top of the first strut and the top of the cap decreases from the second angle to the first angle, and the second turn direction is opposite of the first turn direction;

providing a battery housing comprising a battery housing hole through which the shaft of the umbrella passes through, wherein the battery housing houses a rechargeable battery, battery charging circuit, and voltage converter circuit;

providing at least first and second USB charging ports, coupled to the rechargeable battery; and providing a first printed circuit board (PCB) comprising a PCB hole through which the shaft of the umbrella passes through, wherein the battery charging circuit and the voltage converter circuit are formed on the printed circuit board.

17. The method of claim 16 wherein the rechargeable battery is configurable to be recharged by the first and second solar panels, and the first USB charging port is coupled to the rechargeable battery and configurable to connect to a portable electronic device, and when connected, capable of supplying charge from the rechargeable battery to the portable electronic device.

18. The method of claim 16 comprising:

providing a battery level indicator circuit coupled to the rechargeable battery; and providing at least one indicator element, coupled to the battery level indicator circuit and visible from an exterior of the rechargeable battery housing, wherein the battery level indicator circuit causes the at least one indicator element to indicate a charge level of the rechargeable battery.

19. The method of claim 16 wherein the first, second, and third USB charging ports are capable of supplying at least 10 watts of output power each simultaneously.

20. The method of claim 16 wherein when the umbrella is in the closed position, at least a portion of a weight of the first and second struts is supported by the cap.

21. The method of claim 16 comprising:

providing a battery level indicator circuit, coupled to the rechargeable battery; and providing a plurality of light emitting diodes, coupled to the battery level indicator circuit and visible from an exterior of the rechargeable battery housing, wherein the battery level indicator circuit causes a number of the light emitting diodes to illuminate corresponding to a charge level of the rechargeable battery.

22. The method of claim 16 comprising:

providing an electrical socket, coupled to the battery housing and the battery charging circuit; and providing electrical wires, wherein the electrical wires are to be coupled between the electrical socket and the first and second solar panels.

23. A method comprising:

providing a kit for an umbrella comprising a shaft and umbrella shade, wherein the umbrella shade will be coupled between a fastener and the shaft;

providing a cap to be coupled between the fastener and the umbrella shade, the cap comprising a cap opening and at least a first hinge portion and a second hinge portion, wherein the fastener couples to a bolt of the shaft that passes through the cap opening;

providing a first strut, comprising first and second ends, a third hinge portion at the first end, and between the first and second ends is a first solar panel, wherein the third hinge portion couples to the first hinge portion of the cap to form a first strut hinge;

providing a second strut, comprising third and fourth ends, a fourth hinge portion at the third end, and between the third and fourth ends is a second solar panel, wherein the fourth hinge portion couples to the second hinge portion of the cap to form a second strut hinge, the umbrella comprises an open position during which the umbrella shade is extended into a position away from the shaft and a closed position during which the umbrella shade is folded into a position closer to the shaft, when changing the umbrella from the closed to the open position, the umbrella shade pushes against a bottom of the struts while the umbrella shade is extended, causing the struts to rotate via the first and second strut hinges in a first turn direction, so that an angle between a top of the first strut and a top of the cap increases from a first angle in the closed position to a second angle in the open position, and the second angle is greater than the first angle, and when changing the umbrella from the open to the closed position, the bottom of the struts rest against the umbrella shade while the umbrella is folded, causing the struts to rotate via the first and second strut hinges in a second turn direction, so that the angle between the top of the first strut and the top of the cap decreases from the second angle to the first angle, and the second turn direction is opposite of the first turn direction;

providing a battery housing comprising a battery housing hole through which the shaft of the umbrella is passed through;

providing a rechargeable battery within the battery housing;

providing a battery charging circuit within the battery housing, coupled to the rechargeable battery;

providing a plurality of electrical wires, coupling the first and second solar panels to the battery charging circuit, wherein the battery charging circuit can charge the rechargeable battery using solar power received from the first and second solar panels; and providing a first printed circuit board (PCB) comprising a PCB hole through which the shaft of the umbrella passes through, wherein the battery charging circuit and the voltage converter circuit are formed on the printed circuit board.

24. The method of claim 23 wherein a voltage converter circuit is coupled to the rechargeable battery, and the method comprises:

providing a first universal serial bus (USB) charging port, coupled to the voltage converter circuit;

providing a second USB charging port, coupled to the voltage converter circuit; and providing a third USB charging port, coupled to the voltage converter circuit.

25. The method of claim 24 wherein the first, second, and third USB charging ports are capable of supplying at least 10 watts of output power each simultaneously.

26. The method of claim 23 comprising:

providing an electrical socket, coupled to the battery housing and the battery charging circuit; and providing electrical wires, wherein the electrical wires are to be coupled between the electrical socket and the first and second solar panels.

27. The method of claim 23 wherein when the umbrella is in the closed position, at least a portion of a weight of the first and second struts is supported by the cap.

28. The method of claim 23 comprising:

providing a battery level indicator circuit, coupled to the rechargeable battery; and providing a plurality of light emitting diodes, coupled to the battery level indicator circuit and visible from an exterior of the rechargeable battery housing, wherein the battery level indicator circuit causes a number of the light emitting diodes to illuminate corresponding to a charge level of the rechargeable battery.

29. A method comprising:

providing a kit for an umbrella comprising a shaft and umbrella shade, wherein the umbrella shade will be coupled between a fastener and the shaft;

providing a cap to be coupled between the fastener and the umbrella shade, the cap comprising a cap opening and at least a first hinge portion and a second hinge portion, wherein the fastener couples to a bolt of the shaft that passes through the cap opening;

providing a first strut, comprising first and second ends, a third hinge portion at the first end, and between the first and second ends is a first solar panel, wherein the third hinge portion couples to the first hinge portion of the cap to form a first strut hinge;

providing a second strut, comprising third and fourth ends, a fourth hinge portion at third end, and between the third and fourth ends is a second solar panel, wherein the fourth hinge portion couples to the second hinge portion of the cap to form a second strut hinge, the umbrella comprises an open position during which the umbrella shade is extended into a position away from the shaft and a closed position during which the umbrella shade is folded into a position closer to the shaft, when changing the umbrella from the closed to the open position, the umbrella shade pushes against a bottom of the struts while the umbrella shade is extended, causing the struts to rotate via the first and second strut hinges in a first turn direction, so that an angle between a top of the first strut and a top of the cap increases from a first angle in the closed position to a second angle in the open position, and the second angle is greater than the first angle, and when changing the umbrella from the open to the closed position, the bottom of the struts rest against the umbrella shade while the umbrella is folded, causing the struts to rotate via the first and second strut hinges in a second turn direction, so that the angle between the top of the first strut and the top of the cap decreases from the second angle to the first angle, and the second turn direction is opposite of the first turn direction;

providing a battery housing comprising a battery housing hole through which the shaft of the umbrella is passed through;

providing a rechargeable battery within the battery housing;

providing a battery charging circuit within the battery housing, coupled to the rechargeable battery;

providing a plurality of electrical wires, coupling the first and second solar panels to the battery charging circuit, wherein the battery charging circuit can charge the rechargeable battery using solar power received from the first and second solar panels, wherein a voltage converter circuit is coupled to the rechargeable battery, and the method comprises:

providing a first universal serial bus (USB) charging port, coupled to the voltage converter circuit;

providing a second USB charging port, coupled to the voltage converter circuit; and providing a third USB charging port, coupled to the voltage converter circuit;

providing a battery housing comprising a battery housing hole through which the shaft of the umbrella passes through, wherein the battery housing houses the rechargeable battery, battery charging circuit, voltage converter circuit, and first, second, and third USB charging ports;

providing a first spring-loaded retractable cover, coupled to the battery housing, covering the first USB charging port;

providing a second spring-loaded retractable cover, coupled to the battery housing, covering the second USB charging port; and providing a third spring-loaded retractable cover, coupled to the battery housing, covering the third USB charging port.

* * * * *